(12) United States Patent
Kwon et al.

(10) Patent No.: US 12,046,627 B2
(45) Date of Patent: Jul. 23, 2024

(54) PIXEL-TYPE SEMICONDUCTOR LIGHT-EMITTING DEVICE AND METHOD OF MANUFACTURING THE SAME

(71) Applicant: SAMSUNG ELECTRONICS CO., LTD., Suwon-si (KR)

(72) Inventors: Yong-Min Kwon, Seoul (KR); Geun-Woo Ko, Yongin-si (KR); Jung-Wook Lee, Suwon-si (KR); Jong-Hyun Lee, Suwon-si (KR); Pun-Jae Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 191 days.

(21) Appl. No.: 17/658,960

(22) Filed: Apr. 12, 2022

(65) Prior Publication Data

US 2022/0238597 A1    Jul. 28, 2022

Related U.S. Application Data

(63) Continuation of application No. 16/290,351, filed on Mar. 1, 2019, now Pat. No. 11,302,743.

(30) Foreign Application Priority Data

Apr. 20, 2018    (KR) .................. 10-2018-0046290

(51) Int. Cl.
*H01L 33/60*    (2010.01)
*H01L 21/02*    (2006.01)
(Continued)

(52) U.S. Cl.
CPC ...... *H01L 27/156* (2013.01); *H01L 21/02104* (2013.01); *H01L 25/0753* (2013.01); (Continued)

(58) Field of Classification Search
CPC . H01L 27/153; H01L 27/156; H01L 25/0753; H01L 33/02; H01L 33/10;
(Continued)

(56) References Cited

U.S. PATENT DOCUMENTS 6,372,608 B1    4/2002    Shimoda et al.
6,645,830 B2    11/2003    Shimoda et al.
(Continued)

FOREIGN PATENT DOCUMENTS

CN    106558597    4/2017
CN    107134469    9/2017
(Continued)

*Primary Examiner* — Maliheh Malek

(74) *Attorney, Agent, or Firm* — F. Chau & Associates, LLC

(57) ABSTRACT

A semiconductor light-emitting device includes a plurality of light-emitting device structures separated from each other and arranged in a matrix form. A pad region at least partially surrounds the plurality of light-emitting device structures. The pad region is disposed outside of the plurality of light-emitting device structures. A partition structure is disposed on a first surface of the plurality of light-emitting device structures and is further disposed between adjacent light-emitting device structures of the plurality of light-emitting device structures. The partition structure defines a plurality of pixel spaces within the plurality of light-emitting device structures. A fluorescent layer is disposed on the first surface of the plurality of light-emitting device structures and fills each of the plurality of pixel spaces.

20 Claims, 38 Drawing Sheets

(51) Int. Cl.
*H01L 25/075* (2006.01)
*H01L 27/15* (2006.01)
*H01L 33/50* (2010.01)
*H01L 33/56* (2010.01)
*H01L 33/62* (2010.01)

(52) U.S. Cl.
CPC ............ *H01L 33/504* (2013.01); *H01L 33/56* (2013.01); *H01L 33/60* (2013.01); *H01L 33/62* (2013.01)

(58) Field of Classification Search
CPC ......... H01L 33/20; H01L 33/46; H01L 33/48; H01L 33/50; H01L 33/505; H01L 33/507; H01L 33/508; H01L 33/54; H01L 33/60; H01L 33/504; H01L 33/56; H01L 33/62; H01L 33/0093; H01L 33/44; H01L 33/38; H01L 33/483
See application file for complete search history.

(56) References Cited

U.S. PATENT DOCUMENTS

| | | | | |
|---|---|---|---|---|
| RE38,466 | E | 3/2004 | Inoue et al. | |
| 6,818,465 | B2 | 11/2004 | Biwa et al. | |
| 6,818,530 | B2 | 11/2004 | Shimoda et al. | |
| 6,858,081 | B2 | 2/2005 | Biwa et al. | |
| 6,900,856 | B2* | 5/2005 | Kim | G02F 1/136209 349/110 |
| 6,967,353 | B2 | 11/2005 | Suzuki et al. | |
| 7,002,182 | B2 | 2/2006 | Okuyama et al. | |
| 7,084,420 | B2 | 8/2006 | Kim et al. | |
| 7,087,932 | B2 | 8/2006 | Okuyama et al. | |
| 7,154,124 | B2 | 12/2006 | Han et al. | |
| 7,208,725 | B2 | 4/2007 | Sherrer et al. | |
| 7,288,758 | B2 | 10/2007 | Sherrer et al. | |
| 7,319,044 | B2 | 1/2008 | Han et al. | |
| 7,501,656 | B2 | 3/2009 | Han et al. | |
| 7,709,857 | B2 | 5/2010 | Kim et al. | |
| 7,759,140 | B2 | 7/2010 | Lee et al. | |
| 7,781,727 | B2 | 8/2010 | Sherrer et al. | |
| 7,790,482 | B2 | 9/2010 | Han et al. | |
| 7,940,350 | B2 | 5/2011 | Jeong | |
| 7,959,312 | B2 | 6/2011 | Yoo et al. | |
| 7,964,881 | B2 | 6/2011 | Choi et al. | |
| 7,985,976 | B2 | 7/2011 | Choi et al. | |
| 7,994,525 | B2 | 8/2011 | Lee et al. | |
| 8,008,683 | B2 | 8/2011 | Choi et al. | |
| 8,013,352 | B2 | 9/2011 | Lee et al. | |
| 8,049,161 | B2 | 11/2011 | Sherrer et al. | |
| 8,129,711 | B2 | 3/2012 | Kang et al. | |
| 8,179,938 | B2 | 5/2012 | Kim | |
| 8,263,987 | B2 | 9/2012 | Choi et al. | |
| 8,324,646 | B2 | 12/2012 | Lee et al. | |
| 8,399,944 | B2 | 3/2013 | Kwak et al. | |
| 8,432,511 | B2 | 4/2013 | Jeong | |
| 8,459,832 | B2 | 6/2013 | Kim | |
| 8,502,242 | B2 | 8/2013 | Kim | |
| 8,536,604 | B2 | 9/2013 | Kwak et al. | |
| 8,735,931 | B2 | 5/2014 | Han et al. | |
| 8,766,295 | B2 | 7/2014 | Kim | |
| 9,091,415 | B2 | 7/2015 | Bessho et al. | |
| 9,182,831 | B2 | 11/2015 | Iwata et al. | |
| 9,257,416 | B2* | 2/2016 | Akimoto | H01L 25/0753 |
| 9,362,718 | B2 | 6/2016 | Yang et al. | |
| 9,825,067 | B2* | 11/2017 | Rhee | H10K 59/123 |
| 9,905,543 | B2 | 2/2018 | Yeon et al. | |
| 9,905,739 | B2 | 2/2018 | Chung et al. | |
| 9,954,028 | B2* | 4/2018 | Yeon | H01L 33/44 |
| 10,115,875 | B2* | 10/2018 | Kurimoto | H01L 33/54 |
| 10,230,021 | B2 | 3/2019 | Kim et al. | |
| 10,573,632 | B2* | 2/2020 | Yeon | H01L 25/18 |
| 10,770,442 | B2* | 9/2020 | Zini | H01L 33/502 |
| 10,797,040 | B2* | 10/2020 | Yeon | H01L 27/15 |
| 10,818,649 | B2* | 10/2020 | Sa | H01L 25/167 |
| 10,998,375 | B2* | 5/2021 | Lee | F21S 41/153 |
| 11,018,276 | B2* | 5/2021 | Kim | H01L 33/60 |
| 11,060,689 | B2* | 7/2021 | Kwon | H01L 33/508 |
| 11,302,743 | B2 | 4/2022 | Kwon et al. | |
| 11,695,031 | B2* | 7/2023 | Lee | H01L 33/504 257/48 |
| 11,735,698 | B2* | 8/2023 | Hyun | F21S 41/176 362/510 |
| 2005/0127838 | A1* | 6/2005 | Amano | H01J 11/38 313/586 |
| 2005/0140282 | A1* | 6/2005 | Park | H10K 59/38 313/506 |
| 2006/0140282 | A1 | 6/2006 | Park et al. | |
| 2006/0145607 | A1* | 7/2006 | Kim | H10K 50/8426 313/512 |
| 2007/0069235 | A1 | 3/2007 | Ueno et al. | |
| 2008/0048551 | A1* | 2/2008 | Kijima | H01J 29/02 313/495 |
| 2008/0297042 | A1* | 12/2008 | Ahn | H10K 59/127 313/504 |
| 2009/0114937 | A1* | 5/2009 | Kawakubo | B29C 43/18 257/E33.001 |
| 2009/0200070 | A1* | 8/2009 | Kato | C23C 14/3414 174/257 |
| 2010/0091947 | A1* | 4/2010 | Niu | A61B 6/4035 378/63 |
| 2010/0195314 | A1* | 8/2010 | Shinkai | G02F 1/133606 362/235 |
| 2010/0289977 | A1* | 11/2010 | Liu | H01L 27/156 349/44 |
| 2010/0302218 | A1* | 12/2010 | Bita | G02B 6/0065 345/204 |
| 2011/0096255 | A1* | 4/2011 | Rho | C09K 19/0275 349/33 |
| 2011/0096256 | A1 | 4/2011 | Rho et al. | |
| 2012/0032218 | A1* | 2/2012 | Choi | H01L 33/0075 257/E33.064 |
| 2012/0074438 | A1* | 3/2012 | Hwang | H01L 33/20 257/E21.531 |
| 2012/0087108 | A1* | 4/2012 | Ke | H01L 25/0753 257/E33.012 |
| 2013/0168704 | A1* | 7/2013 | Huang | H01L 27/1248 257/E33.062 |
| 2013/0242372 | A1* | 9/2013 | Park | B05D 1/26 359/290 |
| 2013/0250498 | A1* | 9/2013 | Shon | G02F 1/1333 361/679.01 |
| 2013/0320334 | A1* | 12/2013 | Yamazaki | H01L 29/42356 257/43 |
| 2014/0022622 | A1* | 1/2014 | Park | G02B 26/005 359/290 |
| 2014/0054638 | A1 | 2/2014 | Lester et al. | |
| 2014/0284590 | A1* | 9/2014 | Nakazawa | H10K 50/80 359/885 |
| 2014/0315342 | A1* | 10/2014 | Edura | C23C 14/12 438/46 |
| 2015/0028303 | A1* | 1/2015 | Kim | H10K 50/84 257/40 |
| 2015/0171372 | A1 | 6/2015 | Iwata et al. | |
| 2017/0018538 | A1* | 1/2017 | Tiwari | H01L 25/50 |
| 2017/0033268 | A1* | 2/2017 | Lee | H01L 33/56 |
| 2017/0068140 | A1* | 3/2017 | Hayashi | H01L 27/1248 |
| 2017/0133563 | A1* | 5/2017 | Chung | H01L 33/60 |
| 2017/0141176 | A1* | 5/2017 | Im | H10K 50/82 |
| 2017/0236866 | A1* | 8/2017 | Lee | H05B 47/19 257/89 |
| 2017/0250316 | A1* | 8/2017 | Yeon | H01L 33/504 |
| 2017/0260316 | A1 | 8/2017 | Yeon et al. | |
| 2017/0263591 | A1* | 9/2017 | Abe | H01L 33/504 |
| 2017/0286044 | A1 | 10/2017 | Kim et al. | |
| 2017/0309789 | A1* | 10/2017 | Kurimoto | H01L 27/156 |
| 2017/0309798 | A1* | 10/2017 | Bonar | H01L 33/0093 |
| 2017/0330905 | A1* | 11/2017 | Tak | H01L 27/14627 |
| 2017/0338212 | A1* | 11/2017 | Kuo | H01L 25/167 |
| 2017/0358624 | A1* | 12/2017 | Takeya | H01L 33/42 |
| 2018/0012949 | A1* | 1/2018 | Takeya | H01L 25/167 |
| 2018/0019384 | A1* | 1/2018 | Abe | H01L 33/505 |

(56) References Cited

U.S. PATENT DOCUMENTS

| | | | |
|---|---|---|---|
| 2018/0045866 A1* | 2/2018 | Chae | G02F 1/133553 |
| 2018/0047880 A1* | 2/2018 | Lim | H01L 27/156 |
| 2018/0053882 A1* | 2/2018 | Cheng | H01L 33/58 |
| 2018/0083156 A1* | 3/2018 | Mezouari | H01L 33/20 |
| 2018/0083166 A1 | 3/2018 | Mezouari et al. | |
| 2018/0088404 A1* | 3/2018 | Chae | H10K 59/38 |
| 2018/0151120 A1* | 5/2018 | Kim | G09G 3/3291 |
| 2018/0166424 A1* | 6/2018 | Sim | H01L 33/54 |
| 2018/0287099 A1* | 10/2018 | Uchida | H10K 59/179 |
| 2019/0006327 A1* | 1/2019 | Kang | H01L 33/0093 |
| 2019/0019786 A1* | 1/2019 | Kim | H01L 25/167 |
| 2019/0067379 A1* | 2/2019 | Uchida | H10K 50/81 |
| 2019/0067533 A1* | 2/2019 | Chen | H01L 33/508 |
| 2019/0140212 A1* | 5/2019 | Park | H10K 50/844 |
| 2019/0206849 A1* | 7/2019 | Jang | H01L 33/405 |
| 2019/0207150 A1* | 7/2019 | Kwon | H10K 50/824 |
| 2019/0259922 A1* | 8/2019 | Hsieh | H01L 33/505 |
| 2019/0273179 A1* | 9/2019 | Iguchi | H01L 25/0753 |
| 2019/0288049 A1* | 9/2019 | Takeya | H10K 50/84 |
| 2019/0312184 A1* | 10/2019 | Otto | H01L 33/508 |
| 2019/0326349 A1* | 10/2019 | Kwon | H01L 33/0093 |
| 2019/0355880 A1* | 11/2019 | Göötz | H01L 27/156 |
| 2019/0371774 A1* | 12/2019 | Zini | H01L 27/156 |
| 2019/0371779 A1* | 12/2019 | Yeon | H01L 25/18 |
| 2019/0378873 A1* | 12/2019 | Lee | H01L 25/0655 |
| 2020/0011518 A1* | 1/2020 | Ko | F21V 23/005 |
| 2020/0025351 A1* | 1/2020 | Kwon | H01L 33/505 |
| 2020/0075665 A1* | 3/2020 | Park | H01L 33/145 |
| 2020/0119101 A1* | 4/2020 | Lee | H10K 59/38 |
| 2020/0135706 A1* | 4/2020 | Sa | H01L 25/167 |
| 2020/0144444 A1* | 5/2020 | Kim | G02F 1/133617 |
| 2020/0152694 A1* | 5/2020 | Lee | H01L 33/50 |
| 2020/0194417 A1* | 6/2020 | Yeon | H01L 33/508 |
| 2020/0199101 A1 | 6/2020 | Liu et al. | |
| 2020/0243736 A1* | 7/2020 | Zhang | H01L 27/156 |
| 2020/0279879 A1 | 9/2020 | Lee et al. | |
| 2020/0279979 A1* | 9/2020 | Lee | H01L 33/62 |
| 2020/0295224 A1* | 9/2020 | Yanagawa | H01L 25/0753 |
| 2020/0310594 A1* | 10/2020 | Yang | G06F 3/0444 |
| 2020/0373284 A1* | 11/2020 | Jang | H01L 25/13 |
| 2021/0028327 A1* | 1/2021 | Lin | H10K 59/38 |
| 2021/0202800 A1* | 7/2021 | Jung | C07F 5/027 |
| 2021/0217739 A1* | 7/2021 | Lee | H01L 33/50 |
| 2021/0248466 A1 | 8/2021 | Yang et al. | |
| 2021/0249466 A1* | 8/2021 | Yang | H01L 33/505 |
| 2021/0265420 A1* | 8/2021 | Itou | H01L 33/382 |
| 2021/0265540 A1* | 8/2021 | Itou | G09F 9/30 |
| 2021/0313303 A1* | 10/2021 | Takeya | H01L 25/167 |
| 2021/0366980 A1* | 11/2021 | Lee | H01L 33/62 |
| 2021/0366981 A1* | 11/2021 | Yeon | H01L 33/502 |
| 2021/0366982 A1* | 11/2021 | Lee | H01L 33/382 |
| 2021/0367121 A1* | 11/2021 | Kim | H01L 33/44 |
| 2022/0115565 A1* | 4/2022 | Kim | H01L 33/44 |
| 2022/0209077 A1* | 6/2022 | Hyun | F21S 41/192 |
| 2022/0238597 A1* | 7/2022 | Kwon | H01L 33/0093 |

FOREIGN PATENT DOCUMENTS

| | | |
|---|---|---|
| JP | H 07-37511 | 2/1995 |
| JP | 2007-095998 | 4/2007 |
| JP | 2015064391 | 4/2015 |
| KR | 10-2014-0099066 | 8/2014 |
| KR | 10-2017-0054054 | 5/2017 |
| KR | 10-2017-0100999 | 9/2017 |

* cited by examiner

PIXEL-TYPE SEMICONDUCTOR LIGHT-EMITTING DEVICE AND METHOD OF MANUFACTURING THE SAME

CROSS-REFERENCE TO RELATED APPLICATION

This application is a Continuation of co-pending U.S. patent application Ser. No. 16/290,351, filed on Mar. 1, 2019, which claims the benefit of, and priority to, Korean Patent Application No. 10-2018-0046290, filed on Apr. 20, 2018 in the Korean Intellectual Property Office, the disclosures of which are herein incorporated by reference in their entirety.

TECHNICAL FIELD

The present disclosure relates to a semiconductor light-emitting device, and more particularly, to a pixel-type semiconductor light-emitting device and a method of manufacturing the pixel-type semiconductor light-emitting device.

DISCUSSION OF THE RELATED ART

Semiconductor light-emitting devices may be used in various lighting apparatuses such as automotive headlamps or indoor lighting. For example, semiconductor light-emitting devices may be used in an intelligent lighting system in which a light source module includes a plurality of light-emitting device chips and each light-emitting device chip is individually controlled to implement various lighting modes depending on ambient conditions.

SUMMARY

A semiconductor light-emitting device includes a plurality of light-emitting device structures separated from each other and arranged in a matrix form. A pad region at least partially surrounds the plurality of light-emitting device structures. The pad region is disposed outside of the plurality of light-emitting device structures. A partition structure is disposed on a first surface of the plurality of light-emitting device structures and is further disposed between adjacent light-emitting device structures of the plurality of light-emitting device structures. The partition structure defines a plurality of pixel spaces within the plurality of light-emitting device structures. A fluorescent layer is disposed on the first surface of the plurality of light-emitting device structures and fills each of the plurality of pixel spaces.

A semiconductor light-emitting device includes a plurality of light-emitting device structures separated from each other and arranged in a matrix form. A partition structure is disposed on a first surface of the plurality of light-emitting device structures and is disposed between adjacent light-emitting device structures of the plurality of light-emitting device structures. The partition structure definiens a plurality of pixel spaces on the plurality of light-emitting device structures. A fluorescent layer is disposed on the first surface of the plurality of light-emitting device structures and fills each of the plurality of pixel spaces. A pad region at least partially surrounds the plurality of light-emitting device structures. An upper surface of the partition structure is at a higher level than an upper surface of the pad region with respect to the first surface.

A semiconductor light-emitting device includes a pixel region having a plurality of light-emitting device structures separated from each other and arranged in a matrix form, a partition structure disposed on a first surface of the plurality of light-emitting device structures and disposed between adjacent light-emitting device structures in a plan view, the partition structure defining a plurality of pixel spaces on the plurality of light-emitting device structures, and a fluorescent layer disposed on the first surface of the plurality of light-emitting device structures, the fluorescent layer filling each of the plurality of pixel spaces. A pad region at least partially surrounds the pixel region. The pad region includes a pad electrically connected to the plurality of light-emitting device structures.

A method of manufacturing a semiconductor light-emitting device includes forming a plurality of light-emitting device structures on a substrate. A partition structure is formed to define a plurality of pixel spaces between each of the plurality of light-emitting device structures. A fluorescent layer is formed to fill each of the plurality of pixel spaces. A pad region is formed on the substrate. The pad region is disposed outside of the partition structure.

BRIEF DESCRIPTION OF THE DRAWINGS

Exemplary embodiments of the present inventive concept will be more clearly understood from the following detailed description taken in conjunction with the accompanying drawings, in which.

DETAILED DESCRIPTION OF THE EMBODIMENTS

Figure 1A:
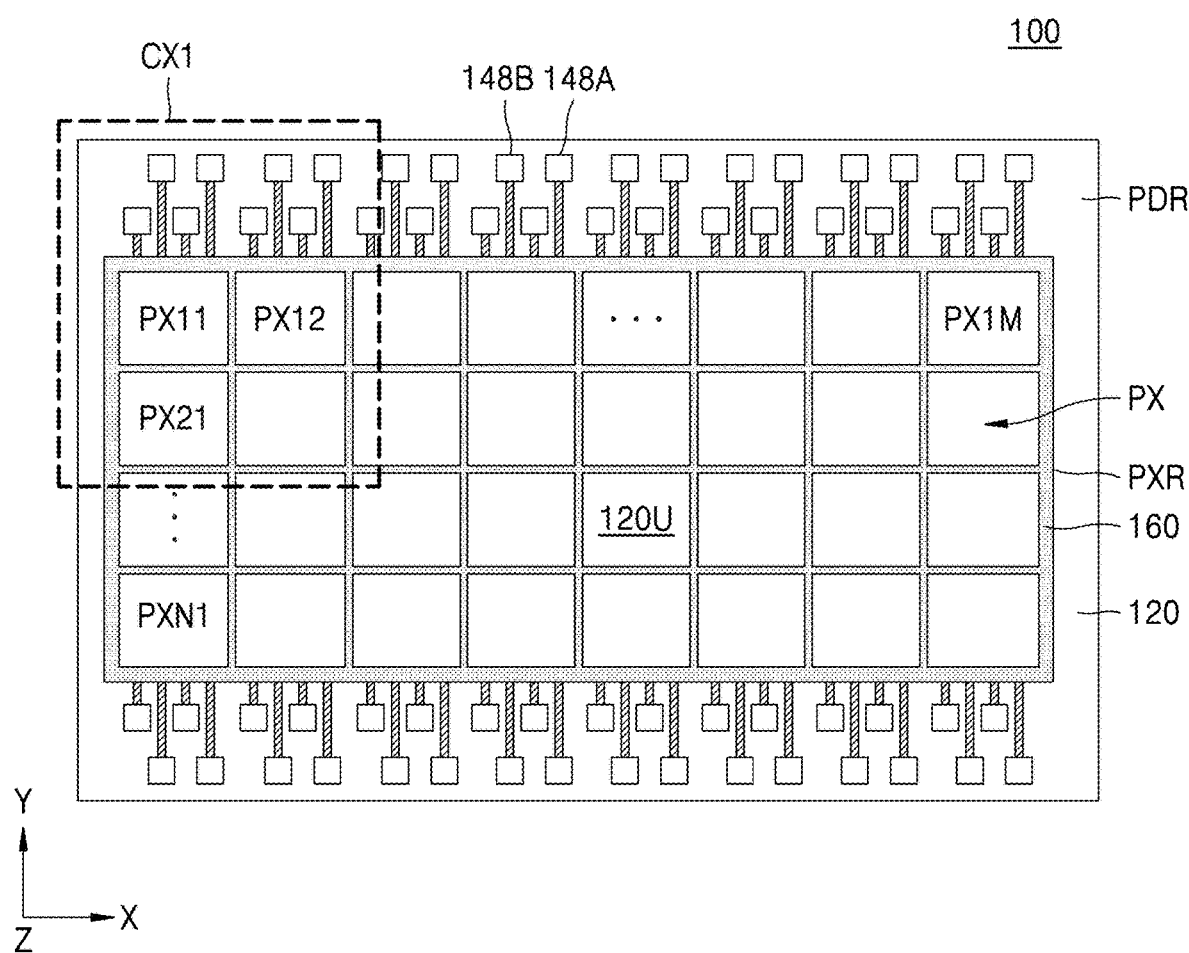
FIG. 1A is a plan view illustrating a semiconductor light-emitting device according to exemplary embodiments of the present inventive concept.

Hereinafter, exemplary embodiments of the present disclosure will be described in detail with reference to the accompanying drawings. Like reference numerals may refer to like elements throughout the present specification and the drawings.

Figure 1B:
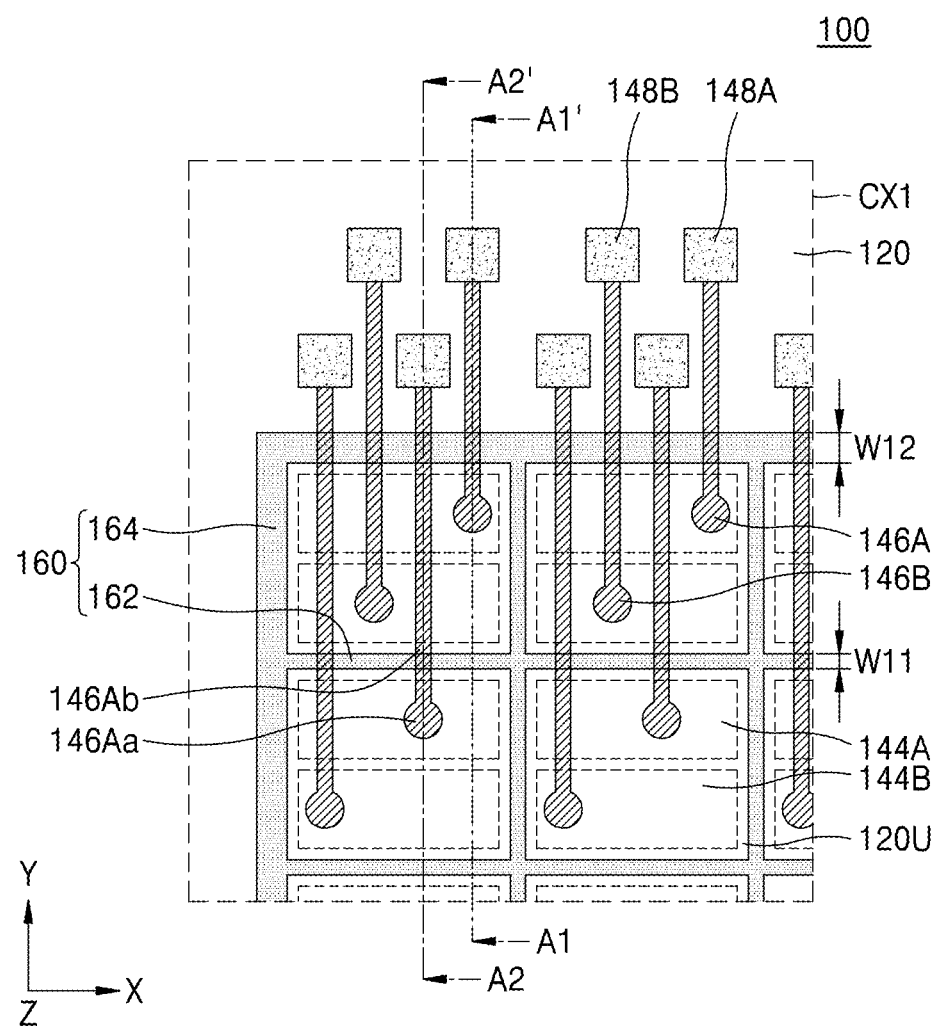
FIG. 1B is an enlarged plan view illustrating a portion CX1 in FIG. 1A.
Figure 2A:
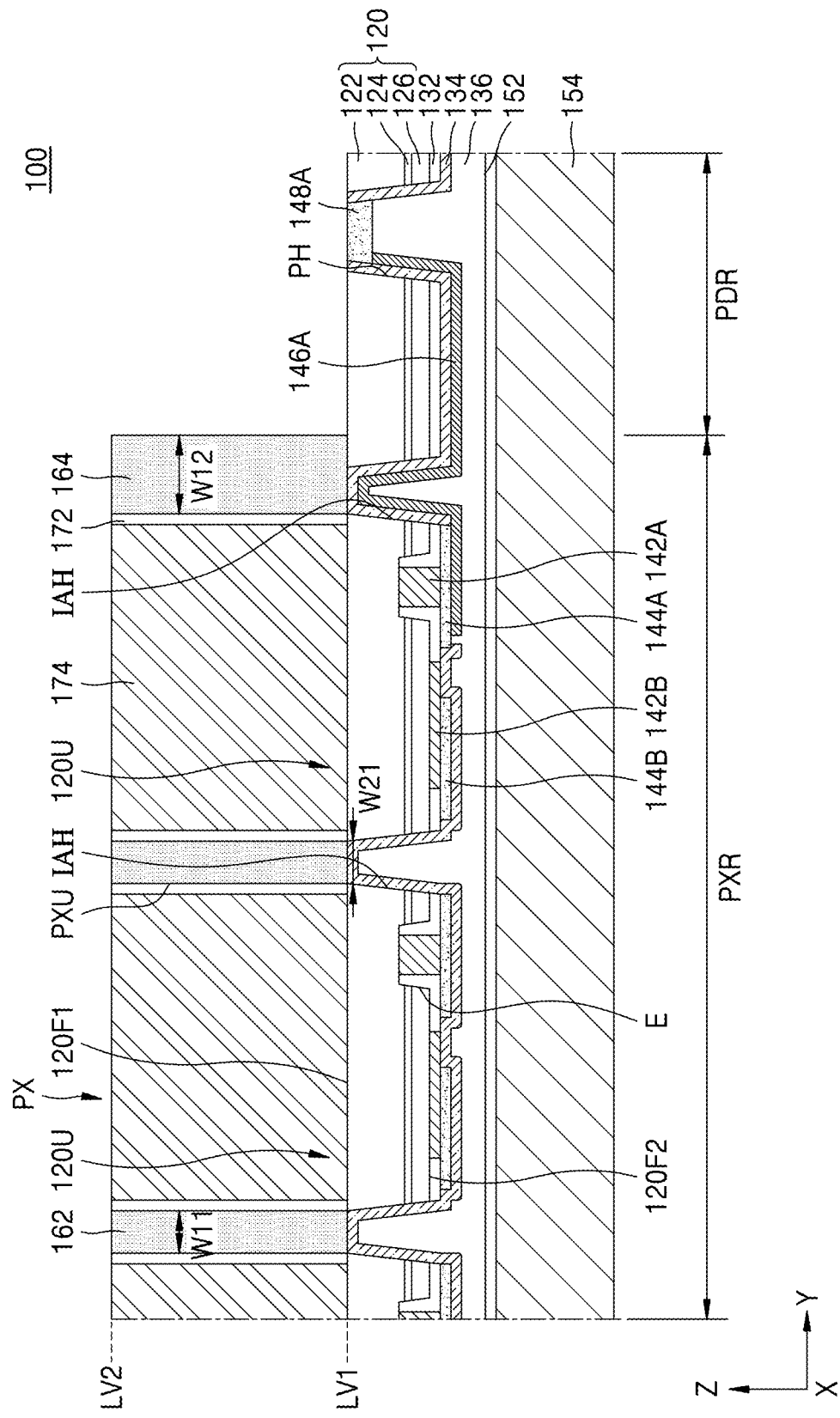
FIG. 2A is a sectional view taken along line A1-A1' of FIG. 1B.
Figure 2B:
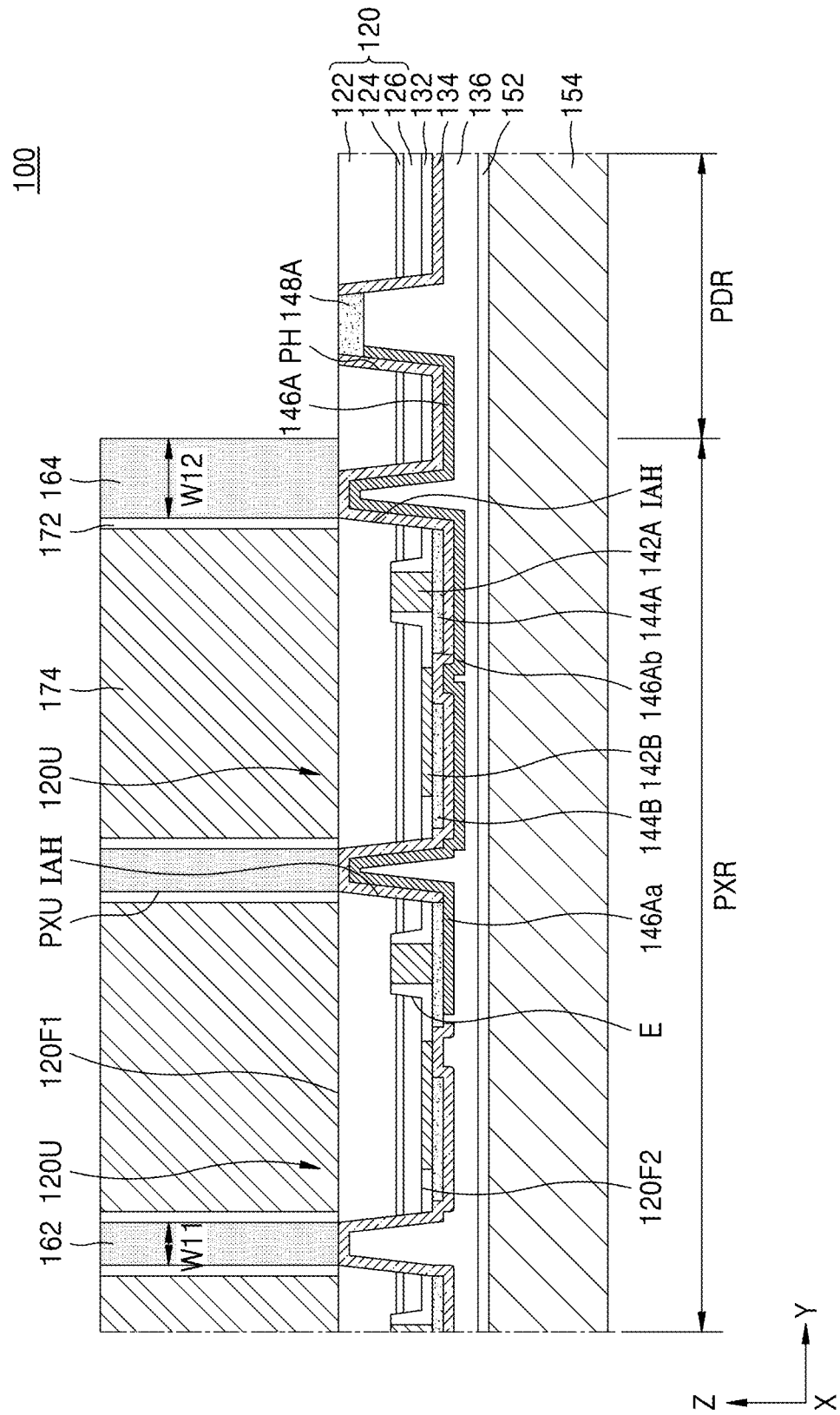
FIG. 2B is a sectional view taken along line A2-A2' of FIG. 1B.

FIG. 1A is a plan view illustrating a semiconductor light-emitting device 100 according to exemplary embodiments of the present inventive concept. FIG. 1B is an enlarged plan view illustrating a portion CX1 in FIG. 1A. FIG. 2A is a sectional view taken along line A1-A1' of FIG. 1B, and FIG. 2B is a sectional view taken along line A2-A2' of FIG. 1B. In FIGS. 1A and 1B, some components of the semiconductor light-emitting device 100 are shown and it is to be understood that additional components may be present.

Referring to FIGS. 1A and 2B, the semiconductor light-emitting device 100 may include a pixel region PXR and a pad region PDR at least partially surrounding the pixel region PXR. A plurality of light-emitting device structures 120U are arranged in a matrix form. The light-emitting device structures 120U may be disposed in the pixel region PXR. A first pad 148A and a second pad 148B are electrically connected to the plurality of light-emitting device structures 120U and may be disposed in the pad region PDR.

In the pixel region PXR, M pixels PX11, PX12, ..., PX1M may be successively arranged along the X axis and N pixels PX11, PX21, ..., PXN1 may be successively arranged along the Y axis (hereinafter, each pixel is referred to as "pixel PX"). Here, M and N are positive integers. Each pixel PX may include one of the plurality of light-emitting device structures 120U. Referring to FIG. 1A, for the sake of convenience, a total of thirty-two pixels including eight pixels along the X-axis and four pixels along the Y-axis are arranged in a matrix form. However, the inventive concept is not limited thereto and there may be greater than or fewer than thirty-two pixels.

According to exemplary embodiments of the present inventive concept, in the plan view, the pixel region PXR may have an area corresponding to about 50% to about 90% of the total area of the semiconductor light-emitting device 100, and the pad region PDR may have an area corresponding to about 10% to about 50% of the total area of the semiconductor light-emitting device 100. However, the inventive concept is not limited thereto. In the plan view, each pixel PX may have an X-direction width and/or a Y-direction width of, for example, about 10 μm to several mm, but is not limited thereto.

In the pixel region PXR, each of the plurality of light-emitting device structures 120U may be respectively disposed in each pixel PX. A partition structure 160 may be disposed on the plurality of light-emitting device structures 120U. In a plan view, the partition structure 160 may at least partially surround each of the plurality of light-emitting device structures 120U. In the pad region PDR, a light-emitting stack 120 may be disposed outside of the partition structure 160 and may at least partially surround the plurality of light-emitting device structures 120U.

As shown in FIG. 1B, the partition structure 160 may include a first partition layer 162 disposed between adjacent pixels PX within the pixel region PXR, and a second partition layer 164 disposed at a periphery of the pixel region PXR. In the plan view, the second partition layer 164 may be disposed to at least partially surround the first partition layer 162. The first partition layer 162 may have a first width W11 in the horizontal direction (e.g., the Y direction), the second partition layer 164 may have a second width W12 in the horizontal direction (e.g., the Y direction), and the second width W12 may be larger than the first width W11. For example, the first partition layer 162 may have a first width W11 ranging from about 10 μm to about 100 μm and the second partition layer 164 may have a second width W12 ranging from about 10 μm to about 1 mm. For example, the ratio of the second width W12 to the first width W11 may be greater than about 1 and less than about 10. However, the range of the first width W11, the range of the second width W12, and the ratio of the second width W12 to the first width W11 are not limited thereto.

The partition structure 160 may be formed such that the second partition layer 164 at the outermost side has the second width W12 that is larger than the first width W11 of the first partition layer 162, and accordingly, the structural stability of the semiconductor light-emitting device 100 may be increased. For example, even if the semiconductor light-emitting device 100 is exposed to repetitive vibrations and/or impacts, when the semiconductor light-emitting device 100 is used as a headlamp for a vehicle, the reliability of the semiconductor light-emitting device 100 may be increased by the structural stability between the partition structure 160 and a fluorescent layer 174 disposed in the partition structure 160.

As shown in FIG. 2A, the light-emitting stack 120 may include a first conductive semiconductor layer 122, an active layer 124, and a second conductive semiconductor layer 126. In the pixel region PXR, the plurality of light-emitting device structures 120U may be separated from each other by device isolation openings IAH. In a process, according to exemplary embodiments of the present inventive concept, the plurality of light-emitting device structures 120U may be formed on the pixel region PXR by removing a portion of the light-emitting stack 120 to form the device isolation openings IAH, and a portion of the light-emitting stack 120 at least partially surrounding the plurality of light-emitting device structures 120U may remain in the pad region PDR.

The plurality of light-emitting device structures 120U may include the first conductive semiconductor layer 122, the active layer 124, and the second conductive semiconductor layer 126. A first insulating layer 132, a first electrode 142A, a second electrode 142B, a first connection electrode 144A, and a second connection electrode 144B may be further disposed on the plurality of light-emitting device structures 120U.

The first conductive semiconductor layer 122 may be a nitride semiconductor including n-type $In_xAl_yGa_{(1-x-y)}N$ (where $0 \leq x < 1$, $0 \leq y < 1$, and $0 \leq x+y < 1$). For example, the first conductive semiconductor layer 122 may include GaN containing n-type impurities. For example, the n-type impurities may include silicon (Si).

According to exemplary embodiments of the present inventive concept, the first conductive semiconductor layer 122 may include a first conductive semiconductor contact layer and a current diffusion layer. The impurity concentration of the first conductive semiconductor contact layer may be in the range of $2 \times 10^{18}$ $cm^{-3}$ to $9 \times 10^{19}$ $cm^{-3}$. The thickness of the first conductive semiconductor contact layer may be about 1 μm to about 5 μm. The current diffusion layer may have a structure in which a plurality of $In_xAl_yGa_{(1-x-y)}N$ layers (where $0 \leq x$, $y \leq 1$, and $0 \leq x+y \leq 1$) having different compositions or different impurity contents are alternately stacked. For example, the current diffusion layer may have an n-type superlattice structure in which an n-type GaN layer and/or an $Al_xIn_yGa_zN$ layers (where $0 \le x,y,z \le 1$, and $x+y+z \ne 0$) each having a thickness of about 1 nm to about 500 nm are alternately stacked. The impurity concentration of the current diffusion layer may be in the range of $2 \times 10^{18}$ cm$^{-3}$ to $9 \times 10^{19}$ cm$^{-3}$.

The active layer 124 may be disposed between the first conductive semiconductor layer 122 and the second conductive semiconductor layer 126 and may discharge light by recombination of electrons and holes. The active layer 124 may have a multiple quantum well (MQW) structure in which quantum well layers and quantum barrier layers are alternately stacked. For example, each of the quantum well layers and each of the quantum barrier layer may include $In_xAl_yGa_{(1-x-y)}N$ layers (where $0 \le x$, $y \le 1$, and $0 \le x+y \le 1$) having different compositions. For example, the quantum well layer may include $In_xGa_{1-x}N$ (where $0 \le x \le 1$), and the quantum barrier layer may include GaN or AlGaN. The thicknesses of the quantum well layer and the quantum barrier layer may be in the range of about 1 nm to about 50 nm. The active layer 124 is not limited to the MQW structure and may have a single quantum well structure.

The second conductive semiconductor layer 126 may be a nitride semiconductor layer having a composition of p-type $In_xAl_yGa_{(1-x-y)}N$ (where $0 \le x < 1$, $0 \le y < 1$, and $0 \le x+y < 1$). For example, the p-type impurities may include magnesium (Mg).

According to exemplary embodiments of the present inventive concept, the second conductive semiconductor layer 126 may include an electron blocking layer, a low-concentration p-type GaN layer, and a high-concentration p-type GaN layer provided as a contact layer. For example, the electron blocking layer may have a structure in which a plurality of $In_xAl_yGa_{(1-x-y)}N$ layers (where $0 \le x$, $y \le 1$, and $0 \le x+y \le 1$) having a thickness of about 5 nm to about 100 nm and having different compositions or different impurity contents are alternately stacked, or may be a single layer including $Al_yGa_{(1-y)}N$ (where $0 < y \le 1$). An energy band gap of the electron blocking layer may decrease as a distance from the active layer 124 increases. For example, an amount of aluminum (Al) in the electron blocking layer decreases as the distance from the active layer 124 increases.

The first conductive semiconductor layer 122, the active layer 124, and the second conductive semiconductor layer 126 may be sequentially stacked in the vertical direction. Here, the upper surface of the first conductive semiconductor layer 122 is referred to as a first surface 120F1 of the plurality of light-emitting device structures 120U and the bottom surface of the second conductive semiconductor layer 126 is referred to as a second surface 120F2 of the plurality of light-emitting device structures 120U.

The first electrode 142A may be connected to the first conductive semiconductor layer 122 in an opening E penetrating the active layer 124 and the second conductive semiconductor layer 126. The second electrode 142B may be disposed on the bottom surface (e.g., the second surface 120F2) of the second conductive semiconductor layer 126. The first insulating layer 132 may be disposed on the inner wall of the opening E and may electrically insulate the first electrode 142A from the active layer 124 and the second conductive semiconductor layer 126. The first insulating layer 132 may be disposed between the first electrode 142A and the second electrode 142B on the bottom surface of the second conductive semiconductor layer 126 and may electrically insulate the first electrode 142A from the second electrode 142B. Each of the first electrode 142A and the second electrode 142B may include Ag, Al, Ni, Cr, Au, Pt, Pd, Sn, W, Rh, Ir, Ru, Mg, Zn, or a combination thereof. Each of the first electrode 142A and the second electrode 142B may include a metal material having a high reflectivity.

The first connection electrode 144A may be disposed on the first electrode 142A and the first insulating layer 132, and the second connection electrode 144B may be disposed on the second electrode 142B and the first insulating layer 132. The first connection electrode 144A and the second connection electrode 144B may be electrically connected to the first electrode 142A and the second electrode 142B, respectively. Each of the first connection electrode 144A and the second connection electrode 144B may include Ag, Al, Ni, Cr, Au, Pt, Pd, Sn, W, Rh, Ir, Ru, Mg, Zn, or a combination thereof.

The plurality of light-emitting device structures 120U may be spaced apart from each other with a device isolation opening IAH positioned therebetween. For example, the device isolation opening IAH may include a sidewall that are inclined at an oblique angle of about 60 degrees to about 90 degrees with respect to the first surface 120F1 of the light-emitting device structure 120U. A width W21 of the device isolation opening IAH at the same vertical level LV1 as the first surface 120F1 of the light-emitting device structures 120U may be equal to or less than the first width W11 of the first partition layer 162, but is not limited thereto.

An insulating liner 134 may be formed on the inner wall of the device isolation opening IAH and may be conformally disposed to cover the first connection electrode 144A and the second connection electrode 144B on the side and the second surface 120F2 of each of the plurality of light-emitting device structures 120U. The upper surface of the insulating liner 134 may be disposed on the same level as the first surface 120F1 of the plurality of light-emitting device structures 120U. According to exemplary embodiments of the present inventive concept, the insulating liner 134 may include silicon oxide or silicon nitride.

A pad opening PH penetrating the light-emitting stack 120 may be disposed on the pad region PDR, and a first pad 148A and a second pad 148B may be disposed in the pad opening PH. The first pad 148A and the second pad 148B may be electrically connected to the first connection electrode 144A and the second connection electrode 144B through a first wiring pattern 146A and a second wiring pattern 146B, respectively.

As shown in FIGS. 1B and 2B, the first wiring pattern 146A may include a first portion 146Aa and a second portion 146Ab. The first portion 146Aa of the first wiring pattern 146A may penetrate the insulating liner 134 and be connected to the first connection electrode 144A. The second portion 146Ab of the first wiring pattern 146A may extend over the insulating liner 134 and be connected to the first pad 148A.

The second portion 146Ab of the first wiring pattern 146A, in some pixels PX, may pass through the device isolation opening IAH and extend to an adjacent pixel PX (e.g., a pixel PX disposed at the outermost side), and may be connected to the first pad 148A on the pad region PDR. Accordingly, the first wiring pattern 146A may be conformally disposed on the insulating liner 134 in the device isolation opening IAH.

A buried insulating layer 136 may be disposed on the insulating liner 134, the first wiring pattern 146A, and the second wiring pattern 146B. The buried insulating layer 136 may be in contact with the insulating liner 134, the first wiring pattern 146A and the second wiring pattern 146B inside the device isolation opening IAH and may fill the remaining space of the device isolation opening IAH. The buried insulating layer 136 may be formed using a silicone resin, an epoxy resin, or an acrylic resin.

A support substrate 154 may be disposed on the buried insulating layer 136 with an adhesive layer 152 therebetween. According to exemplary embodiments of the present inventive concept, the adhesive layer 152 may include an electrically insulating material, for example, silicon oxide, silicon nitride, polymeric material such as ultraviolet (UV) curable material, or resin. In some embodiments, the adhesive layer 152 may include the same material as the buried insulating layer 136, and the boundary between the adhesive layer 152 and the buried insulating layer 136 might not be discernible. In some embodiments, the adhesive layer 152 may include a eutectic adhesive material such as AuSn or NiSi. The support substrate 154 may include, but is not limited to including, a sapphire substrate, a glass substrate, a transparent conductive substrate, a silicon substrate, a silicon carbide substrate, or the like.

As described above, the partition structure 160 may be disposed on the first surface 120F1 of the plurality of light-emitting device structures 120U. The partition structure 160 may include silicon (Si), silicon carbide (SiC), sapphire, and/or gallium nitride (GaN). According to exemplary embodiments of the present inventive concept, after the plurality of light-emitting device structures 120U are formed on the substrate 110 (see FIG. 13), the partition structure 160 may be formed by removing a portion of the substrate 110. In this case, the partition structure 160 may be a portion of the substrate 110 serving as a growth substrate for forming the light-emitting stack 120.

The partition structure 160 may be arranged in a matrix form in a plan view, and a plurality of pixel spaces PXU may be defined by the partition structure 160. The partition structure 160 may vertically overlap the device isolation opening LAH, and the bottom surface of the partition structure 160 may be in contact with the upper surface of the insulating liner 134. Accordingly, the first surface 120F1 of the plurality of light-emitting device structures 120U may be exposed to the bottom of the plurality of pixel spaces PXU.

A reflective layer 172 may be disposed on the sidewall of the partition structure 160. The reflective layer 172 may reflect light emitted from the plurality of light-emitting device structures 120U. The reflective layer 172 may be formed on the sidewall of the first partition layer 162 and thus the sidewalls of the plurality of pixel spaces PXU may be covered with the reflective layer 172. Alternatively, the reflective layer 172 might not be formed on the sidewall of the second partition layer 164 which faces the pad region PDR.

According to exemplary embodiments of the present inventive concept, the reflective layer 172 may be a metal layer including Ag, Al, Ni, Cr, Au, Pt, Pd, Sn, W, Rh, Ir, Ru, Mg, Zn, or a combination thereof. In some embodiments, the reflective layer 172 may be a resin layer such as polyphthalamide (PPA) containing a metal oxide such as titanium oxide or aluminum oxide. In some embodiments, the reflective layer 172 may be a distributed Bragg reflector layer. For example, the distributed Bragg reflector layer may have a structure in which a plurality of insulating films having different refractive indexes are stacked repeatedly, for example, they may be stacked anywhere from several times to several hundred times. Each of the insulating films in the distributed Bragg reflector layer may include oxide, nitride, or a combination thereof, for example, $SiO_2$, SiN, $SiO_xN_y$, $TiO_2$, $Si_3N_4$, $Al_2O_3$, TiN, AlN, $ZrO_2$, TiAlN, or TiSiN.

A fluorescent layer 174 may be disposed in the plurality of pixel spaces PXU on the first surface 120F1 of the plurality of light-emitting device structures 120U. As shown in FIG. 2A, the fluorescent layer 174 may fill substantially the entire space of the plurality of pixel spaces PXU and an upper surface level of the fluorescent layer 174 may be equal to an upper surface level LV2 of the partition structure 160. The fluorescent layer 174 may have a substantially flat upper surface.

The fluorescent layer 174 may include a single material capable of converting the color of light emitted from the light-emitting device structure 120U into a desired color. For example, a fluorescent layer 174 associated with the same color may be disposed in the plurality of pixel spaces PXU. However, the inventive concept is not limited thereto. For example, the color of a fluorescent layer 174 disposed in some of the plurality of pixel spaces PXU may be different from the color of a fluorescent layer 174 disposed in the remaining pixel spaces PXU.

The fluorescent layer 174 may include a resin containing a fluorescent substance dispersed therein or a film containing a fluorescent substance. For example, the fluorescent layer 174 may include a fluorescent substance film in which fluorescent substance particles are uniformly dispersed at a certain concentration. The fluorescent substance particles may be a wavelength conversion material that changes the wavelength of light emitted from the plurality of light-emitting device structures 120U. The fluorescent layer 174 may include two or more different kinds of fluorescent substance particles having different size distributions to increase the density of the fluorescent substance particles and increase color uniformity.

According to exemplary embodiments of the present inventive concept, the fluorescent substance may have various colors and various compositions such as an oxide-based composition, a silicate-based composition, a nitride-based composition, and a fluoride-based composition. For example, $\beta$-SiAlON:$Eu^{2+}$(green), (Ca,Sr)AlSiN$_3$:$Eu^{2+}$(red), $La_3Si_6N_{11}$:$Ce^{3+}$(yellow), $K_2SiF_6$:$Mn_4^+$(red), $SrLiAl_3N_4$:Eu (red), $Ln_{4-x}(Eu_zM_{1-z})_xSi_{12-y}Al_yO_{3+x+y}N_{18-x-y}$ (0.5≤x≤3, 0<z<0.3, 0<y≤4)(red), $K_2TiF_6$:$Mn_4^+$(red), $NaYF_4$:$Mn_4^+$ (red), $NaGdF_4$:$Mn_4^+$(red), and the like may be used as the fluorescent substance. However, the kind of the fluorescent substance used is not limited thereto.

In some embodiments, a wavelength conversion material, such as quantum dots, may be further disposed over the fluorescent layer 174. The quantum dots may each have a core-shell structure using a II-V or II-VI compound semiconductor. For example, the quantum dot may have a core such as CdSe and InP and a shell such as ZnS and ZnSe. In addition, the quantum dot may include a ligand for stabilizing the core and the shell.

In some embodiments, the reflective layer 172 might not be formed on the sidewall of the partition structure 160, unlike that shown in FIG. 2A. In this case, the sidewall of the first partition layer 162 and the sidewall of the second partition layer 164 may be in contact with the fluorescent layer 174.

An upper surface level LV1 of the first and second pads 148A and 148B in the pad region PDR may be substantially equal to the level of the first surface 120F1 of the plurality of light-emitting device structures 120U. A connecting member, such as a bonding wire for electrical connection with a driving semiconductor chip, may be disposed on the first and second pads 148A and 148B in the pad region PDR. The upper surface level LV2 of the partition structure 160 at the boundary between the pad region PDR and the pixel region PXR may be higher than the upper surface level LV1 of the first and second pads 148A and 148B.

In general, a light source module including a plurality of light-emitting device chips may be used for an intelligent lighting system such as a head lamp for a vehicle, and each of the light-emitting device chips may be individually controlled to implement various lighting modes depending on ambient conditions. When a plurality of light-emitting devices arranged in a matrix form is used, light emitted from each of the plurality of light-emitting devices may be absorbed or penetrated into an adjacent light-emitting device. Thus, contrast characteristics of the light source module might be suboptimal.

However, according to exemplary embodiments of the present inventive concept, the partition structure 160 may prevent light emitted from one pixel PX from being absorbed or penetrated into an adjacent pixel PX, and accordingly, contrast characteristics of the light-emitting device 100 may be increased. In addition, since the plurality of light-emitting device structures 120U are completely separated from each other by the device isolation opening IAH, light emitted from a light-emitting device structure 120U may be prevented from being absorbed or penetrated into an adjacent light-emitting device structure 120U and the contrast characteristics of the semiconductor light-emitting device 100 may be increased.

The fluorescent layer 174 may be firmly fixed within each pixel space PXU by the partition structure 160. The partition structure 160 may be formed such that the second partition layer 164 at the outermost side has a greater width than the first partition layer 162, and accordingly, the structural stability of the semiconductor light-emitting device 100 may be increased. For example, even if the semiconductor light-emitting device 100 is exposed to repetitive vibration and/or impact, when the semiconductor light-emitting device 100 is used as a headlamp for a vehicle, the reliability of the semiconductor light-emitting device 100 may be increased by the structural stability between the fluorescent layer 174 and the partition structure 160.

Figure 3:
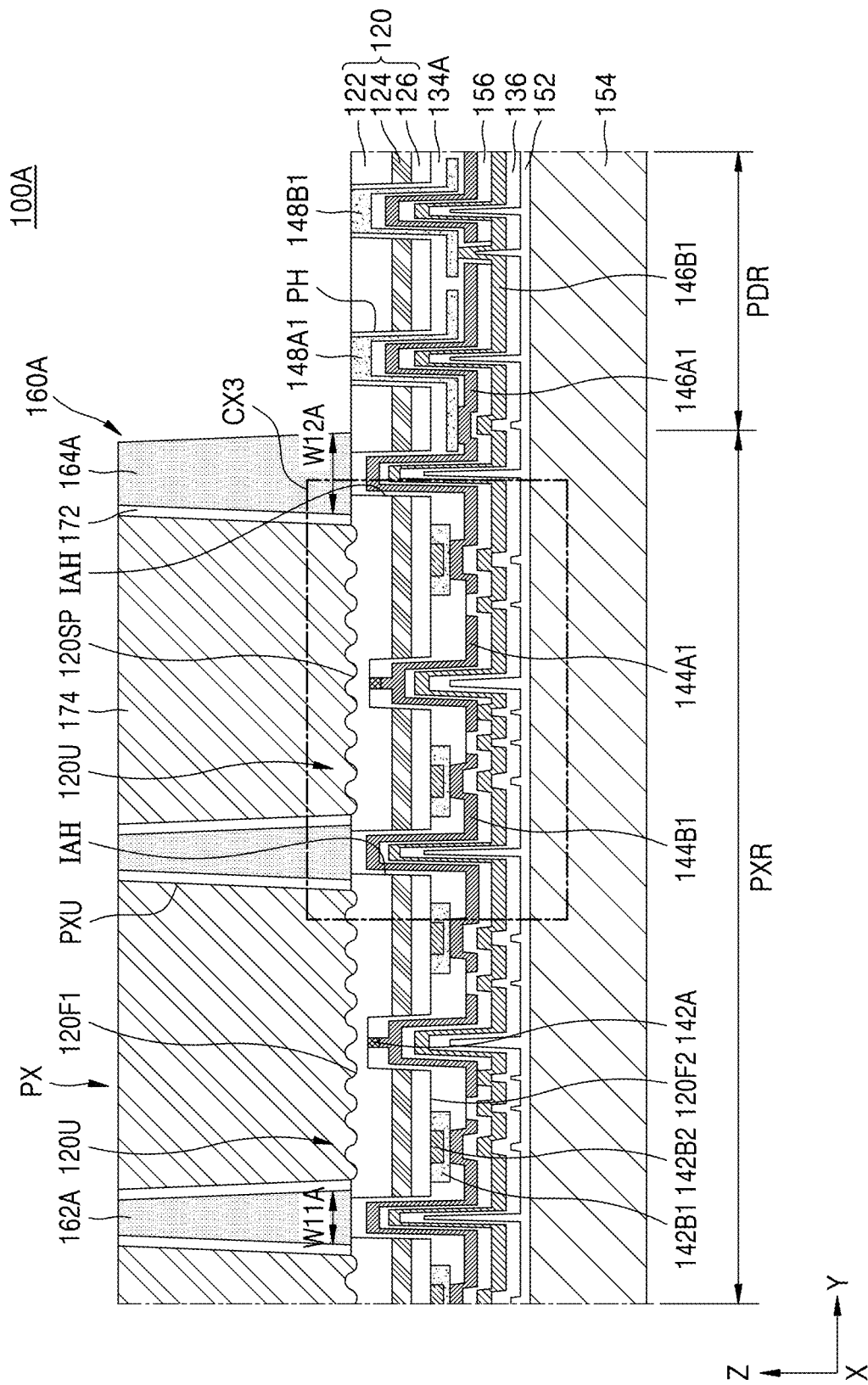
FIG. 3 is a cross-sectional view illustrating a semiconductor light-emitting device according to exemplary embodiments of the present inventive concept.
Figure 4:
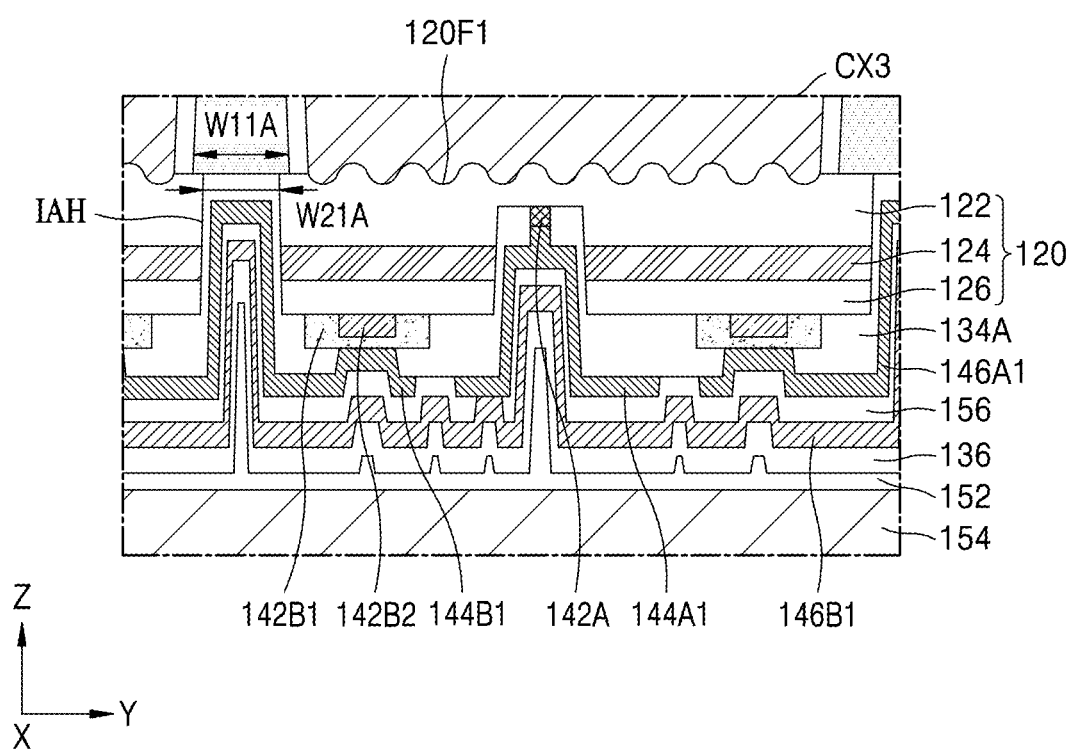
FIG. 4 is an enlarged cross-sectional view illustrating a portion CX3 in FIG. 3.

FIG. 3 is a cross-sectional view illustrating a semiconductor light-emitting device 100A according to exemplary embodiments of the present inventive concept, and FIG. 4 is an enlarged cross-sectional view illustrating a portion CX3 in FIG. 3.

Referring to FIGS. 3 and 4, a partition structure 160A may include a first partition layer 162A having an oblique sidewall and a second partition layer 164A having an oblique sidewall. A first width Wi 1A of the first partition layer 162A and a second width W12A of the second partition layer 162B in the horizontal direction (e.g., the Y direction in FIG. 3) may gradually decrease in a direction away from a first surface 120F1 of a plurality of light-emitting device structures 120U. The width of each of a plurality of pixel spaces PXU in the horizontal direction may gradually increase in a direction away from the first surface 120F1 of the plurality of light-emitting device structures 120U, and accordingly, the efficiency of extracting light from the plurality of light-emitting device structures 120U may be increased.

As shown in FIG. 4, the first surface 120F1 of the plurality of light-emitting device structures 120U may be provided with a concavo-convex structure 120SP to increase the efficiency of extracting light from the plurality of light-emitting device structures 120U. A width W21A of a device isolation opening IAH at the same level as the first surface 120F1 of the plurality of light-emitting device structures 120U may be less than the first width W11A at the bottom surface of the first partition layer 162A. However, the inventive concept is not limited thereto.

According to exemplary embodiments of the present inventive concept, a second electrode 142B1 may be disposed on a second conductive semiconductor layer 126 and a second contact layer 142B2 may be further formed between the second conductive semiconductor layer 126 and the second electrode 142B1. An insulating liner 134A may be conformally formed on the inner wall of the device isolation opening IAH and a second surface 120F2 of the plurality of light-emitting device structures 120U and may at least partially surround a first electrode 142A and a second electrode 142B1. Although the insulating liner 134A in FIGS. 3 and 4 is shown as a single layer, the insulating liner 134A may have a multilayered structure including a plurality of insulating layers. A first connection electrode 144A 1 and a second connection electrode 144B1 may be disposed on the insulating liner 134A and may be electrically connected to the first electrode 142A and the second electrode 142B1, respectively.

The first pad 148A 1 and the second pad 148B1 may be conformally disposed on the inner wall of a pad opening PH, and the insulating liner 134A may be disposed between the first pad 148A1 and a light-emitting stack 120 and between the second pad 148B1 and the light-emitting stack 120. The first pad 148A1 and the second pad 148B1 may be electrically connected to the first connection electrode 144A 1 and the second connection electrode 144B1 through a first wiring pattern 146A 1 and a second wiring pattern 146B1, respectively.

An intermediate insulating layer 156 may be disposed on the first connection electrode 144A1, the second connection electrode 144B1. The first wiring pattern 146A1 and the second wiring pattern 146B1 may be disposed on the intermediate insulating layer 156 and may be connected to the second pad 14881 through the intermediate insulating layer 156. As the intermediate insulating layer 156 is disposed between the first wiring pattern 146A 1 and the second wiring pattern 146B1, the first wiring pattern 146A 1 and the second wiring pattern 146B1 may be spaced apart from each other in the vertical direction (e.g., the Z direction in FIG. 4). However, the arrangement of the first and second wiring patterns 146A 1 and 146B1 is not limited thereto.

According to the semiconductor light-emitting device 100A described above, the partition structure 160A may prevent light emitted from one pixel PX from being absorbed or penetrated into an adjacent pixel PX, and accordingly, contrast characteristics of the semiconductor light-emitting device 100A may be increased. In addition, as the partition structure 160A has an oblique sidewall, the efficiency of extracting light from the light-emitting device structures 120U may be increased.

Figure 5:
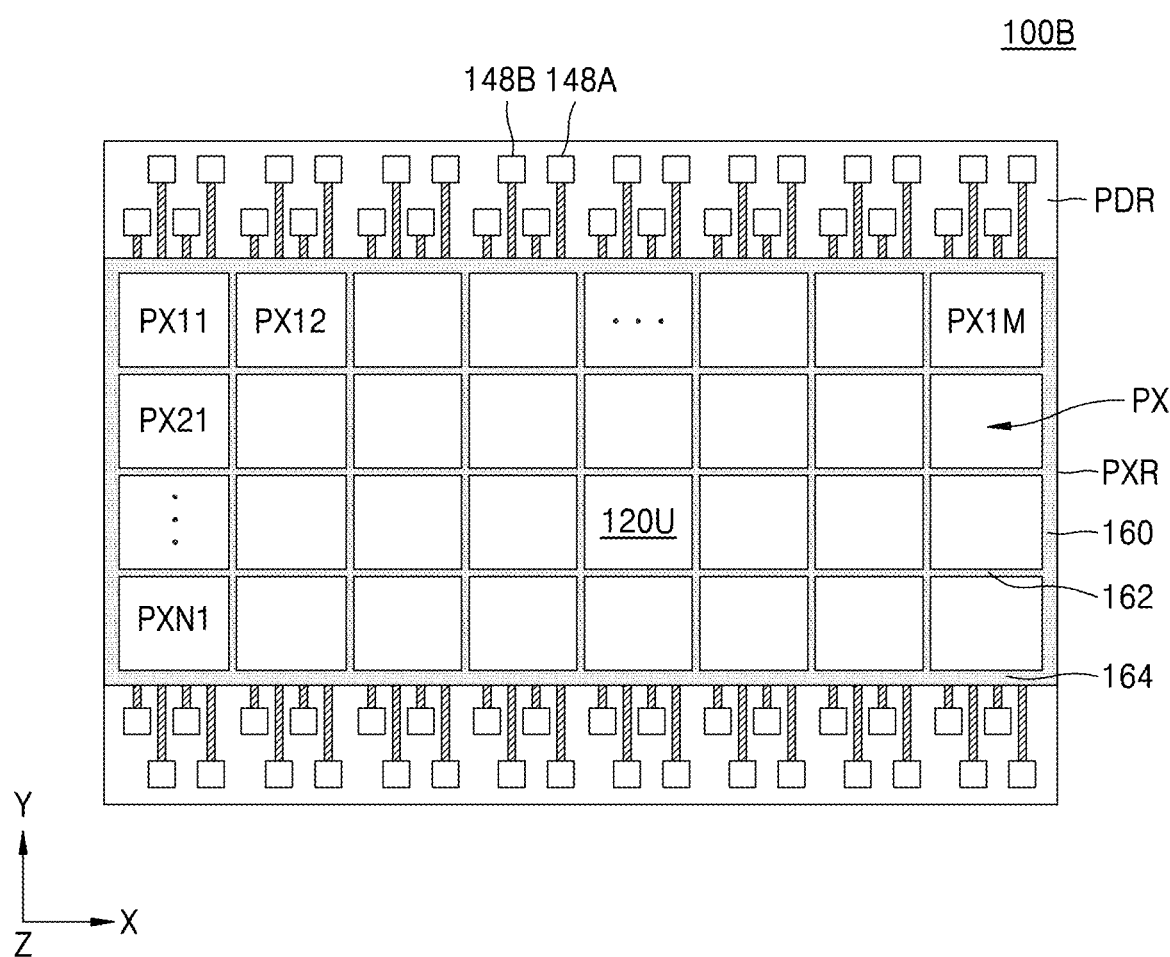
FIGS. 5 to 7 are plan views illustrating semiconductor light-emitting devices according to exemplary embodiments of the present inventive concept.

FIG. 5 is a plan view illustrating a semiconductor light-emitting device 100B according to exemplary embodiments of the present inventive concept.

Referring to FIG. 5, a pad region PDR may be disposed on both sides of a pixel region PXR. A portion of a second partition layer 164 of a partition structure 160 may be disposed at the boundary between the pad region PDR and the pixel region PXR and another portion of the second partition layer 164 may be disposed at the edge of the semiconductor light-emitting device 100B. The partition structure 160 may be formed such that the second partition layer 164 at the outermost side has a greater thickness than the first partition layer 162, and accordingly, the reliability of the semiconductor light-emitting device 100B may be increased by the structural stability between the partition structure 160 and a fluorescent layer 174 (see FIG. 2A) disposed in the partition structure 160, even if a portion of the second partition layer 164 is disposed at the edge of the semiconductor light-emitting device 100B.

Figure 6:
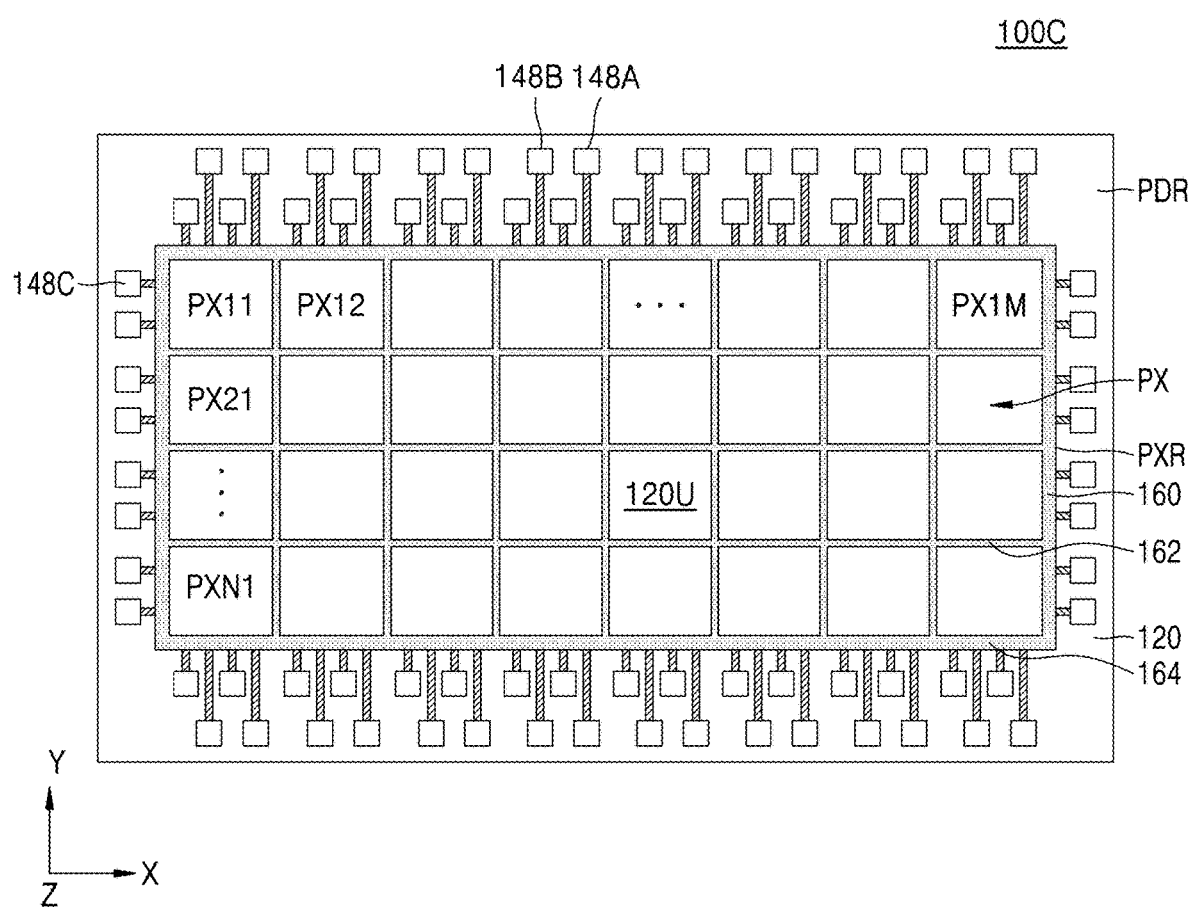

FIG. 6 is a plan view illustrating a semiconductor light-emitting device 100C according to exemplary embodiments of the present inventive concept.

Referring to FIG. 6, first and second pads 148A and 148B may be disposed in a portion of a pad region PDR on both sides of a pixel region PXR in the Y direction, and a third pad 148C may be further disposed in a portion of the pad region PDR on both sides of the pixel region PXR in the X direction. The third pad 148C may have a structure similar to those of the first and second pads 148A and 148B described above.

Figure 7:
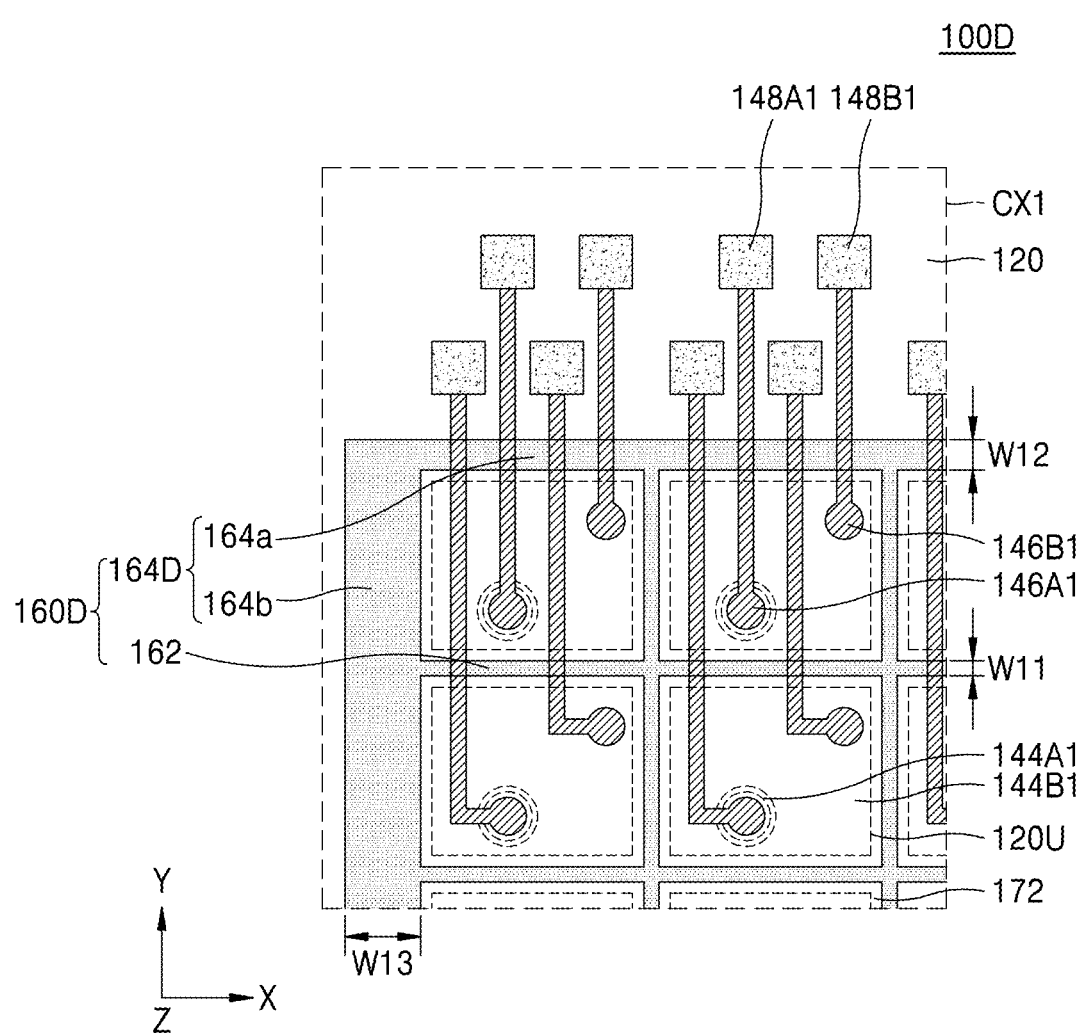

FIG. 7 is a plan view illustrating a semiconductor light-emitting device 100D according to exemplary embodiments of the present inventive concept. FIG. 7 is an enlarged plan view illustrating a portion corresponding to the portion CX1 in FIG. 1A.

Referring to FIG. 7, a partition structure 160D may include a first partition layer 162 and a second partition layer 164D. The second partition layer 164D may include a first portion 164a and a second portion 164b which have different thicknesses.

The partition structure 160D has a matrix or grid-shaped horizontal cross section. When the second partition layer 164D, which is an outer peripheral portion of the partition structure 160D, has a rectangular horizontal cross section, the first portion 164a of the second partition layer 164D may extend in the X direction and the second portion 164b of the second partition layer 164D may extend in the Y direction. First and second pads 148A1 and 148B1 may be disposed on one side of the first portion 164a of the second partition layer 164D, and the first and second pads 148A1 and 148B1 might not be disposed on one side of the second portion 164b.

The first portion 164a of the second partition layer 164D may have a second width W12 in the Y direction, the second portion 164b of the second partition layer 164D may have a third width W13 in the X direction, and the third width W13 may be greater than the second width W12. The second portion 164b of the second partition layer 164D may have a third width W13 ranging from about 10 µm to about 5 mm, but the present invention is not limited to this particular structure.

According to exemplary embodiments of the present inventive concept, a first connection electrode 144A 1 and a second connection electrode 144B1 may have different areas, and in the plan view, the second connection electrode 144B1 may be disposed to at least partially surround the first connection electrode 144A1. As shown in FIG. 7, a first wiring pattern 146A1 and a second wiring pattern 146B1 may be arranged in a line shape extending in the horizontal direction (e.g., the Y direction) in the plan view or in a line shape having a bent portion.

According to the semiconductor light-emitting device 100D described above, since the second portion 164b of the partition structure 160D is thick, the structural stability of the semiconductor light-emitting device 100D may be increased.

Figure 8:
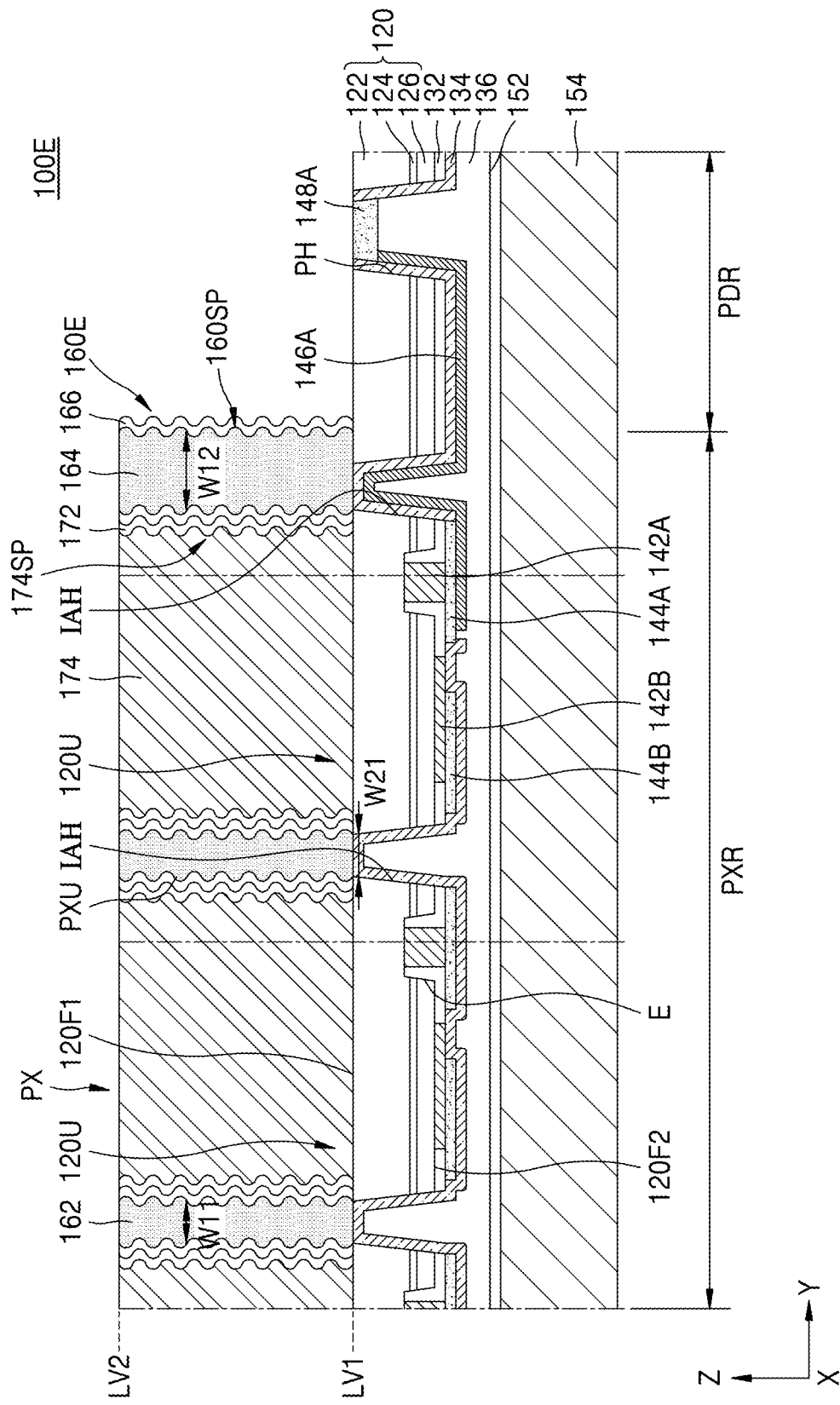
FIGS. 8 to 12 are cross-sectional views illustrating semiconductor light-emitting devices according to exemplary embodiments of the present inventive concept.

FIG. 8 is a cross-sectional view illustrating a semiconductor light-emitting device 100E 1s according to exemplary embodiments of the present inventive concept. FIG. 8 is a cross-sectional view corresponding to a cross section taken along line A1-A1' in FIG. 1B.

Referring to FIG. 8, a partition structure 160E may further include a passivation layer 166 disposed on the sidewalls of a first partition layer 162 and a second partition layer 164, A reflective layer 172 may be disposed on the passivation layer 166. The passivation layer 166 may include silicon oxide, silicon nitride, polyimide, and the like. The passivation layer 166 may serve to electrically insulate the partition structure 160E from a plurality of light-emitting device structures 120U or to improve adhesion properties of the reflective layer 172 to the partition structure 160E.

Each of the first partition layer 162 and the second partition layer 164 may include a plurality of convex portions 160SP on the sidewall thereof. For example, the plurality of convex portions 160SP may be disposed at regular intervals over the entire height of the first partition layer 162 and the second partition layer 164. The reflective layer 172 disposed on the sidewalls of the first partition layer 162 and the second partition layer 164 may be conformally formed depending on the shapes of the plurality of convex portions 160SP. A fluorescent layer 174 filling a plurality of pixel spaces PXU on the sidewall of the reflective layer 172 may also include a plurality of concave portions 174SP corresponding to the shapes of the plurality of convex portions 160SP. Since the partition structure 160E includes the plurality of convex portions 160SP, an area of the fluorescent layer 174 facing the partition structure 160E (or a contact area between the fluorescent layer 174 and the reflective layer 172) may further increase, and thus, the fluorescent layer 174 may be firmly fixed to the partition structure 160E.

According to exemplary embodiments of the present inventive concept, after a light-emitting stack 120 is formed on a substrate 110 (see FIG. 13), a portion of the substrate 110 may be etched to form a partition structure 160E. A plurality of convex portions 160SP may be formed on the sidewall of the partition structure 160E according to etching conditions used in an etching process for the substrate 110.

According to the semiconductor light-emitting device 100E described above, since the partition structure 160E includes the plurality of convex portions 160SP, the structural stability of the semiconductor light-emitting device 100E may be increased.

Figure 9:
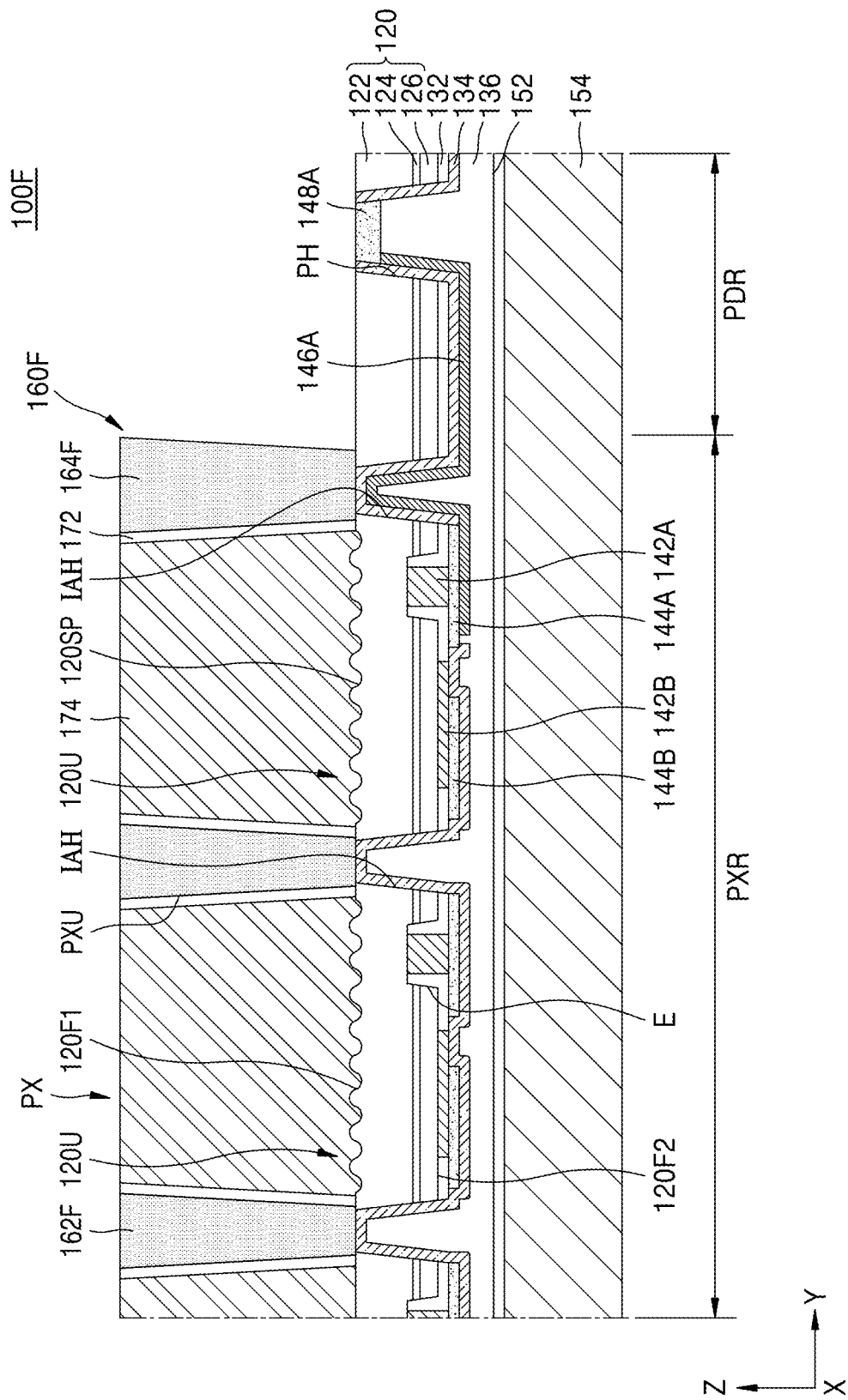

FIG. 9 is a cross-sectional view illustrating a semiconductor light-emitting device 100F according to exemplary embodiments of the present inventive concept. FIG. 9 is a cross-sectional view corresponding to a cross section taken along line A1-A1' in FIG. 1B.

Referring to FIG. 9, a partition structure 160F may include a first partition layer 162F having an oblique sidewall and a second partition layer 164F having an oblique sidewall. The width of each of the first partition layer 162F and the second partition layer 164F in the horizontal direction (e.g., the Y direction in FIG. 9) may gradually increase in a direction away from a first surface 120F1 of a light-emitting device structure 120U. The width of each of a plurality of pixel spaces PXU in the horizontal direction may gradually decrease in a direction away from the first surface 120F1 of the light-emitting device structure 120U. For example, in an etching process for forming the partition structure 160F, as an etching depth is greater (or closer to the first surface 120F1 of the light-emitting device structure 120U) according to etching conditions, the amount of the substrate 110 to be removed (see FIG. 13) may increase, and in this case, the partition structure 160F shown in FIG. 9 may be formed.

Figure 10:
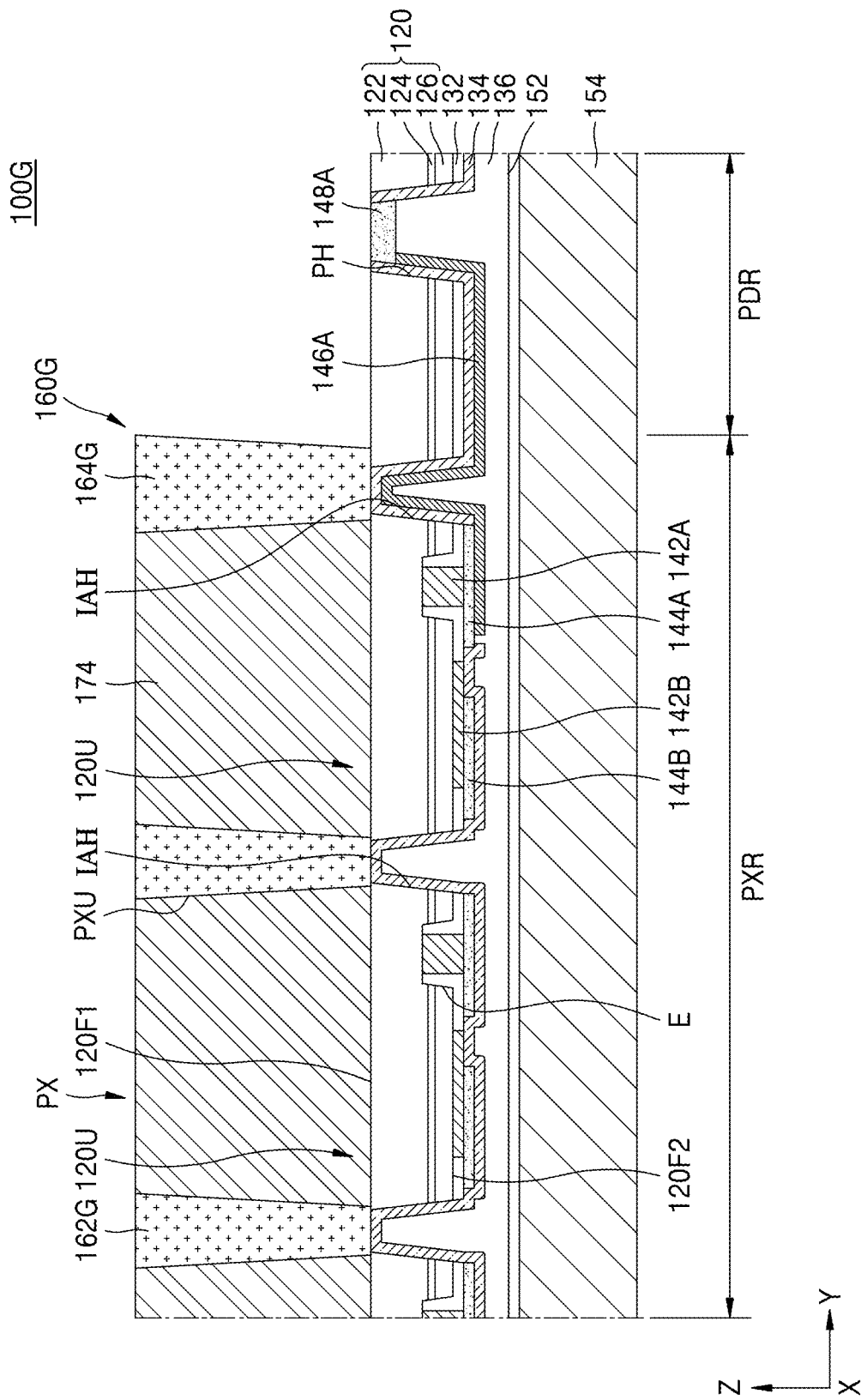

FIG. 10 is a cross-sectional view illustrating a semiconductor light-emitting device 100G according to exemplary embodiments of the present inventive concept. FIG. 10 is a cross-sectional view corresponding to a cross section taken along line A1-A1' in FIG. 1B.

Referring to FIG. 10, a partition structure 160G may include a first partition layer 162G and a second partition layer 164G. Each of the first partition layer 162G and the second partition layer 164G may include a resin layer containing a light reflective material. The width of each of the first partition layer 162O and the second partition layer 164G in the horizontal direction may gradually increase in a direction away from a first surface 120F1 of a light-emitting device structure 120U, but the present invention is not limited to this particular configuration.

According to exemplary embodiments of the present inventive concept, each of the first partition layer 162G and the second partition layer 164G may be a resin layer such as PPA containing a metal oxide such as titanium oxide or aluminum oxide. In some embodiments, each of the first partition layer 162G and the second partition layer 164G may be a distributed Bragg reflector layer. For example, the distributed Bragg reflector layer may have a structure in which a plurality of insulating films having different refractive indexes are stacked repeatedly anywhere form several times to several hundred times. In some embodiments, each of the first partition layer 162G and the second partition layer 164G may be a metal layer including Ag, Al, Ni, Cr, Au, Pt, Pd, Sn, W, Rh, Ir, Zn, or a combination thereof.

The partition structure 160G may contact the fluorescent layer 174 and may have an integral structure including a light reflecting material. For example, the reflective layer 172 described with reference to FIG. 2A might not be interposed between the first partition layer 162G and the fluorescent layer 174 nor between the second partition layer 164G and the fluorescent layer 174.

According to the semiconductor light-emitting device 100G described above, the partition structure 160G may prevent light emitted from one pixel PX from being absorbed or penetrated into an adjacent pixel PX, and accordingly, contrast characteristics of the semiconductor light-emitting device 1000 may be increased. In addition, since the partition structure 160G has an integral structure including a light reflecting material, the light extraction efficiency of the semiconductor light-emitting device 100G may be increased.

Figure 11:
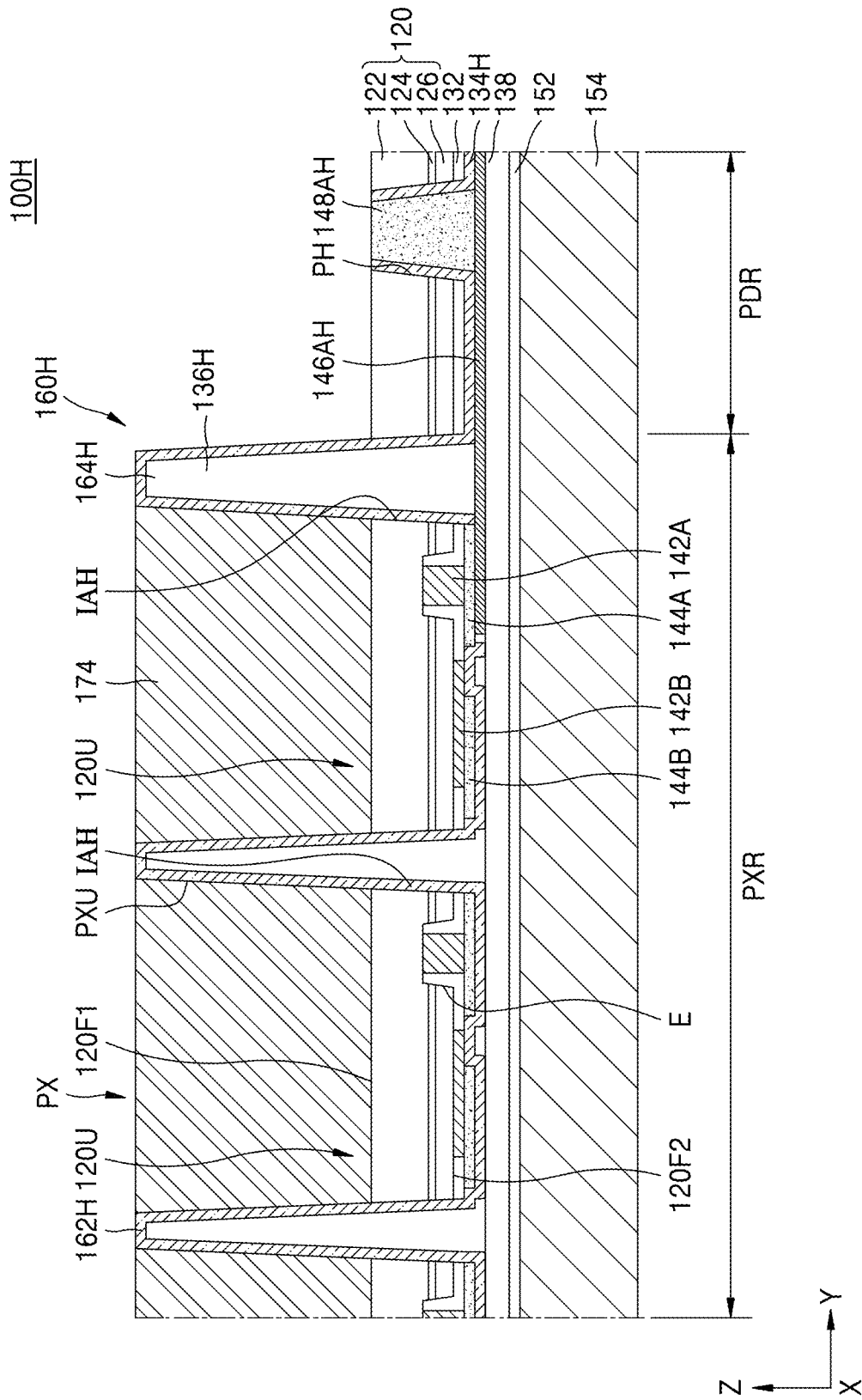

FIG. 11 is a cross-sectional view illustrating a semiconductor light-emitting device 100H according to exemplary embodiments of the present inventive concept. FIG. 11 is a cross-sectional view corresponding to a cross section taken along line A1-A1' in FIG. 1B.

Referring to FIG. 11, a partition structure 160H may include a first partition layer 162H and a second partition layer 164H. Each of the first partition layer 162H and the second partition layer 164H may include a portion of an insulating liner 134H and a portion of a buried insulating layer 136H. A device isolation opening IAH may extend in the vertical direction (e.g., the Z direction) from an area between light-emitting device structures 120U to an area between fluorescent layers 174, and the insulating liner 134H may extend in the vertical direction (e.g., the Z direction) to an area between the fluorescent layers 174 on the inner wall of the device isolation opening IAH. The buried insulating layer 136H may be disposed on the inner wall of the insulating liner 134H and may fill an inner space of the partition structure 160H.

According to exemplary embodiments of the present inventive concept, the buried insulating layer 136H may be formed using a silicone resin, an epoxy resin, or an acrylic resin. In some embodiments, the buried insulating layer 136H may be a resin layer such as PPA containing a metal oxide such as titanium oxide or aluminum oxide.

According to exemplary embodiments of the present inventive concept, a first wiring pattern 146AH electrically connected to a first connection electrode 144A might not be disposed on the inner wall of the device isolation opening IAH, but may extend, with a relatively small level difference, on the bottom surface of the buried insulating layer 136H. According to exemplary embodiments of the present inventive concept, a first pad 148AH and a second pad 148B (see FIG. 1B) may be relatively thick to fill the inside of a pad opening PH. However, the inventive concept is not limited thereto.

A second insulating layer 138 may be further disposed between the buried insulating layer 136H and an adhesive layer 152 and between the first wiring pattern 146AH and the adhesive layer 152. Alternatively, a reflective layer may be further interposed between the insulating liner 134H and the fluorescent layer 174.

Figure 12:
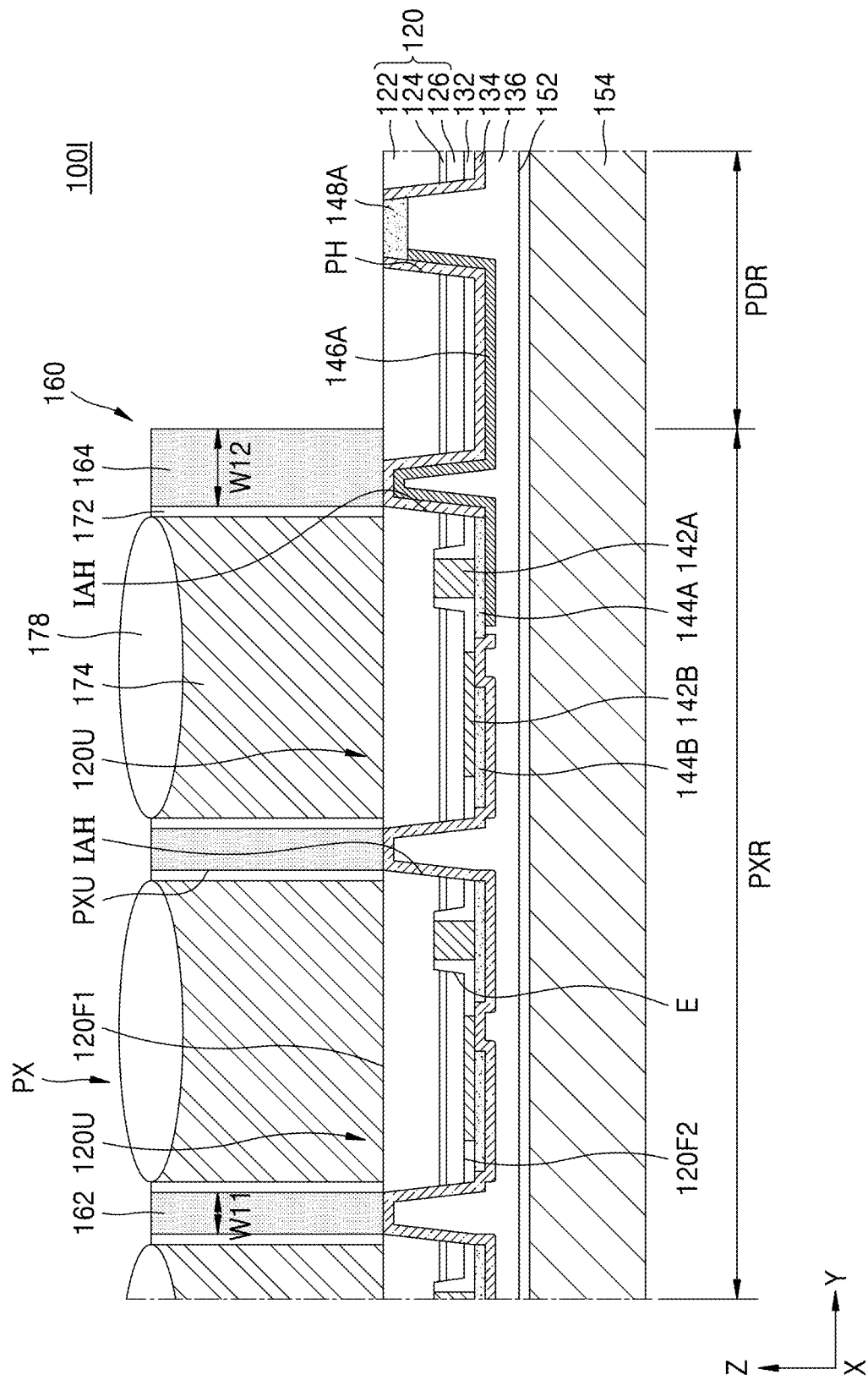

FIG. 12 is a cross-sectional view illustrating a semiconductor light-emitting device 100I according to exemplary embodiments of the present inventive concept. FIG. 12 is a cross-sectional view corresponding to a cross section taken along line A1-A1' in FIG. 1B.

A plurality of lenses 178 may be disposed on a fluorescent layer 174 in each pixel region PXU. The edges of the plurality of lenses 178 may contact a partition structure 160 and/or a reflective layer 172 and the sizes of the plurality of lenses 178 may be substantially equal to the area of a pixel region PXU defined by the partition structure 160. As each of the plurality of lenses 178 has a convex upper surface and a convex lower surface, a fluorescent layer 174 in contact with the plurality of lenses 178 may have a concave upper surface.

The plurality of lenses 178 may be fixed by the partition structure 160, and accordingly, an additional optical system (e.g., additional lens) generally disposed outside of the semiconductor light-emitting device 100I may be simplified. Thus, the semiconductor light-emitting device 100I may have a compact size.

FIGS. 13 to 24 are cross-sectional views illustrating a method of manufacturing a semiconductor light-emitting device 100 according to exemplary embodiments of the present inventive concept. FIGS. 13 to 24 are cross-sectional views corresponding to cross sections taken along line A1-A1' in FIG. 1B.

Figure 13:
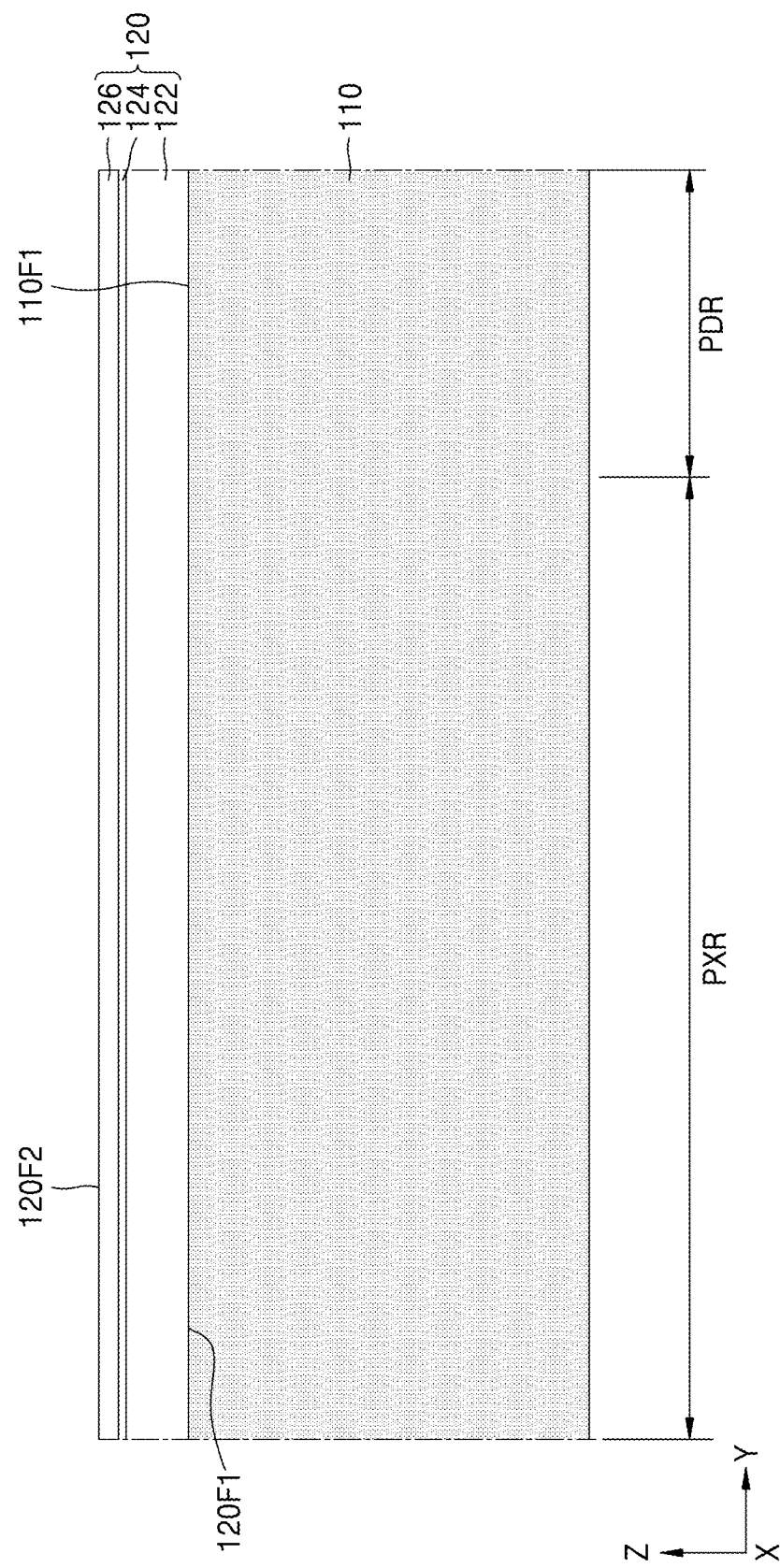
FIGS. 13 to 24 are cross-sectional views illustrating a method of manufacturing a semiconductor light-emitting device according to exemplary embodiments of the present inventive concept.

Referring to FIG. 13, a light-emitting stack 120 may be formed on a substrate 110.

According to exemplary embodiments of the present inventive concept, the substrate 110 may include a silicon (Si) substrate, a silicon carbide (SiC) substrate, a sapphire substrate, a gallium nitride (GaN) substrate, or the like. The substrate 110 may include a pixel region PXR and a pad region PDR, and the pad region PDR may be formed outside of the pixel region PXR in a plan view to at least partially surround the pixel region PXR.

The light-emitting stack 120 may include a first conductive semiconductor layer 122, an active layer 124, and a second conductive semiconductor layer 126, which are sequentially formed on a first surface 110F1 of the substrate 110.

Figure 14:
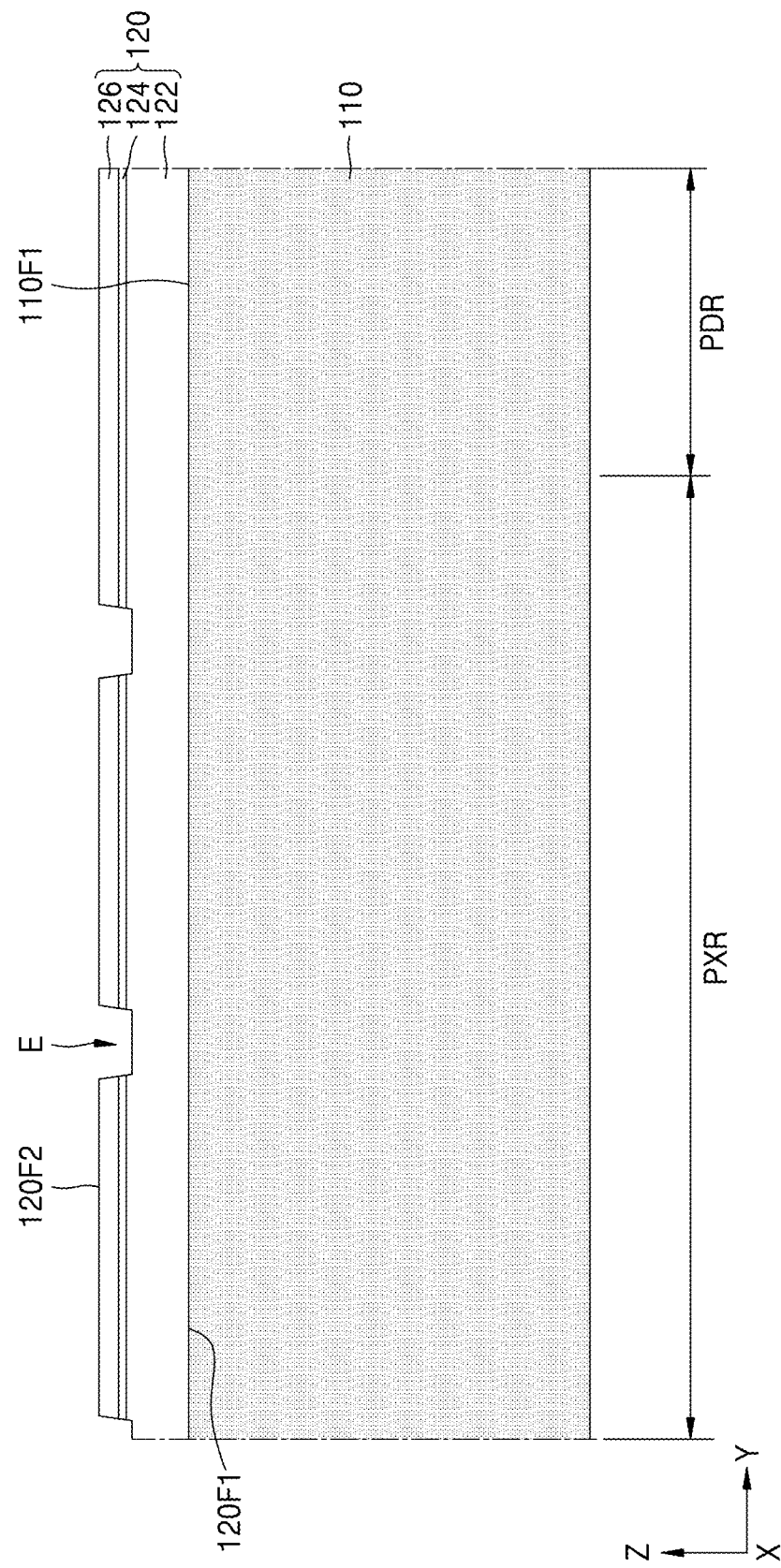

Referring to FIG. 14, a mask pattern may be formed on the light-emitting stack 120, and a portion of the light-emitting stack 120 may be removed using the mask pattern as an etching mask and thus an opening E may be formed. The opening E may expose an upper surface of the first conductive semiconductor layer 122. The opening E might not be formed on the pad region PDR of the substrate 110.

Figure 15:
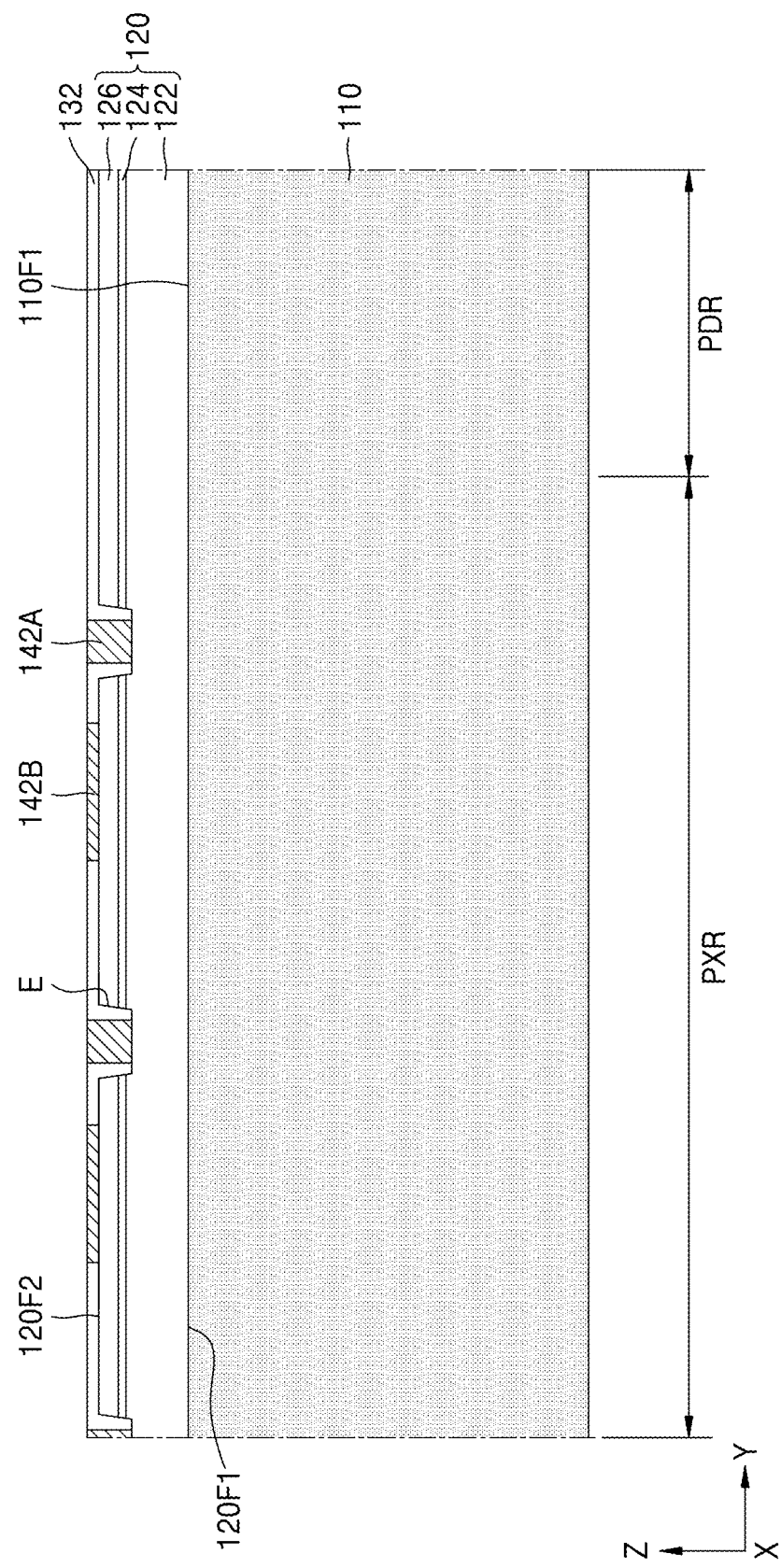

Referring to FIG. 15, a first insulating layer 132 may be formed on the light-emitting stack 120 to conformally cover the opening E. The first insulating layer 132 may be formed on both the pixel region PXR and the pad region PDR.

Thereafter, a portion of the first insulating layer 132 in the opening E may be removed and a portion of the first insulating layer 132 on the second conductive semiconductor layer 126 may be removed to thereby expose an upper surface of the first conductive semiconductor layer 122 and an upper surface of the second conductive semiconductor layer 126.

A first electrode 142A and a second electrode 142B may be formed on the exposed upper surface of the first conductive semiconductor layer 122 and the exposed upper surface of the second conductive semiconductor layer 126, respectively. A first contact layer including a conductive ohmic material may be further formed between the first electrode 142A and the first conductive semiconductor layer 122, and a second contact layer including a conductive ohmic material may be further formed between the second electrode 142B and the second conductive semiconductor layer 126.

Figure 16:
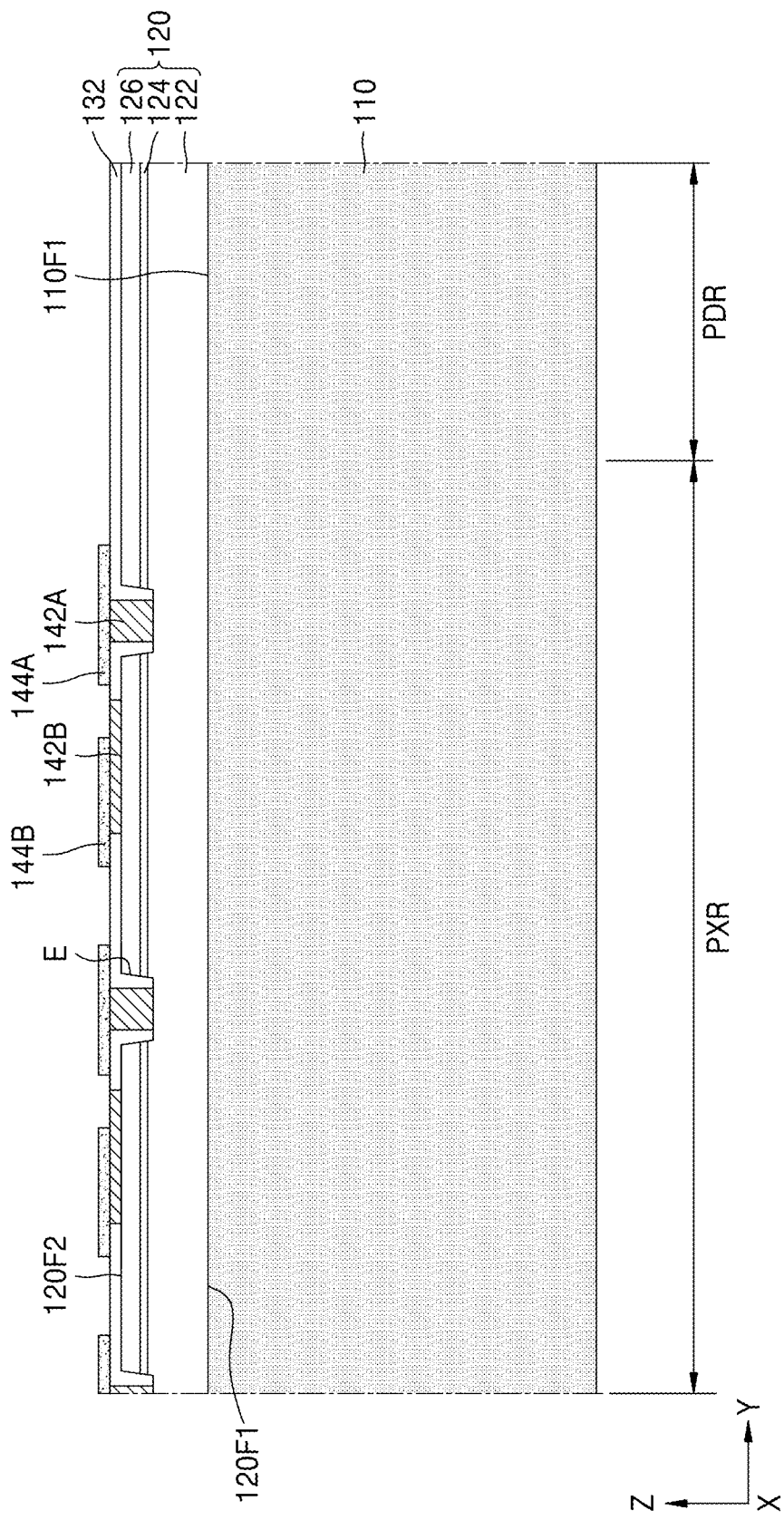

Referring to FIG. 16, a first connection electrode 144A and a second connection electrode 144B electrically connected to the first electrode 142A and the second electrode 142B, respectively may be formed on a first insulating layer 132. According to exemplary embodiments of the present inventive concept, a conductive layer may be formed on the first electrode 142A, the second electrode 142B, and the first insulating layer 132, and the conductive layer may be patterned to thereby form the first connection electrode 144A and the second connection electrode 144B connected to the first electrode 142A and the second electrode 142B, respectively. In some embodiments, the first connection electrode 144A and the second connection electrode 144B may be formed by a plating process.

Figure 17:
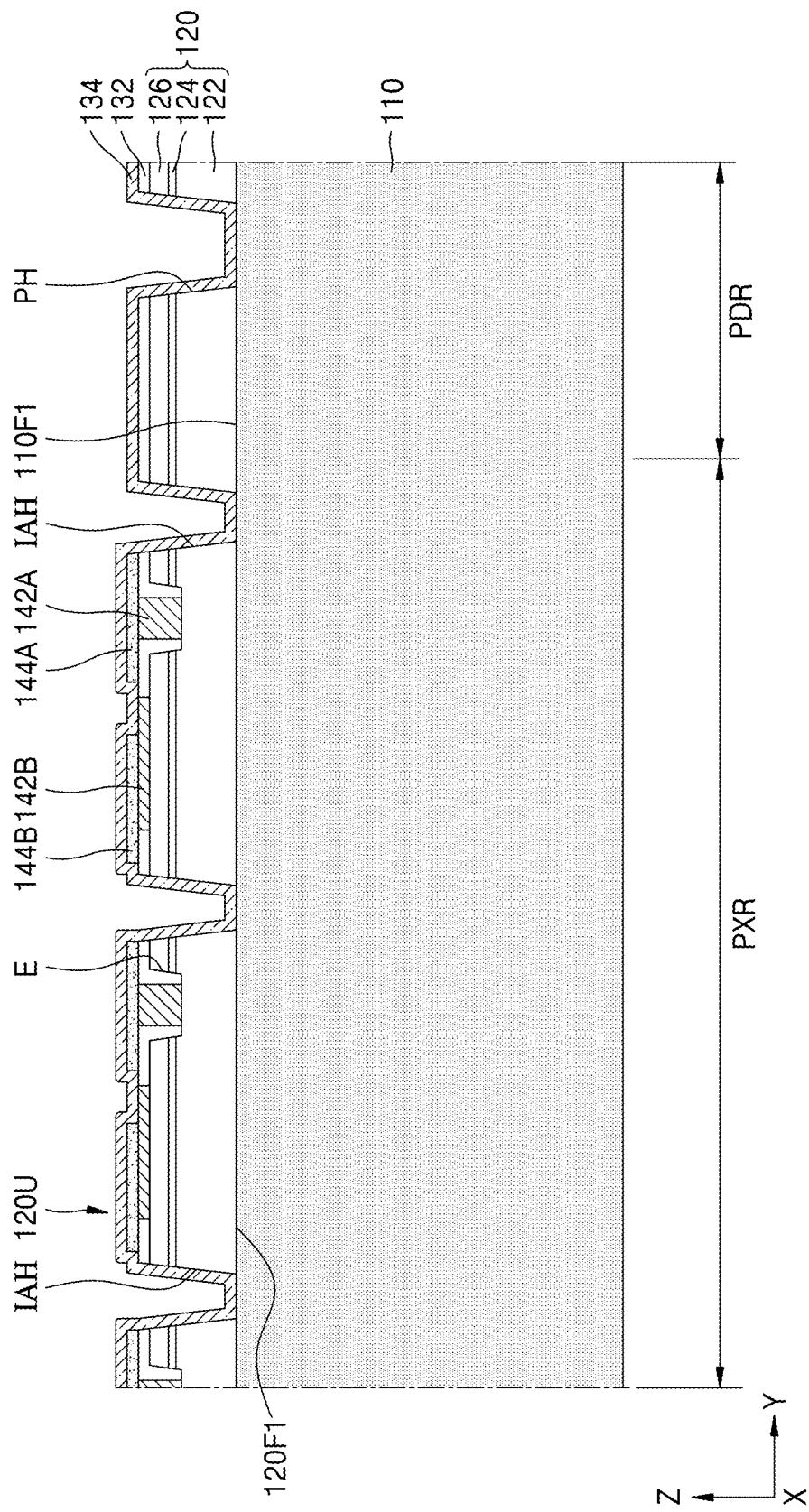

Referring to FIG. 17, a portion of the light-emitting stack 120 may be removed and thus a device isolation opening IAH and a pad opening PH may be formed in the light-emitting stack 120 in the pixel region PXR and the pad region PDR, respectively. The device isolation opening IAH and the pad opening PH may completely pass through the light-emitting stack 120, and thus, the first surface 110F1 of the substrate 110 may be exposed at the bottom of the device isolation opening IAH and the bottom of the pad opening PH.

In the pixel region PXR, the light-emitting stack 120 may be separated into a plurality of light-emitting device structures 120U by the device isolation opening IAH. According to exemplary embodiments of the present inventive concept, a process of forming the device isolation opening JAH may be performed by a blade, but other processes may be used to form the device isolation opening IAH. As shown in FIG. 17, the side cross-sectional shape of each of the plurality of light-emitting device structures 120U obtained by the process of forming the device isolation opening IAH may be a trapezoid shape whose upper portion is shorter than a lower portion thereof. However, the inventive concept is not limited thereto.

Thereafter, an insulating liner 134 may be formed on the upper surfaces and sidewalls of the plurality of light-emitting device structures 120U and the light-emitting stack 120. The insulating liner 134 may be conformally formed on the inner wall of the device isolation opening IAH and on the inner wall of the pad opening PH, and may contact the first surface 110F1 of the substrate 110 exposed at the bottom of the device isolation opening IAH and the bottom of the pad opening PH.

As one light-emitting device structure 120U is physically and electrically separated from an adjacent light-emitting device structure 120U by the device isolation opening IAH and the insulating liner 134, light emitted from the light-emitting device structure 120U might not be absorbed or penetrated into an adjacent light-emitting device structure 120U, and accordingly, contrast characteristics of the semiconductor light-emitting device 100 may be increased.

Figure 18:
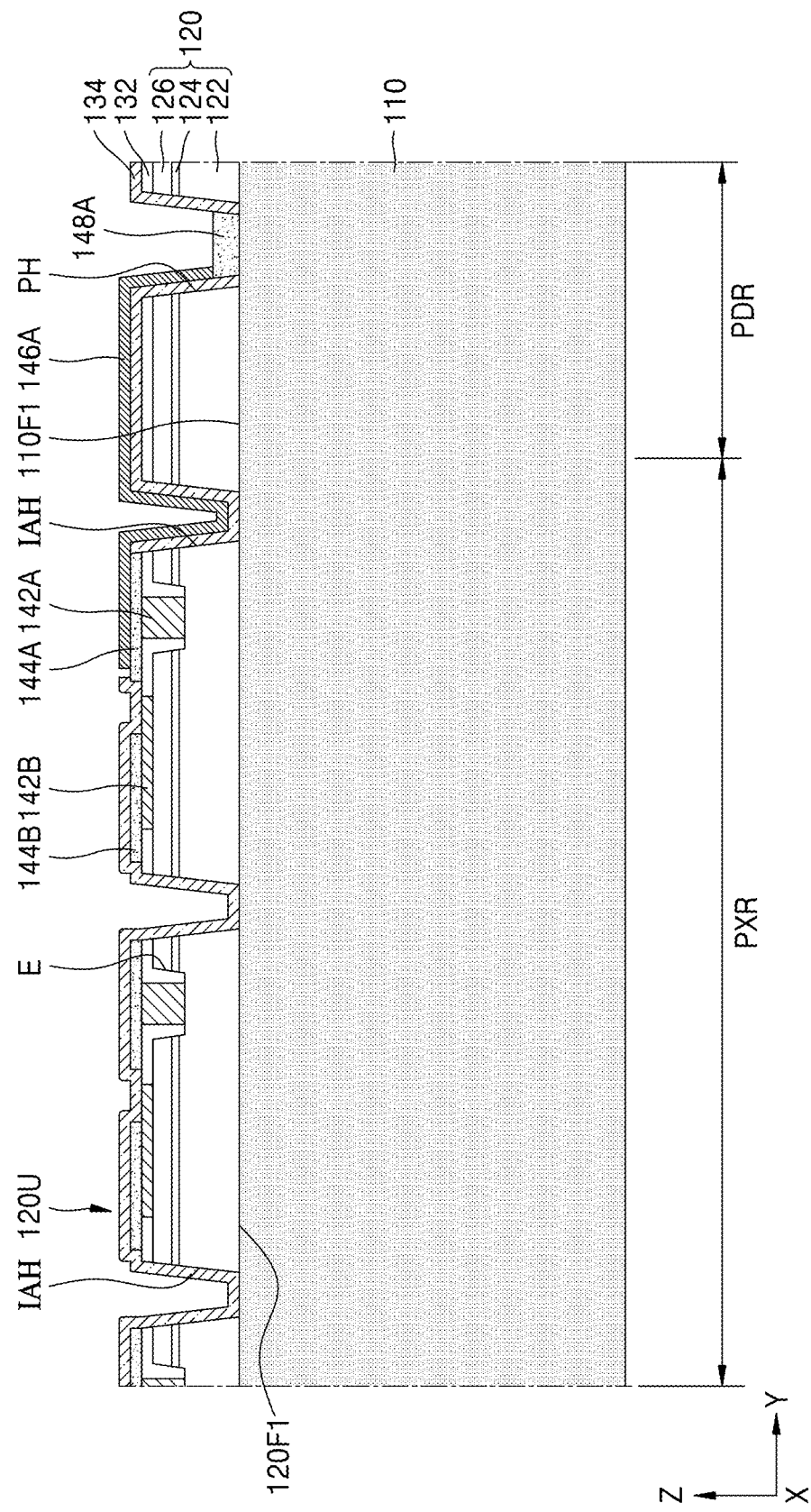

Referring to FIG. 18, a portion of the insulating liner 134 may be removed to expose the upper surfaces of the first connection electrode 144A and the second connection electrode 144B. A portion of the insulating liner 134 disposed at the bottom of the pad opening PH may also be removed to expose the first surface 110F1 of the substrate 110.

Thereafter, a first wiring pattern 146A and a second wiring pattern 146B (see FIG. 1B), which are electrically connected to the first connection electrode 144A and the second connection electrode 144B, may be formed on the insulating liner 134.

A first pad 148A and a second pad 148B (see FIG. 1B), which are electrically connected to the first connection electrode 144A and the second connection electrode 144B, may be formed in the pad opening PH. According to exemplary embodiments of the present inventive concept, after the first wiring pattern 146A and the second wiring pattern 146B are formed, the first pad 148A and the second pad 148B may be formed. In some embodiments, the first pad 148A and the second pad 148B may be formed substantially simultaneously with the first wiring pattern 146A and the second wiring pattern 146B in a process for forming the first wiring pattern 146A and the second wiring pattern 146B.

Figure 19:
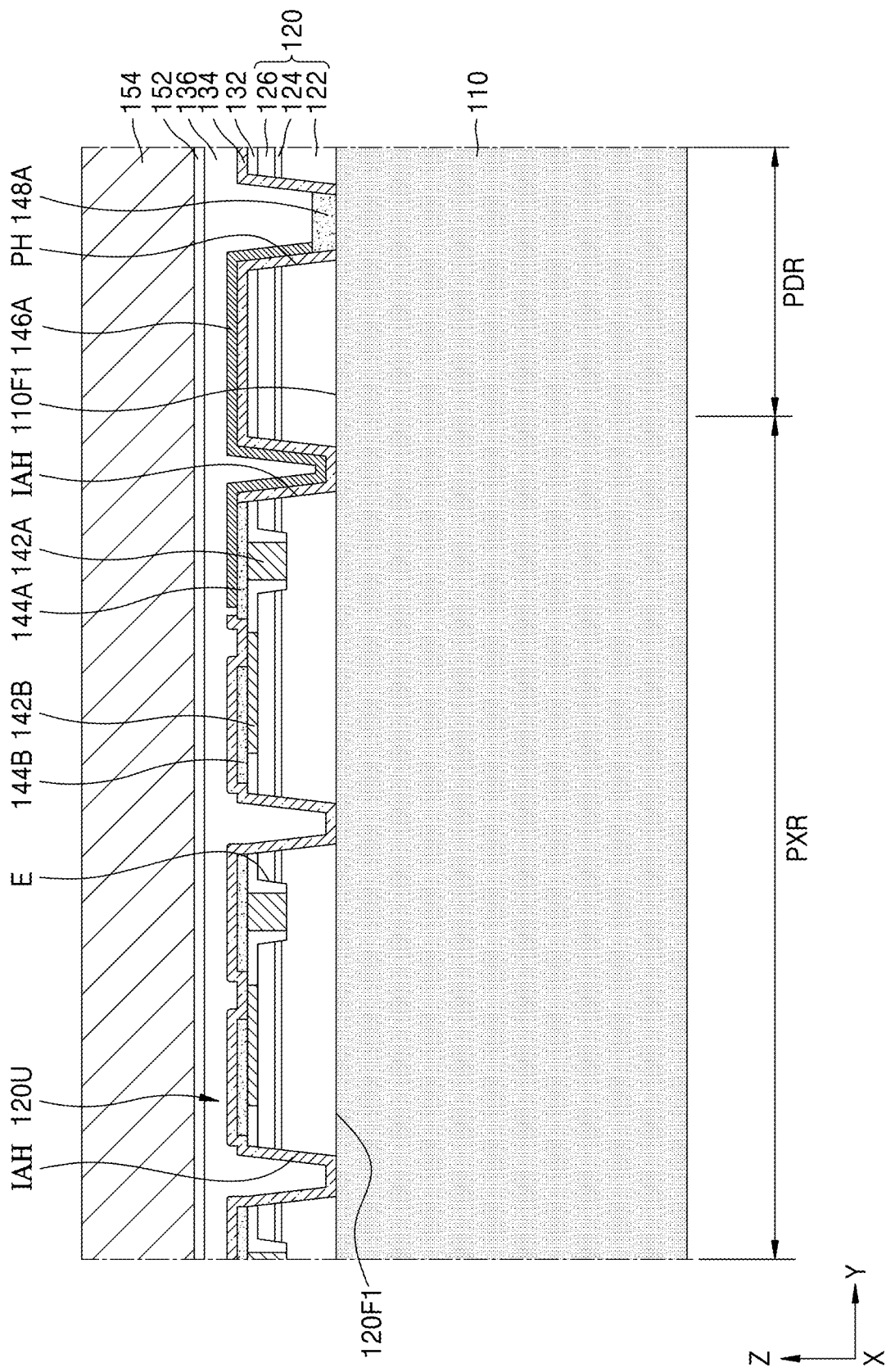

Referring to FIG. 19, a buried insulating layer 136 may be formed on the insulating liner 134, the first and second wiring patterns 146A and 146B, and the first and second pads 148A and 148B. The buried insulating layer 136 may fill the remaining spaces of the device isolation opening IAH and the pad opening PH.

As shown in FIG. 19, the first wiring pattern 146A and the second wiring pattern 146B may include portions disposed on the insulating liner 134 within the device isolation opening IAH, and the buried insulating layer 136 may contact the first and second wiring patterns 146A and 146B within the device isolation opening IAH. For example, since the plurality of light-emitting device structures 120U are arranged in a matrix and the first and second wiring patterns 146A and 146B for the plurality of light-emitting device structures 120U are connected to the first and second pads 148A and 148B disposed in the pad region PDR, the first wiring pattern 146A and the second wiring pattern 146B may pass through the device isolation opening IAH between the insulating liner 134 and the buried insulating layer 136. However, the inventive concept is not limited thereto. According to some embodiments, a buried insulating layer 136H (see FIG. 11) may be formed to fill the remaining space of the device isolation opening IAH on the insulating liner 134H (see FIG. 11), and the first wiring pattern 146AH and the second wiring pattern 146B may be formed on the buried insulating layer 136H. For example, a buried insulating layer 136H may be further arranged between the insulating liner 134H and the first wiring pattern 146AH and between the insulating liner 134H and the second wiring pattern 146B within the device isolation opening IAH.

Thereafter, an adhesive layer 152 may be formed on the buried insulating layer 136 and a support substrate 154 may be attached onto the adhesive layer 152.

Figure 20:
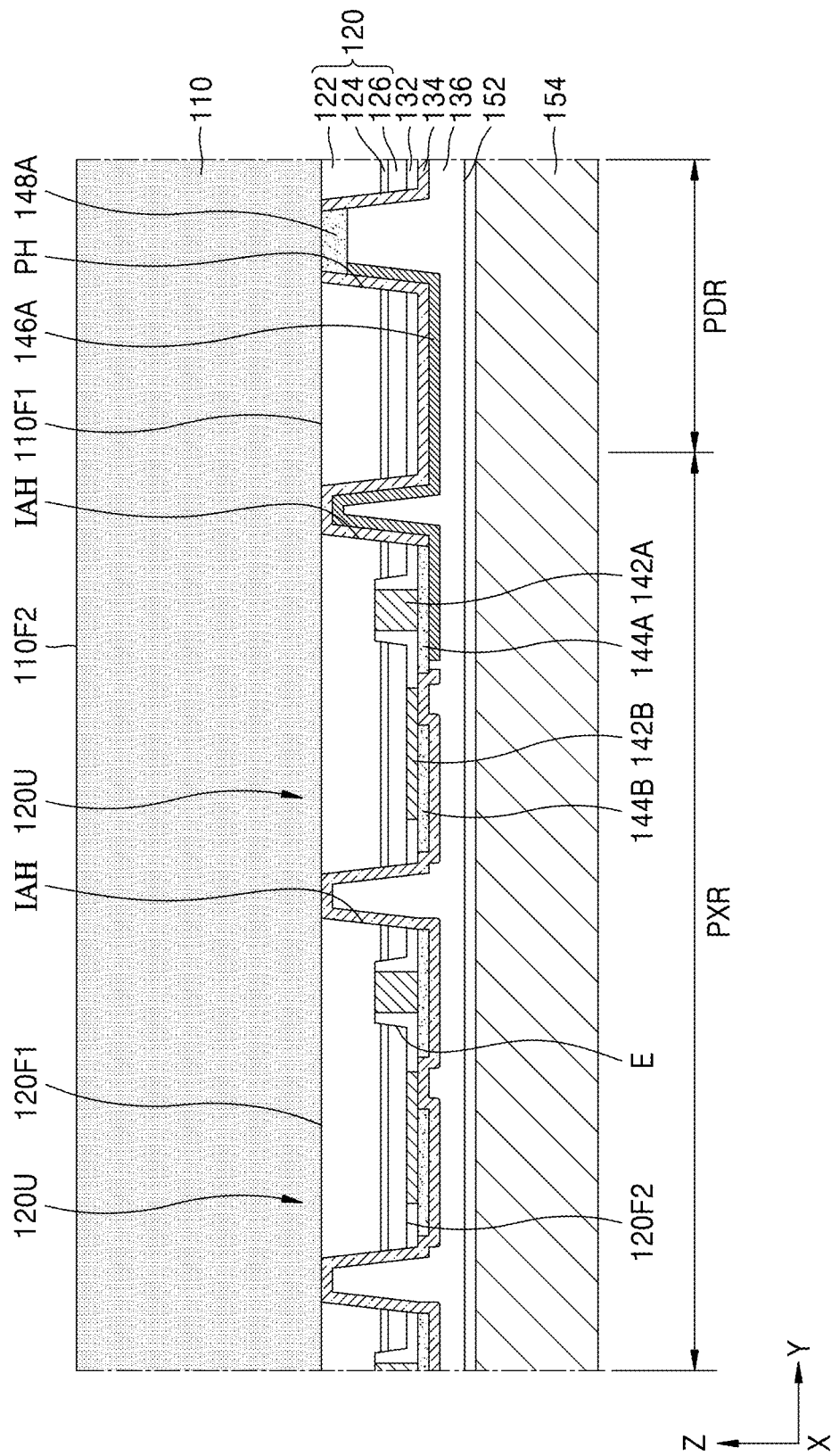

Referring to FIG. 20, the light-emitting stack 120 attached to the support substrate 154 may be reversed such that a second surface 110F2 opposite the first surface 110F1 of the substrate 110 faces upward. Then, an upper portion of the substrate 110 may be removed from the second surface 110F2 by a grinding process, and thus, the level of the second surface 110F2 of the substrate 110 may be lowered.

Figure 21:
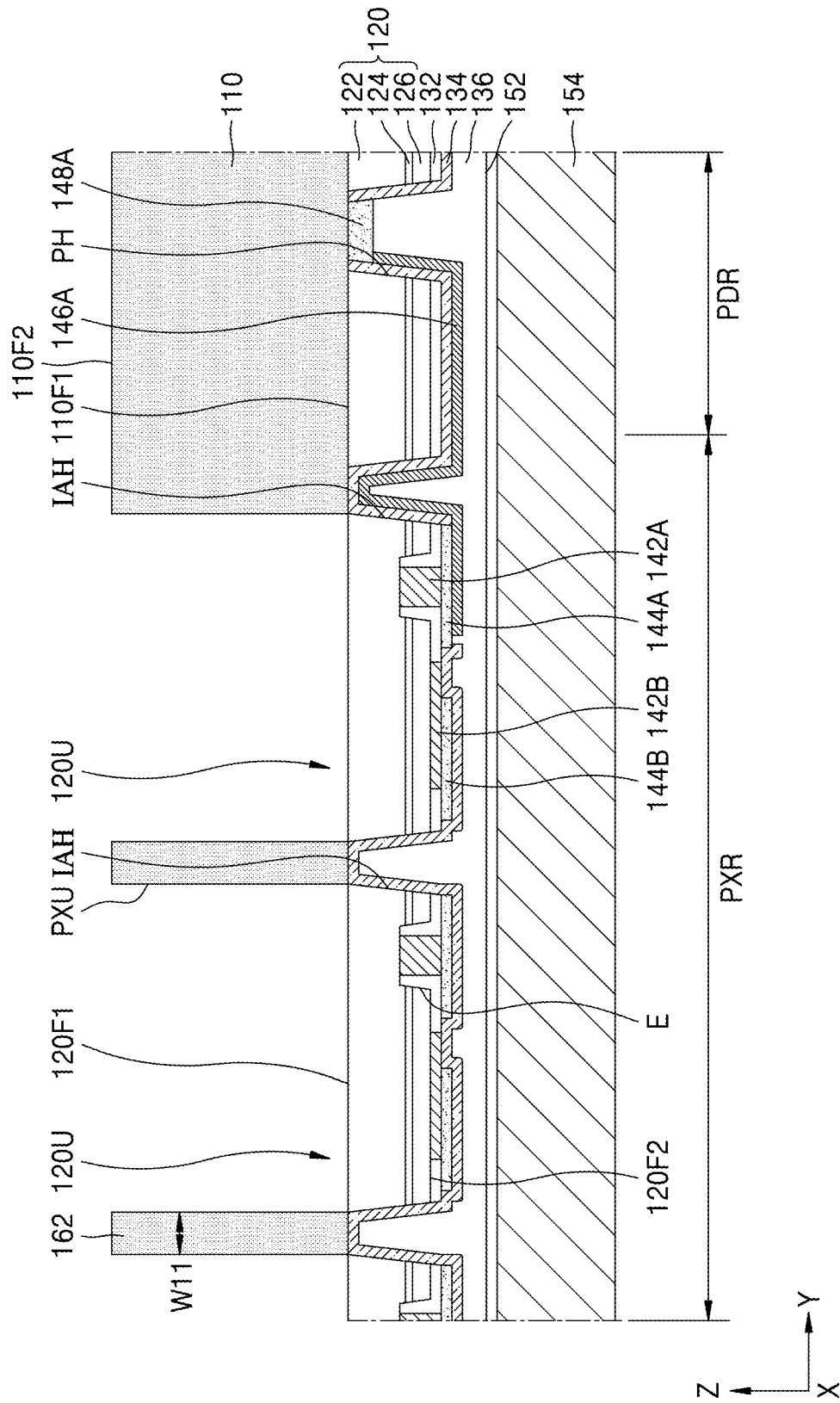

Referring to FIG. 21, a mask pattern may be formed on the second surface 110F2 of the substrate 110, and a portion of the substrate 110 may be removed using the mask pattern as an etching mask and thus a plurality of pixel spaces PXU may be formed in the pixel region PXR of the substrate 110. A portion of the substrate 110 disposed between the plurality of pixel spaces PXU in the pixel region PXR may be referred to as a first partition layer 162.

The first partition layer 162 may be disposed to vertically overlap the device isolation opening IAH and a plurality of light-emitting device structures 120U may be respectively disposed in the plurality of pixel spaces PXU. At the bottoms of the plurality of pixel spaces PXU, the upper surface of the first conductive semiconductor layer 122, for example, the first surface 120F1 of the plurality of light-emitting device structures 120U, may be exposed.

In a process described with reference to FIG. 21, the first conductive semiconductor layer 122 exposed at the bottoms of the plurality of pixel spaces PXU may be etched to form a concavo-convex structure 120SP. In this case, the semiconductor light-emitting device 100A described with reference to FIGS. 3 and 4 may be formed.

Figure 22:
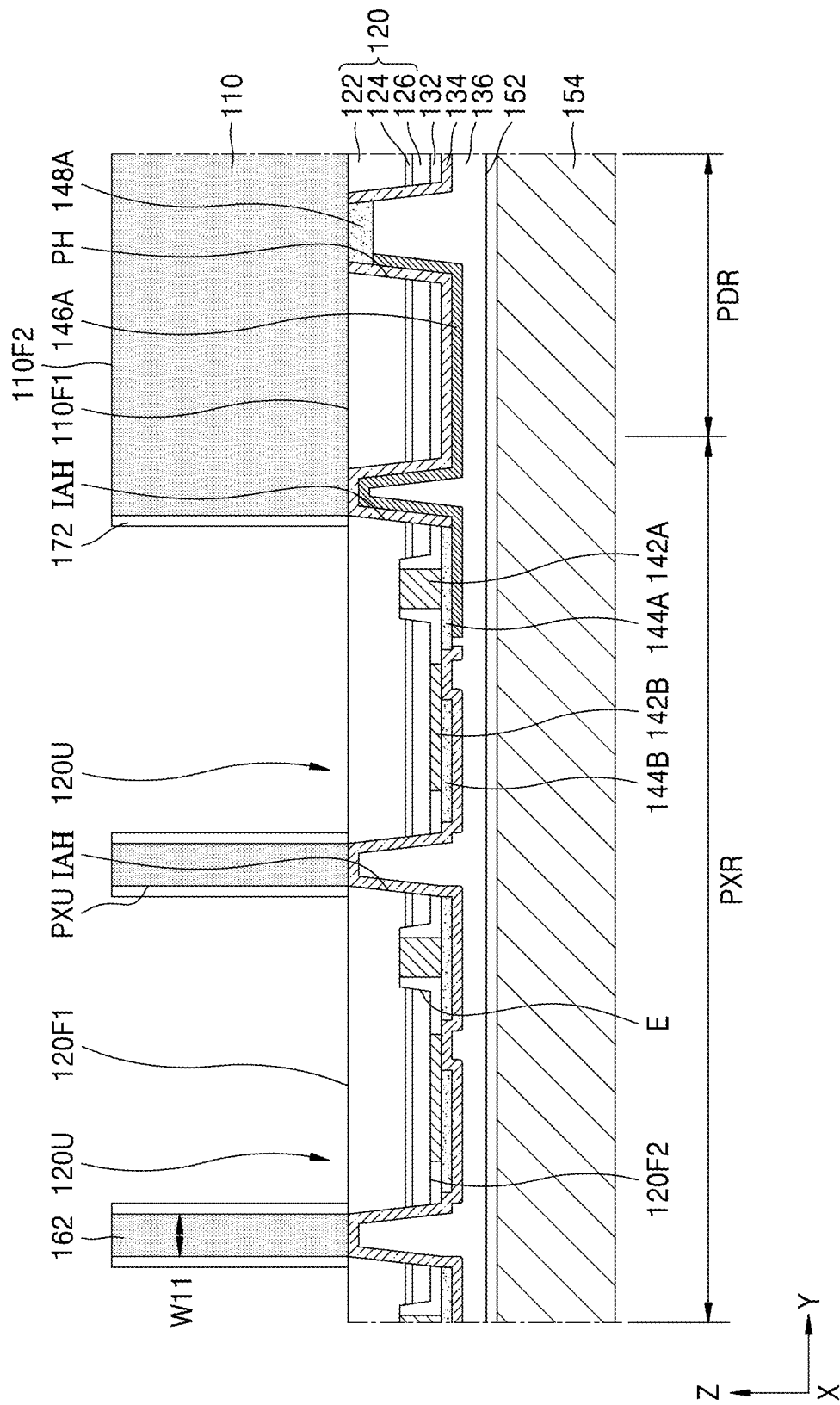

Referring to FIG. 22, a conductive layer may be formed on the upper surface of the substrate 110 and on the inner walls of the plurality of pixel spaces PXU, and anisotropic etching may be performed on the conductive layer to thereby form a reflective layer 172 on the sidewalls of the plurality of pixel spaces PXU (or the sidewall of the first partition layer 162).

Figure 23:
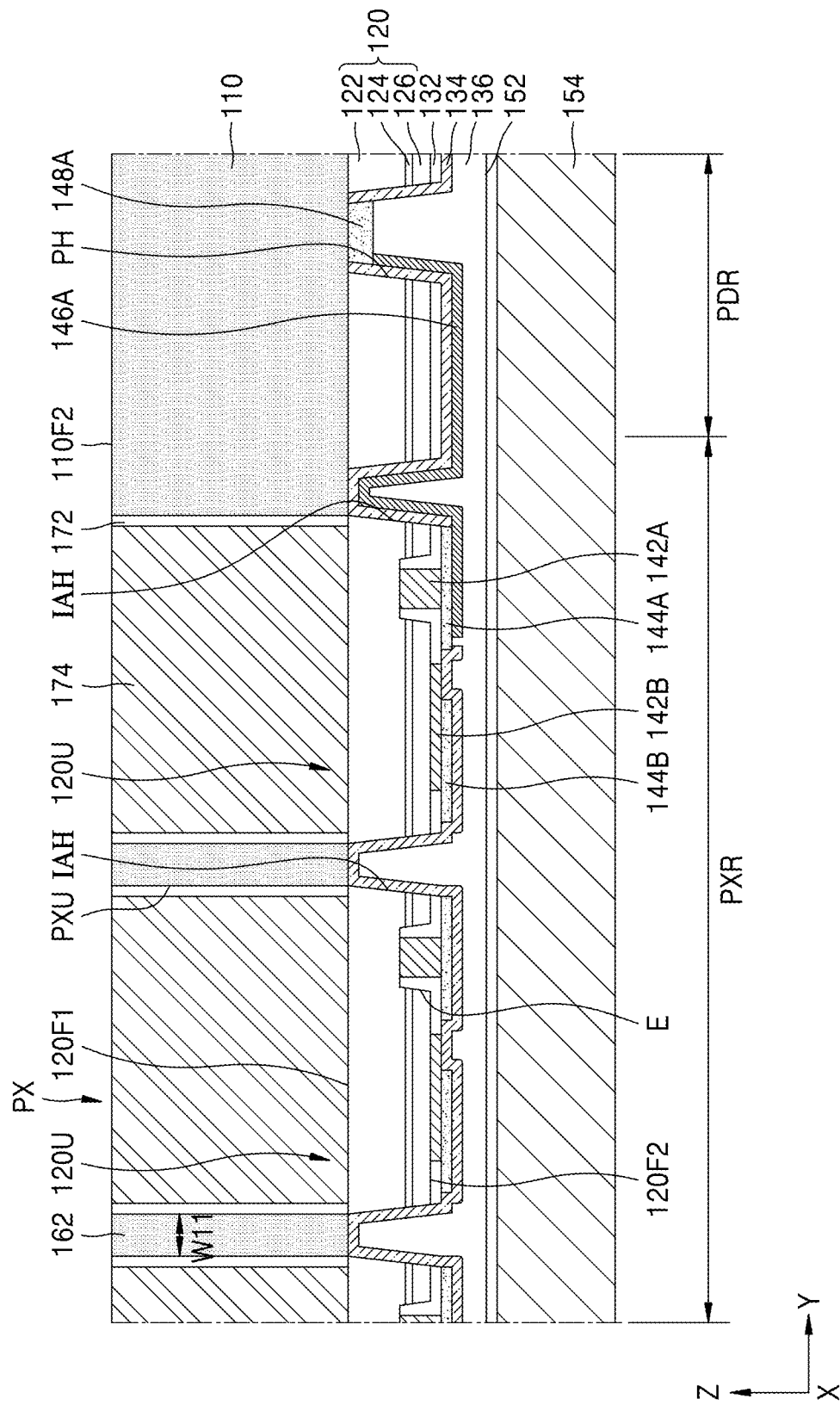

Referring to FIG. 23, a fluorescent layer 174 may be formed to till the plurality of pixel spaces PXU.

According to exemplary embodiments of the present inventive concept, the fluorescent layer 174 may be formed by applying or dispensing a resin containing fluorescent substance particles dispersed therein into the plurality of pixel spaces PXU. The fluorescent layer 174 may include two or more different kinds of fluorescent substance particles having different size distributions so that the fluorescent substance particles may be uniformly dispersed in each of the plurality of pixel spaces PXU.

Figure 24:
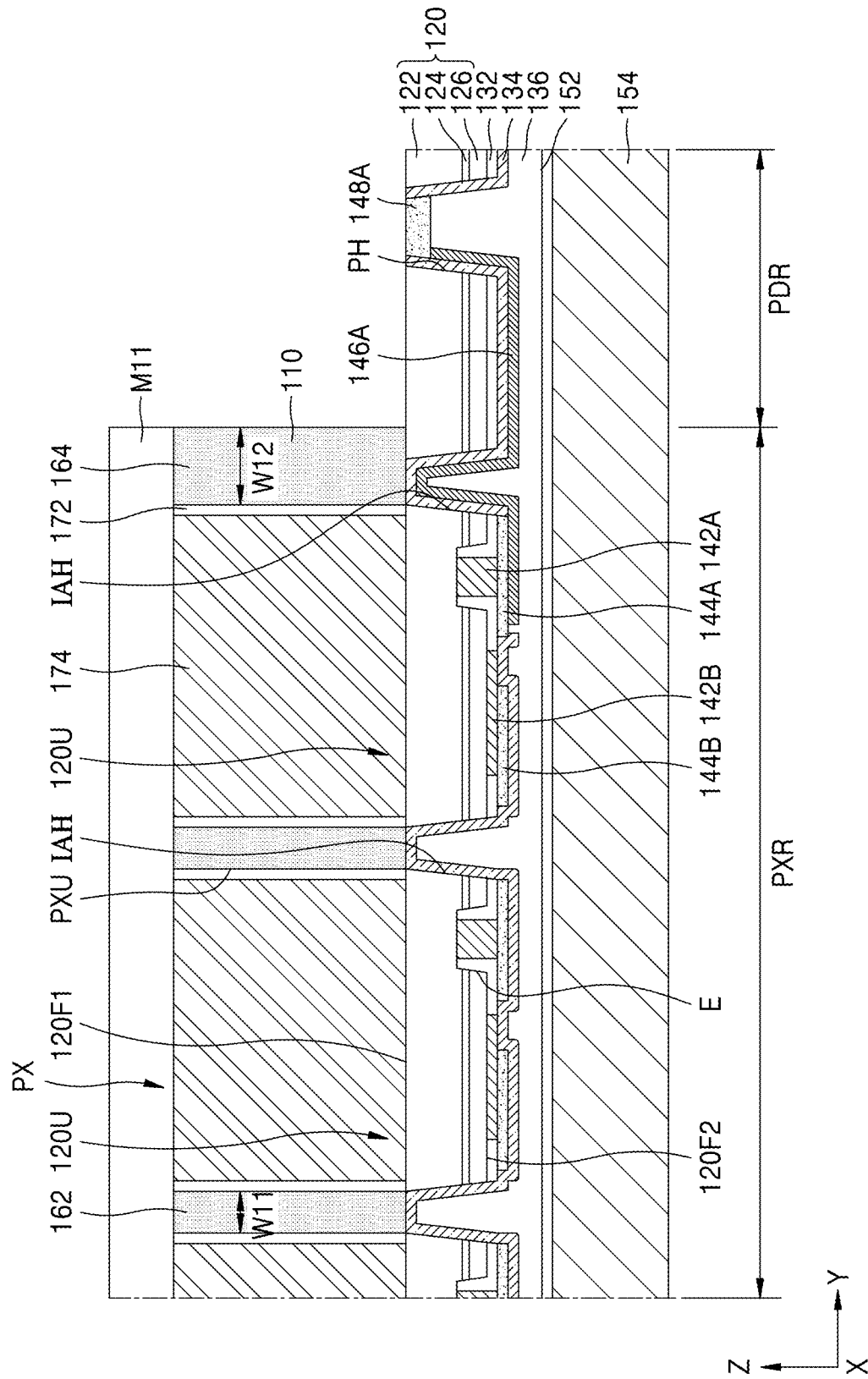

Referring to FIG. 24, a mask pattern M11 covering the fluorescent layer 174 and the first partition layer 162 may be formed in the pixel region PXR, and a portion of the substrate 110 may be removed using the mask pattern M11 as an etching mask to form a second partition layer 164.

In a plan view, the second partition layer 164 may be disposed between the plurality of light-emitting device structures 120U and the pad region PDR, and may be disposed to at least partially surround the first partition layer 162. Thus, a partition structure 160 including the first partition layer 162 and the second partition layer 164 may be formed.

By removing a portion of the substrate 110 covering the pad region PDR, the upper surface of the light-emitting stack 120, the upper surface of the first pad 148A, and the upper surface of the second pad 148R in the pad region PDR (see FIG. 1B) may be exposed. The upper surfaces of the first and second pads 148A and 148B may be coplanar with the first surface 120F1 of the plurality of light-emitting device structures 120U.

Next, the mask pattern M11 may be removed.

By the above-described processes, the semiconductor light-emitting device 100 may be formed.

According to exemplary embodiments of the present inventive concept, since the plurality of light-emitting device structures 120U are physically separated from each other by the insulating liner 134 in the device isolation opening IAH, light emitted from each of the plurality of light-emitting device structures 120U may be prevented from being diffused or penetrated into an adjacent light-emitting device structure 120U. In addition, since the partition structure 160 is disposed to vertically overlap the device isolation opening IAH, light emitted from each of the plurality of light-emitting device structures 120U may be prevented from mixing with light emitted from an adjacent light-emitting device structure 120U. Accordingly, the contrast characteristics of the plurality of light-emitting device structures 120U arranged in a matrix form may be increased.

In addition, since a second width W12 of the second partition layer 164 is larger than a first width W11 of the first partition layer 162, a structural stability may be secured in a process of manufacturing a fluorescent material for forming the fluorescent layer 174, or in a use environment of the semiconductor light-emitting device 100.

FIGS. 25 to 28 are cross-sectional views illustrating a method of manufacturing a semiconductor light-emitting device 100G according to exemplary embodiments of the present inventive concept.

First, the processes described with reference to FIGS. 13 to 20 are performed.

Figure 25:
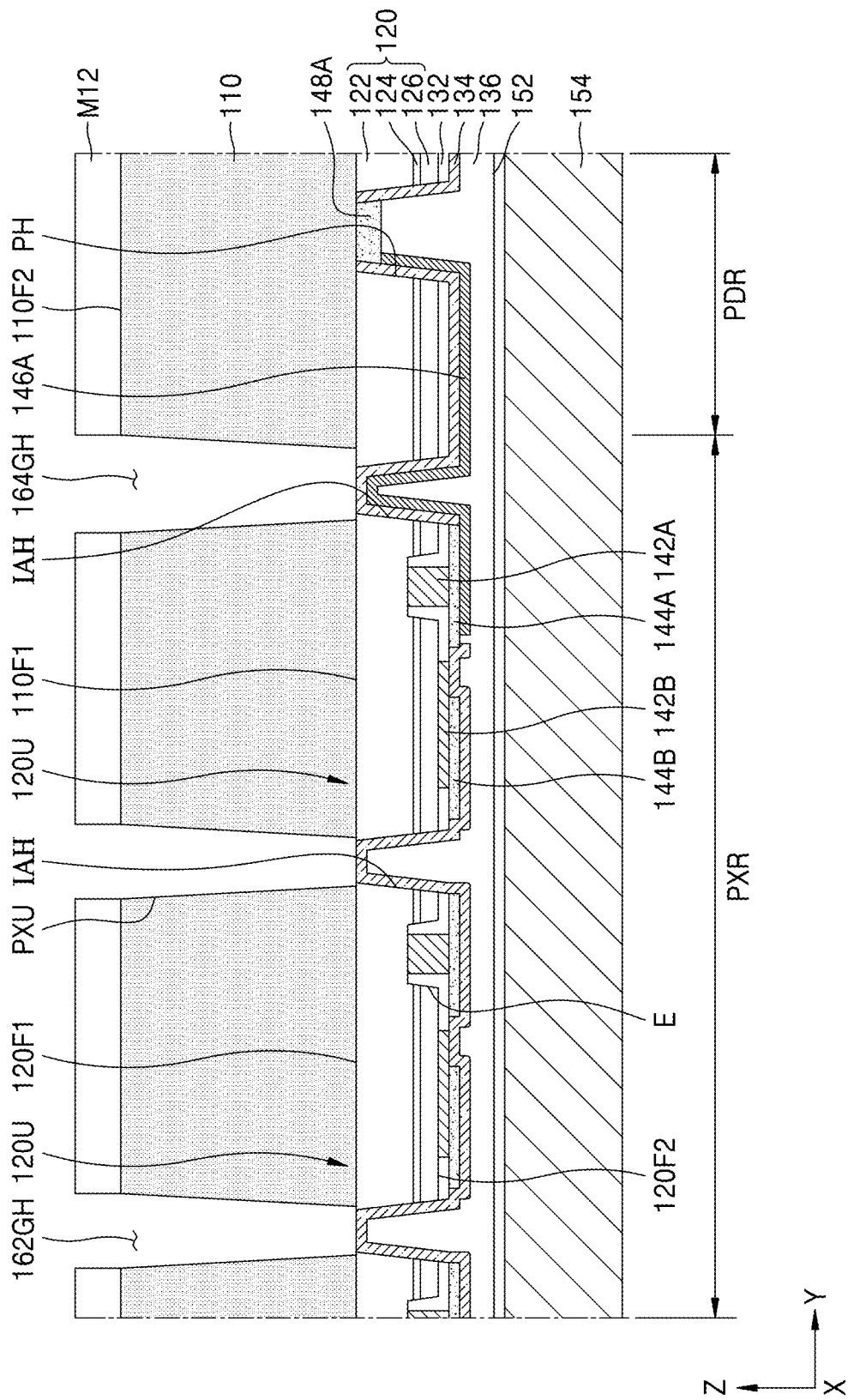
FIGS. 25 to 28 are cross-sectional views illustrating a method of manufacturing a semiconductor light-emitting device according to exemplary embodiments of the present inventive concept.

Next, referring to FIG. 25, a mask pattern M12 may be formed on the second surface 110F2 of the substrate 110, and a first opening 162GH and a second opening 164GH may be formed on the substrate 110 by using the mask pattern M12 as an etching mask.

In a plan view, the first opening 162GH may be disposed between two adjacent light-emitting device structures 120U of the plurality of light-emitting device structures 120U) and may be disposed to vertically overlap the device isolation opening IAH. The second opening 164GH may be disposed along the boundary between the pad region PDR and the pixel region PXR so as to at least partially surround the plurality of light-emitting device structures 120U in a plan view. The first opening 162GH and the second opening 164GH may completely penetrate the substrate 110, and the upper surface of the insulating liner 134 may be exposed at the bottoms of the first opening 162GH and the second opening 164GH.

Figure 26:
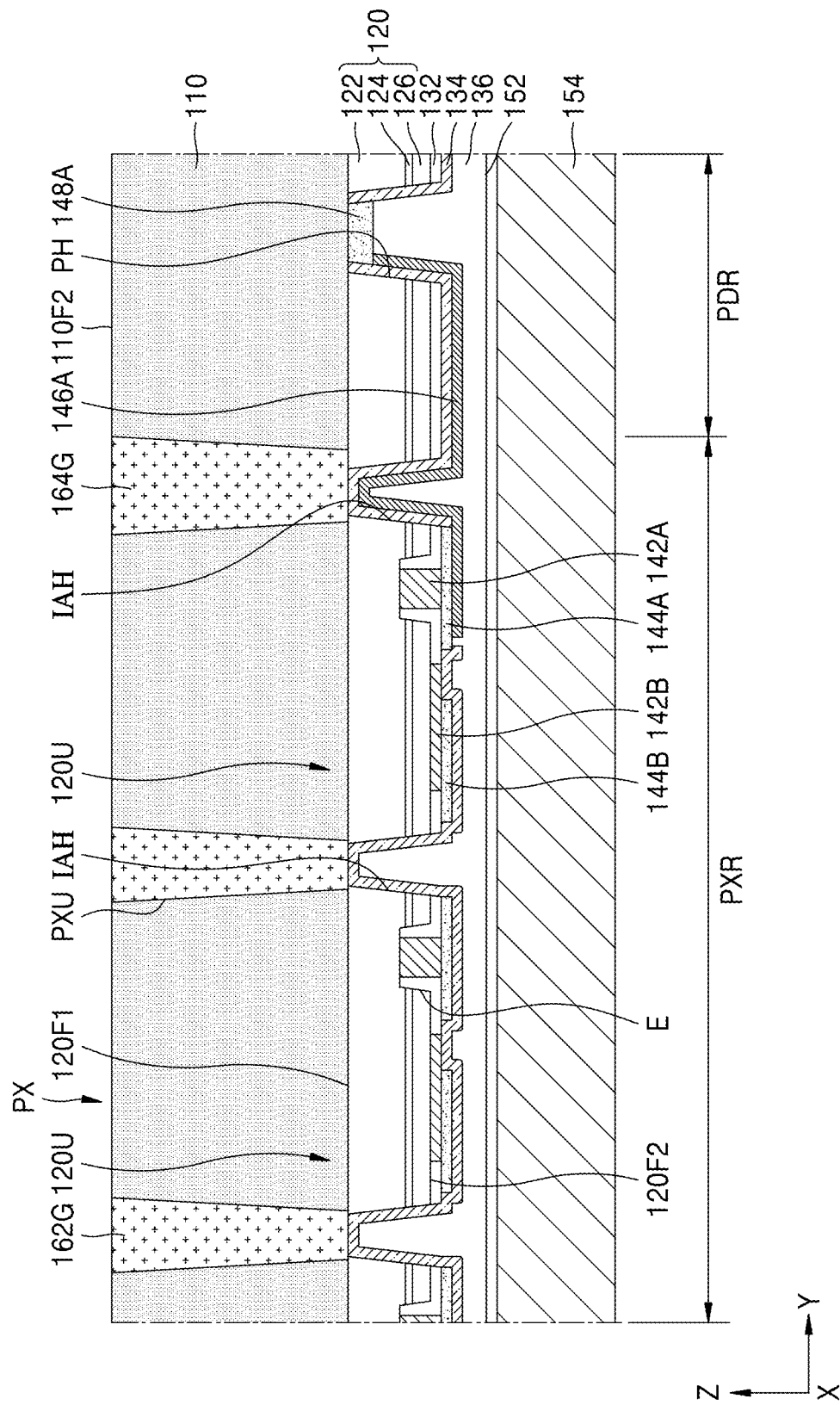

Referring to FIG. 26, the mask pattern M12 may be removed.

Thereafter, a first partition layer 162G and a second partition layer 164G may be formed by filling the first opening 162GH and the second opening 164GH with a reflective material. The reflective material may be a resin layer such as PPA containing a metal oxide such as titanium oxide or aluminum oxide.

Figure 27:
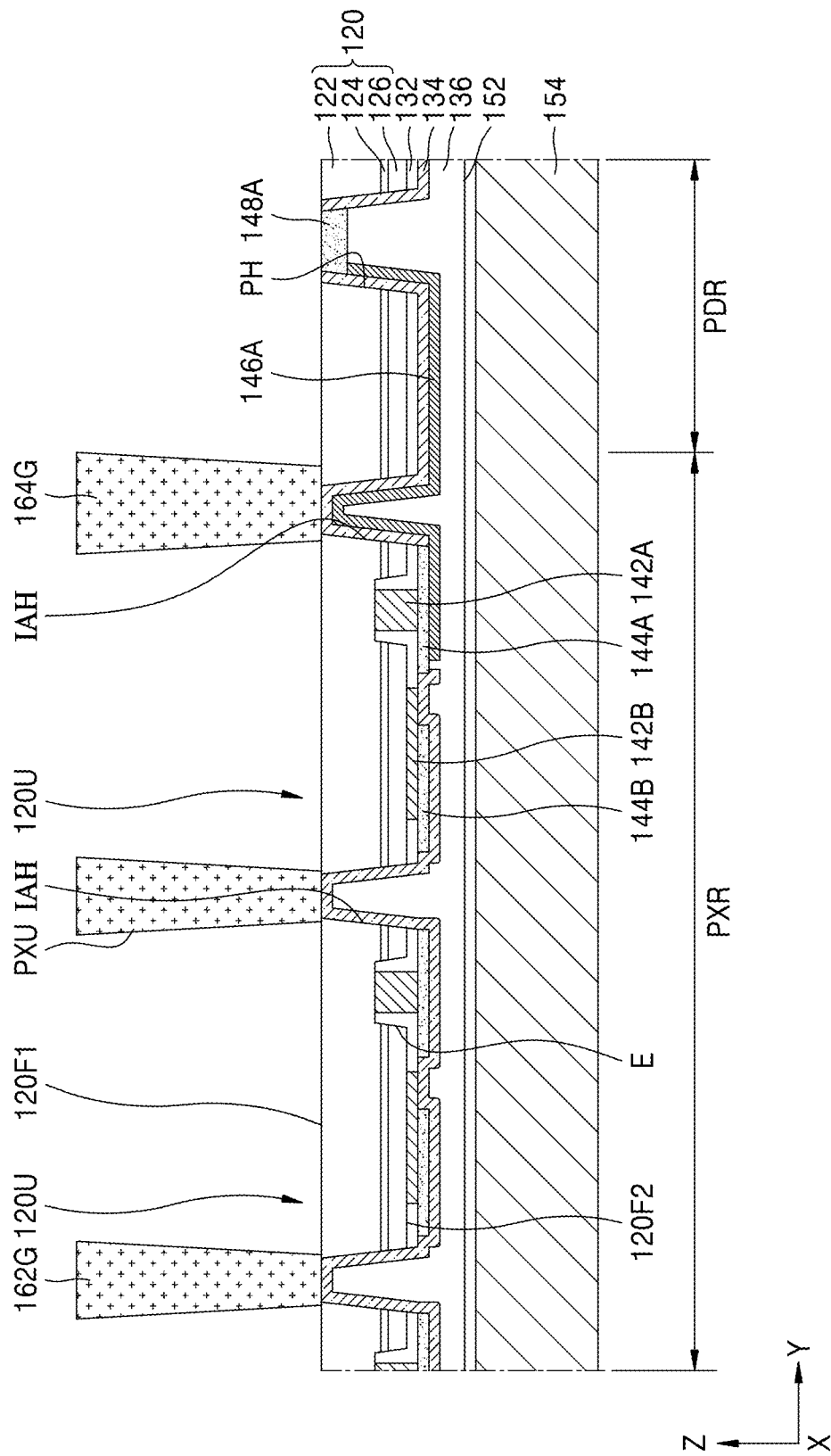

Referring to FIG. 27, the substrate 110 (see FIG. 25) may be removed.

According to exemplary embodiments of the present inventive concept, a plurality of pixel spaces PXU may be formed between the first partition layer 162G and the second partition layer 164G after the substrate 110 is removed. The first surface 120F1 of the plurality of light-emitting device structures 120U may be exposed at the bottom of each of the plurality of pixel spaces PXU.

Figure 28:
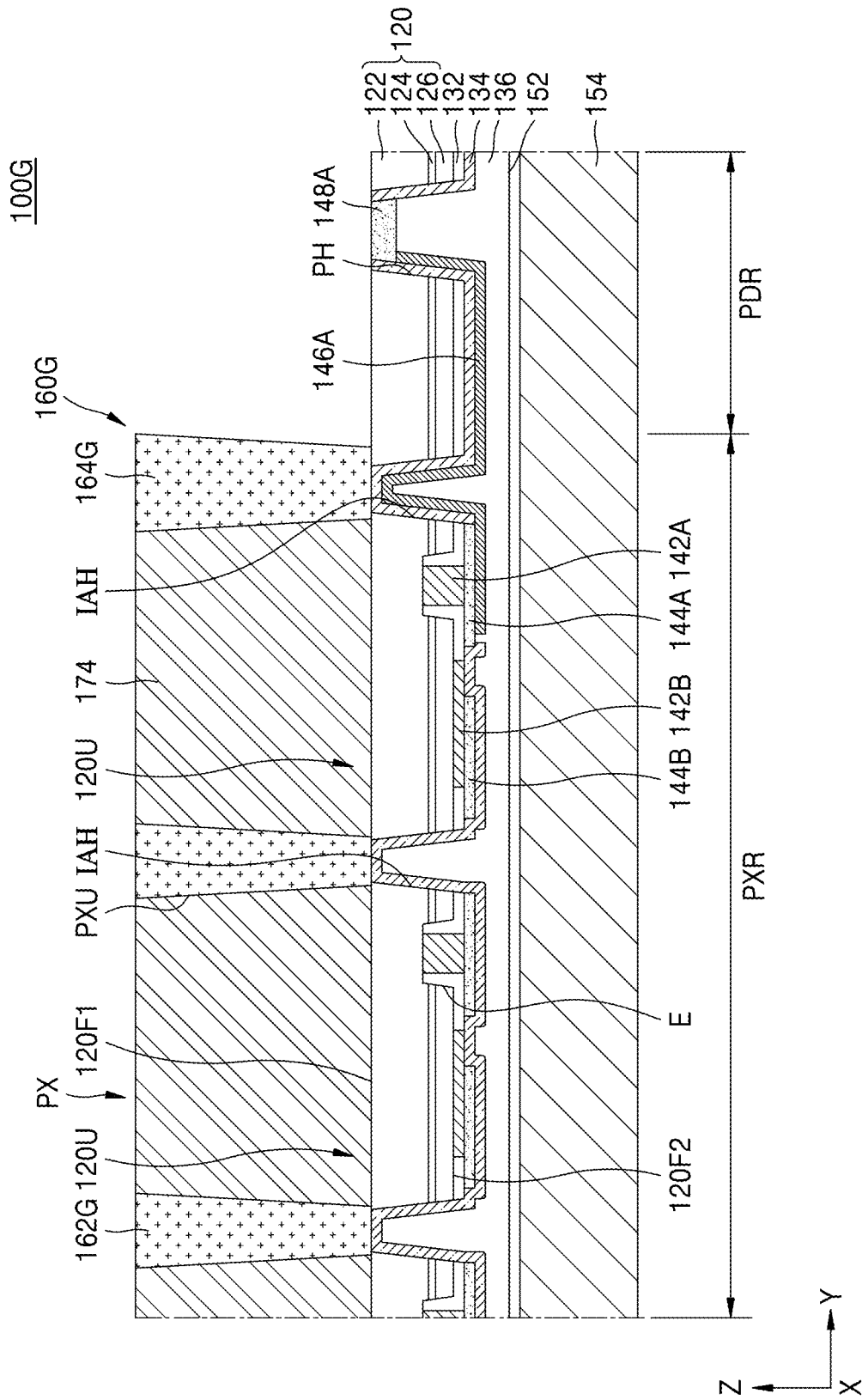

Referring to FIG. 28, a fluorescent layer 174 filling the plurality of pixel spaces PXU may be formed.

According to exemplary embodiments of the present inventive concept, after a mask pattern is formed to cover the light-emitting stack 120 and the first and second pads 148A and 148B on the pad region PDR, the fluorescent layer 174 may be formed by applying a resin containing fluorescent substance particles dispersed therein into a pixel space PXU exposed on the pixel region PXR. In some embodiments, the fluorescent layer 174 may be formed by injecting, by a dispensing method, a resin containing fluorescent substance particles dispersed therein into a pixel space PXU on the pixel region PXR without forming the mask pattern.

Figure 29:
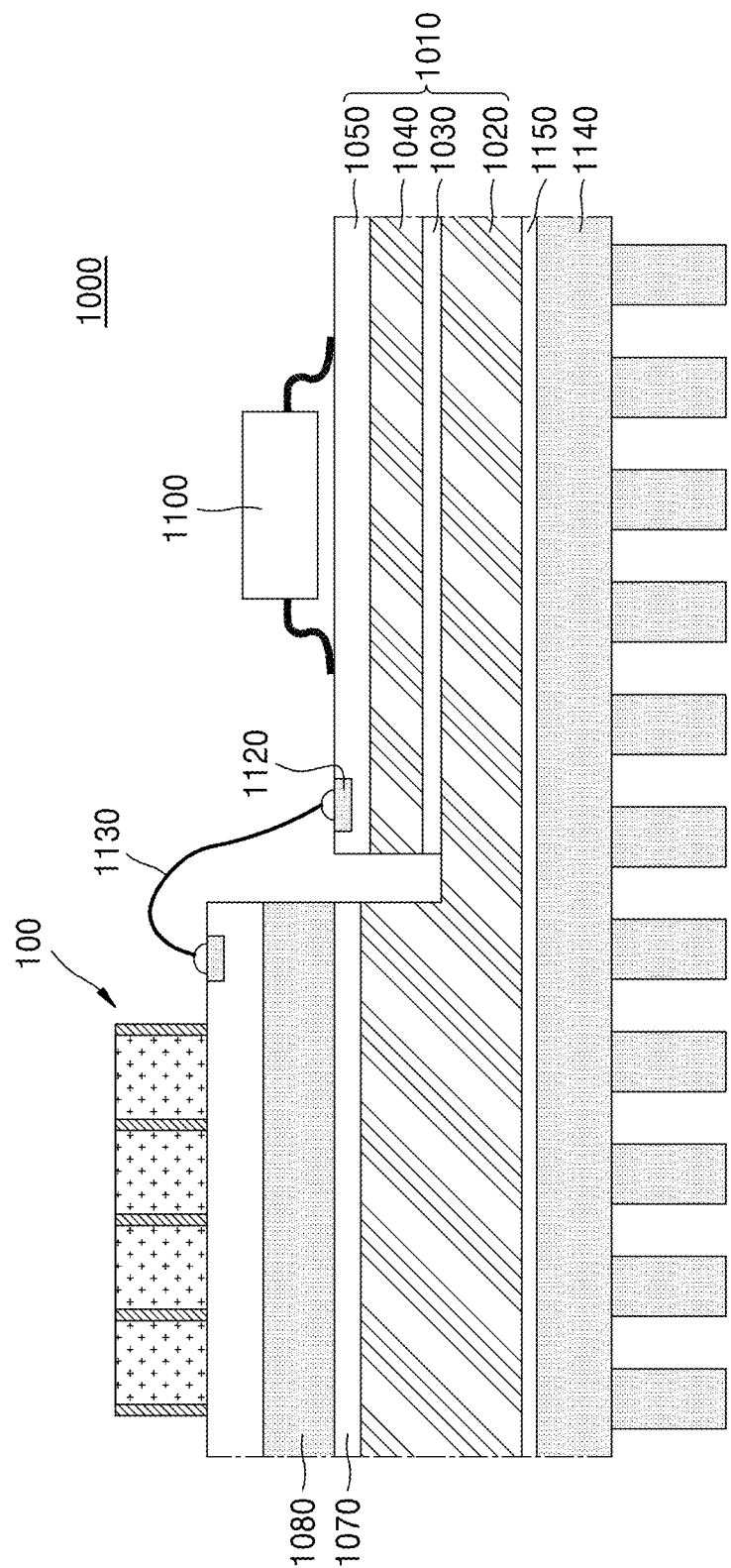
FIG. 29 is a cross-sectional view illustrating a light source module including a semiconductor light-emitting device according to exemplary embodiments of the present inventive concept.

FIG. 29 is a cross-sectional view illustrating a light source module 1000 including a semiconductor light-emitting device according to exemplary embodiments of the present inventive concept. In FIG. 29, the same reference numerals as those in FIGS. 1A to 28 may indicate the same or similar components.

Referring to FIG. 29, the light source module 1000 may include a semiconductor light-emitting device 100 and a driving semiconductor chip 1100 mounted on a package substrate 1010.

A lower insulating layer 1030, an inner conductive pattern layer 1040, and an upper insulating layer 1050 may be sequentially stacked on a portion of a base plate 1020, and one or more driving semiconductor chips 1100 may be mounted on a conductive pattern disposed on the upper insulating layer 1050.

An interposer 1080 may be disposed on another portion of the base plate 1020 with an adhesive layer 1070 therebetween, and the semiconductor light-emitting device 100 may be mounted on the interposer 1080. According to exemplary embodiments of the present inventive concept, the interposer 1080 may be the same as a support substrate 154 (see FIG. 2A) attached to the semiconductor light-emitting device 100. Alternatively, the interposer 1080 may be different from the support substrate 154. The one or more driving semiconductor chips 1100 may be electrically connected to the semiconductor light-emitting device 100 via a bonding wire 1130 connected to a pad 1120. The one or more driving semiconductor chips 1100 may be configured to drive a plurality of light-emitting device structures (e.g., the plurality of light-emitting device structures 120U described above) of the semiconductor light-emitting device 100 individually or together.

A heat sink 1140 may be attached to the bottom surface of the base plate 1020 and a thermal interface material (TIM) layer 1150 may be further interposed between the heat sink 1140 and the base plate 1020.

The semiconductor light-emitting devices 100A, 100B, 100C, 100D, 100E, 100F, 100G, 100H, and 100I described with reference to FIGS. 3 to 12, in addition to the semiconductor light-emitting device 100 described with reference to FIGS. 1A to 2B, may be mounted on the light source module 1000 alone or in combination.

Figure 30:
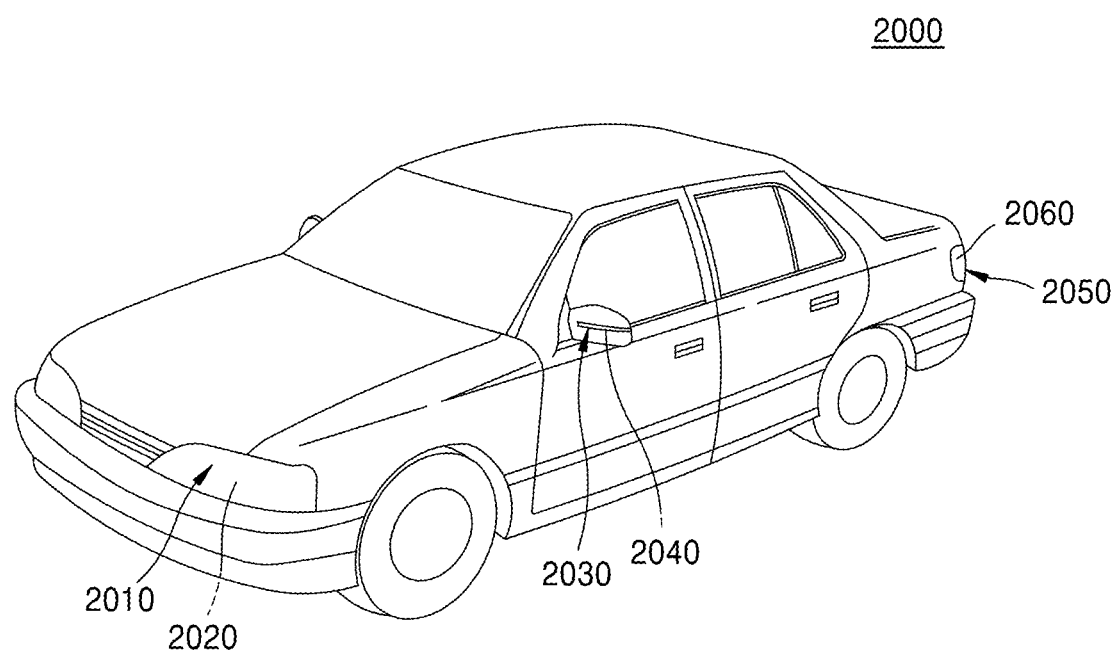
FIGS. 30 to 34 are perspective views illustrating lighting apparatus including a semiconductor light-emitting device according to exemplary embodiments of the present inventive concept.

FIG. 30 is a perspective view illustrating a lighting apparatus including a semiconductor light-emitting device according to exemplary embodiments of the present inventive concept.

Referring to FIG. 30, a head lamp module 2020 may be installed in a head lamp unit 2010 of a vehicle, a side mirror lamp module 2040 may be installed in an external side mirror unit 2030, and a tail lamp module 2060 may be installed in a tail lamp unit 2050. At least one of the head lamp module 2020, the side mirror lamp module 2040 and the tail lamp module 2060 may be a light source module including at least one of the semiconductor light-emitting devices 100, 100A, 100B, 100C, 100D, 100E, 100F, 100G, 100H, and 100I.

Figure 31:
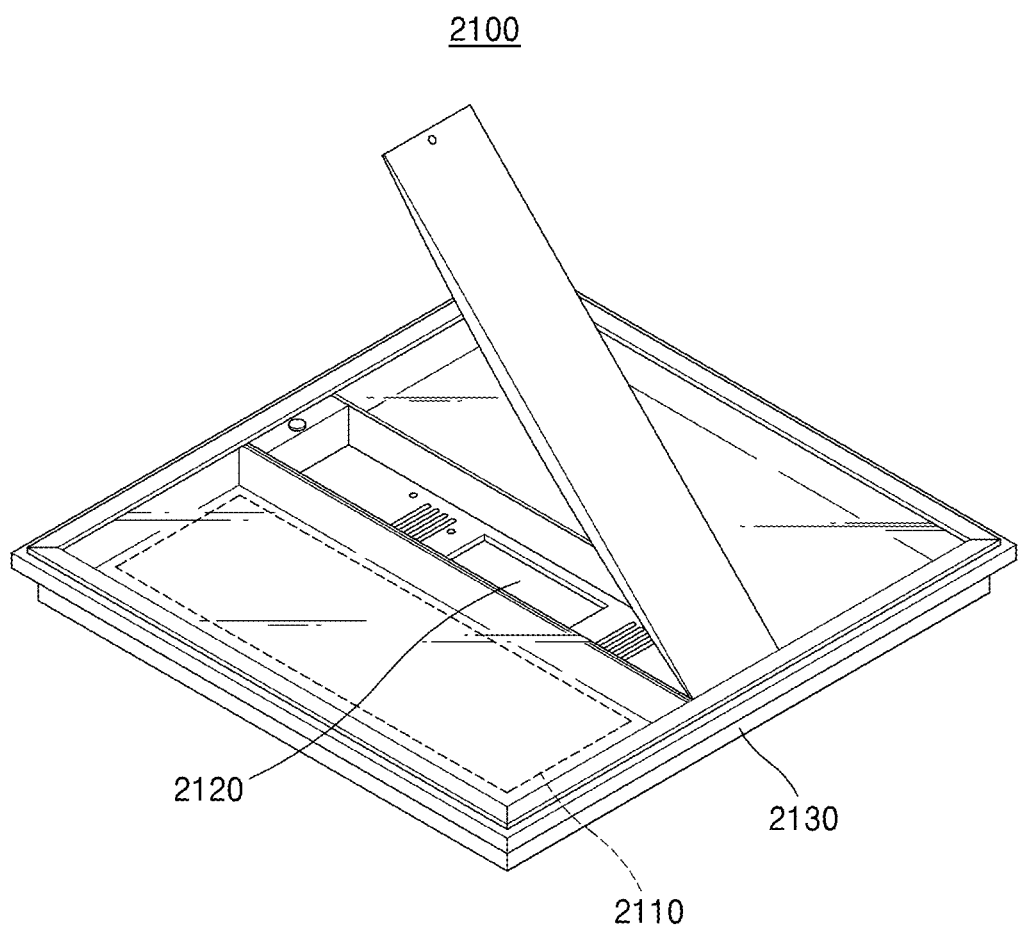

FIG. 31 is a perspective view illustrating a flat-panel lighting apparatus 2100 including a semiconductor light-emitting device according to exemplary embodiments of the present inventive concept.

Referring to FIG. 31, the flat-panel lighting apparatus 2100 may include a light source module 2110, a power supply 2120, and a housing 2130. The light source module 2110 may include a light-emitting device array as a light source. The light source module 2110 may include as a light source at least one of the semiconductor light-emitting devices 100, 100A, 100B, 100C, 100D, 100E, 100F, 100G, 100H, and 100I, described above.

The light source module 2110 may be formed to have a flat shape as a whole.

The power supply 2120 may be configured to supply power to the light source module 2110. The housing 2130 may form an accommodation space for accommodating the light source module 2110 and the power supply 2120. The housing 2130 may be formed to have a hexahedral shape with one opened side, but is not limited thereto. The light source module 2110 may be disposed so as to emit light toward the opened side of the housing 2130.

Figure 32:
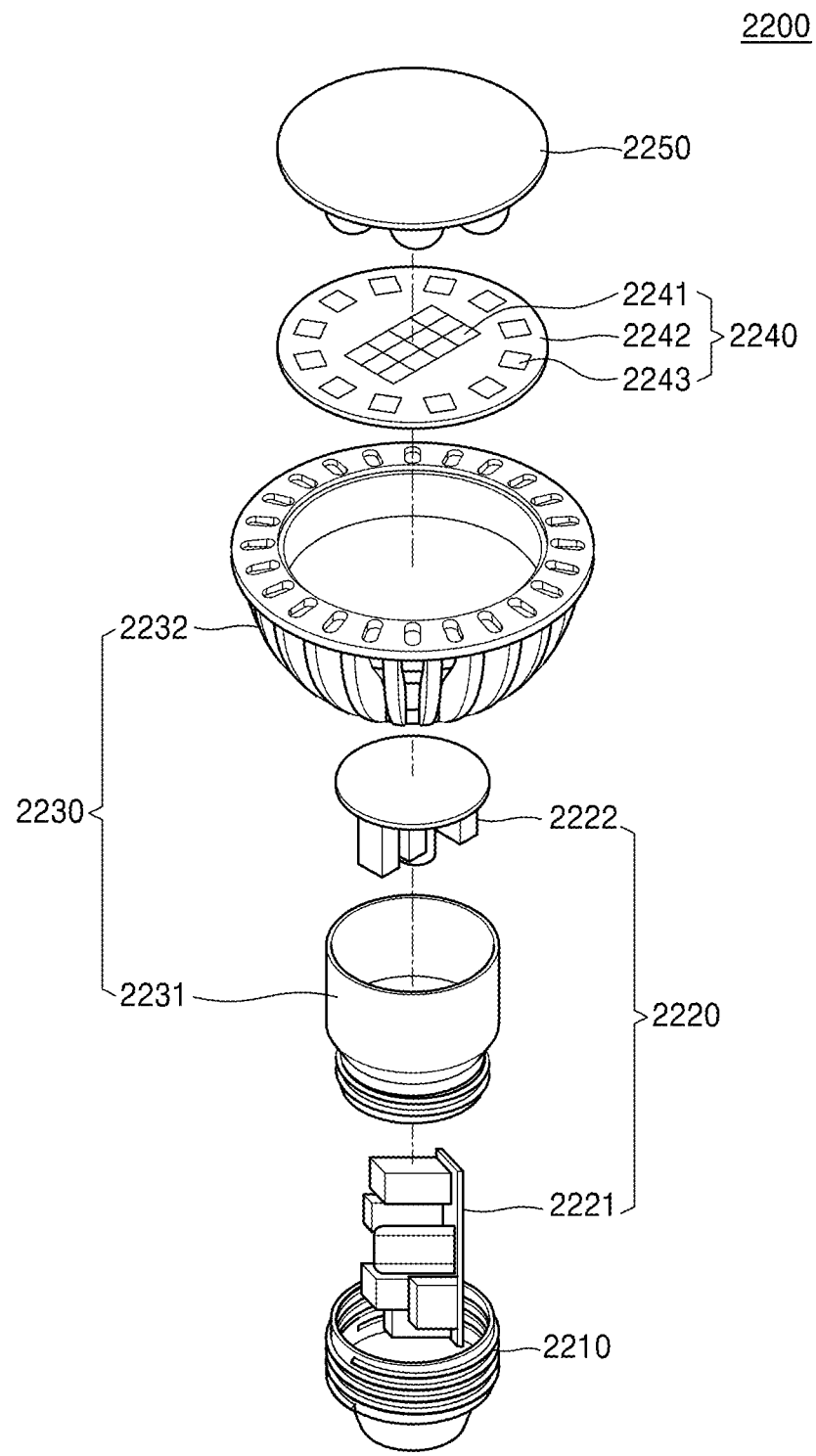

FIG. 32 is an exploded perspective view illustrating a lighting apparatus 2200 including a semiconductor light-emitting device according to exemplary embodiments of the present inventive concept.

Referring to FIG. 32, the lighting apparatus 2200 may include a socket 2210, a power supply 2220, a heat sink 2230, a light source module 2240, and an optical unit 2250.

The socket 2210 may be configured to be replaceable with an existing lighting apparatus. Power may be supplied to the lighting apparatus 2200 through the socket 2210. The power supply 2220 may be dissembled into a first power supply 2221 and a second power supply 2222. The heat sink 2230 may include an internal heat sink 2231 and an external heat sink 2232. The internal heat sink 2231 may be directly connected to the light source module 2240 and/or the power supply 2220. The internal heat sink 2231 may transmit heat to the external heat sink 2232. The optical unit 2250 may include an internal optical unit and an external optical unit. The optical unit 2250 may be configured to uniformly disperse light emitted by the light source module 2240.

The light source module 2240 may receive power from the power supply 2220 and emit light to the optical unit 2250. The light source module 2240 may include one or more light-emitting device packages 2241, a circuit board 2242, and a controller 2243. The controller 2243 may store driving information of the light-emitting device packages 2241. The light-emitting device packages 2241 may include at least one of the semiconductor light-emitting devices 100, 100A, 100B, 100C, 100D, 100E, 100F, 100G, 100H, and 100I.

Figure 33:
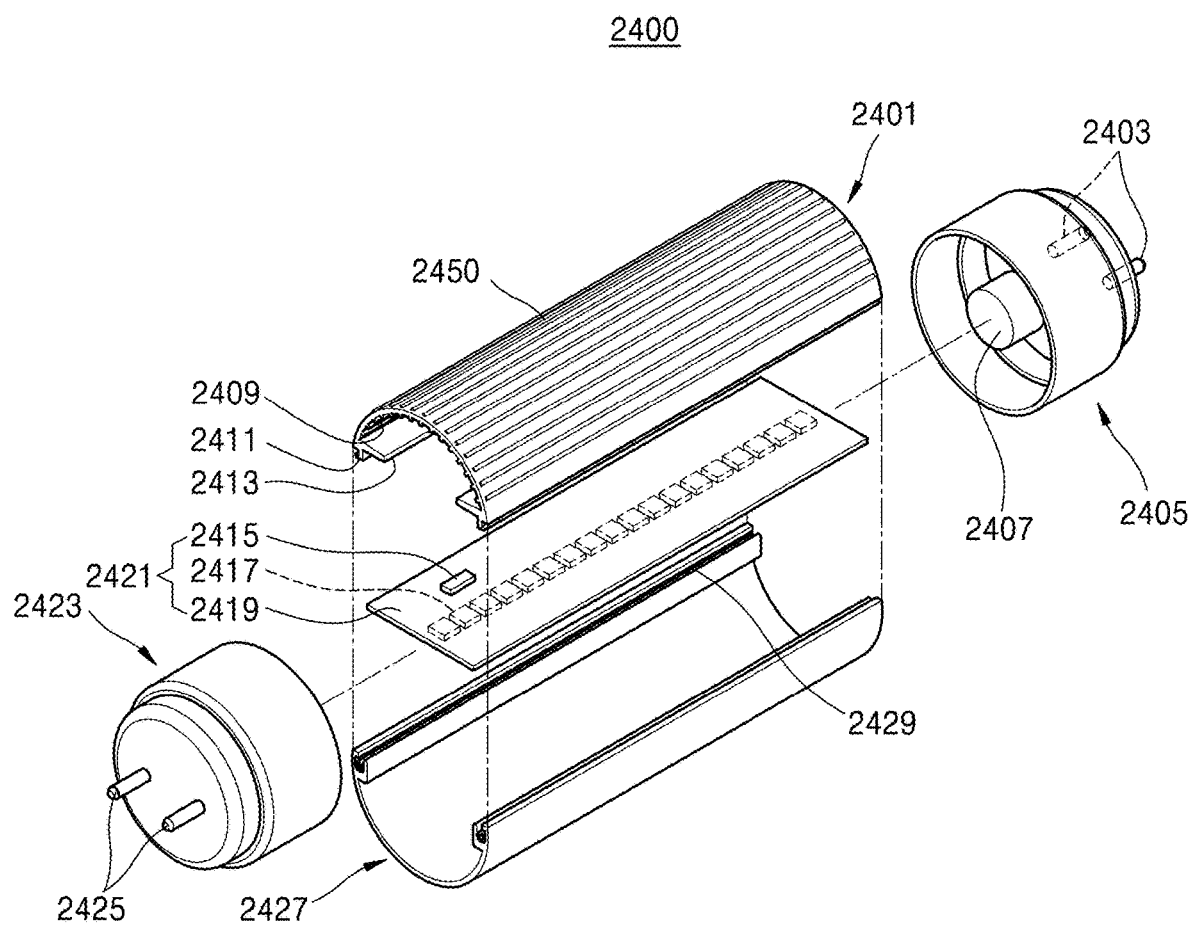

FIG. 33 is an exploded perspective view illustrating a bar-type lighting apparatus 2400 including a semiconductor light-emitting device according to exemplary embodiments of the present inventive concept.

Referring to FIG. 33, the bar-type lighting apparatus 2400 may include a heat sink member 2401, a cover 2427, a light source module 2421, a first socket 2405, and a second socket 2423. A plurality of heat sink fins 2450 and 2409 having a concave/convex shape may be formed on inner or/and outer surfaces of the heat sink member 2401. The heat sink fins 2450 and 2409 may be designed to have various shapes and intervals. A support 2413 having a protruding shape may be formed inside the heat sink member 2401. The light source module 2421 may be fixed to the support 2413. Locking protrusions 2411 may be formed on both ends of the heat sink member 2401.

Locking grooves 2429 may be formed in the cover 2427. The locking protrusions 2411 of the heat sink member 2401 may be hooked to the locking grooves 2429. The positions of the locking grooves 2429 may be exchanged with the positions of the locking protrusions 2411.

The light source module 2421 may include a printed circuit board (PCB) 2419, a light source 2417, and a controller 2415. The controller 2415 may store driving information of the light source 2417. Circuit wirings may be formed on the PCB 2419 so as to operate the light source 2417. In addition, the light source module 2421 may include components for operating the light source 2417. The light source 2417 may include at least one of the semiconductor light-emitting devices 100, 100A, 100B, 100C, 100D, 100E, 100F, 100G, 100H, and 100I described above.

The first and second sockets 2405 and 2423 may be provided as a pair of sockets and may be connected to both ends of a cylindrical cover unit including the heat sink member 2401 and the cover 2427. For example, the first socket 2405 may include an electrode terminal 2403 and a power supply 2407, and the second socket 2423 may include a dummy terminal 2425. In addition, an optical sensor module and/or a communication module may be embedded into the first socket 2405 or the second socket 2423.

Figure 34:
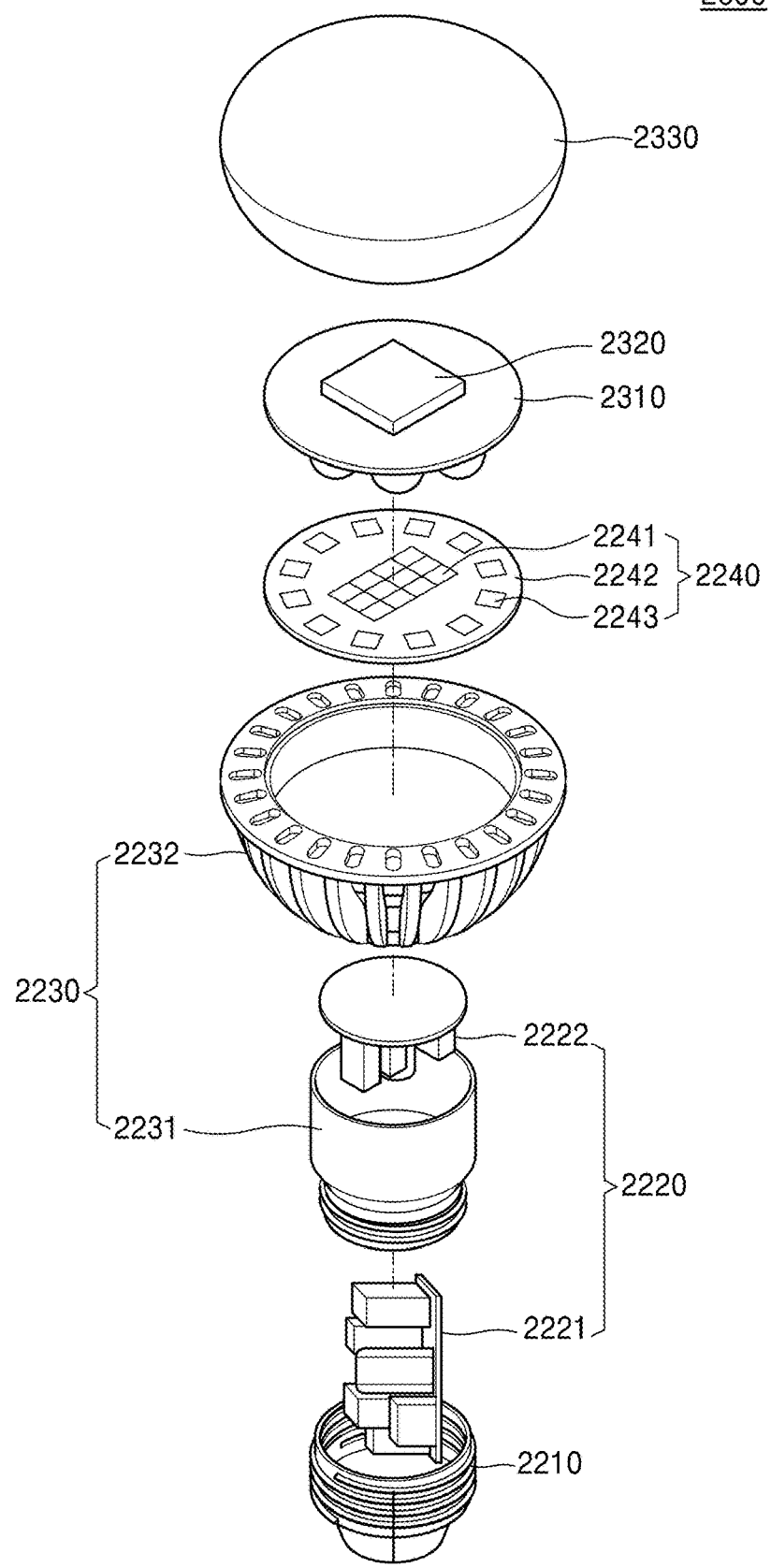

FIG. 34 is an exploded perspective view illustrating a lighting apparatus 2500 including a semiconductor light-emitting device according to exemplary embodiments of the present inventive concept.

The lighting apparatus 2500 of FIG. 34 differs from the lighting apparatus 2200 of FIG. 32 in that a reflection plate 2310 and a communication module 2320 are provided on a light source module 2240. The reflection plate 2310 may uniformly disperse light from the light source in a lateral direction and a rearward direction so as to reduce glare.

The communication module 2320 may be mounted on the reflection plate 2310, and a home network communication may be performed through the communication module 2320. For example, the communication module 2320 may be a wireless communication module such as ZIGBEE, developed by Zigbee Alliance ('ZigBee), Wi-Fi, or an optical wireless communications module such as LIFI, developed by the Li-Fi Consortium (LiFi), and may control an indoor or outdoor lighting apparatus, such as on/off operations or brightness adjustment of the lighting apparatus through a smartphone or a wireless controller, or may control electronic appliances and vehicle systems, such as TVs, refrigerators, air conditioners, doorlock systems, and vehicles. The reflection plate 2310 and the communication module 2320 may be covered by the cover 2330.

Figure 35:
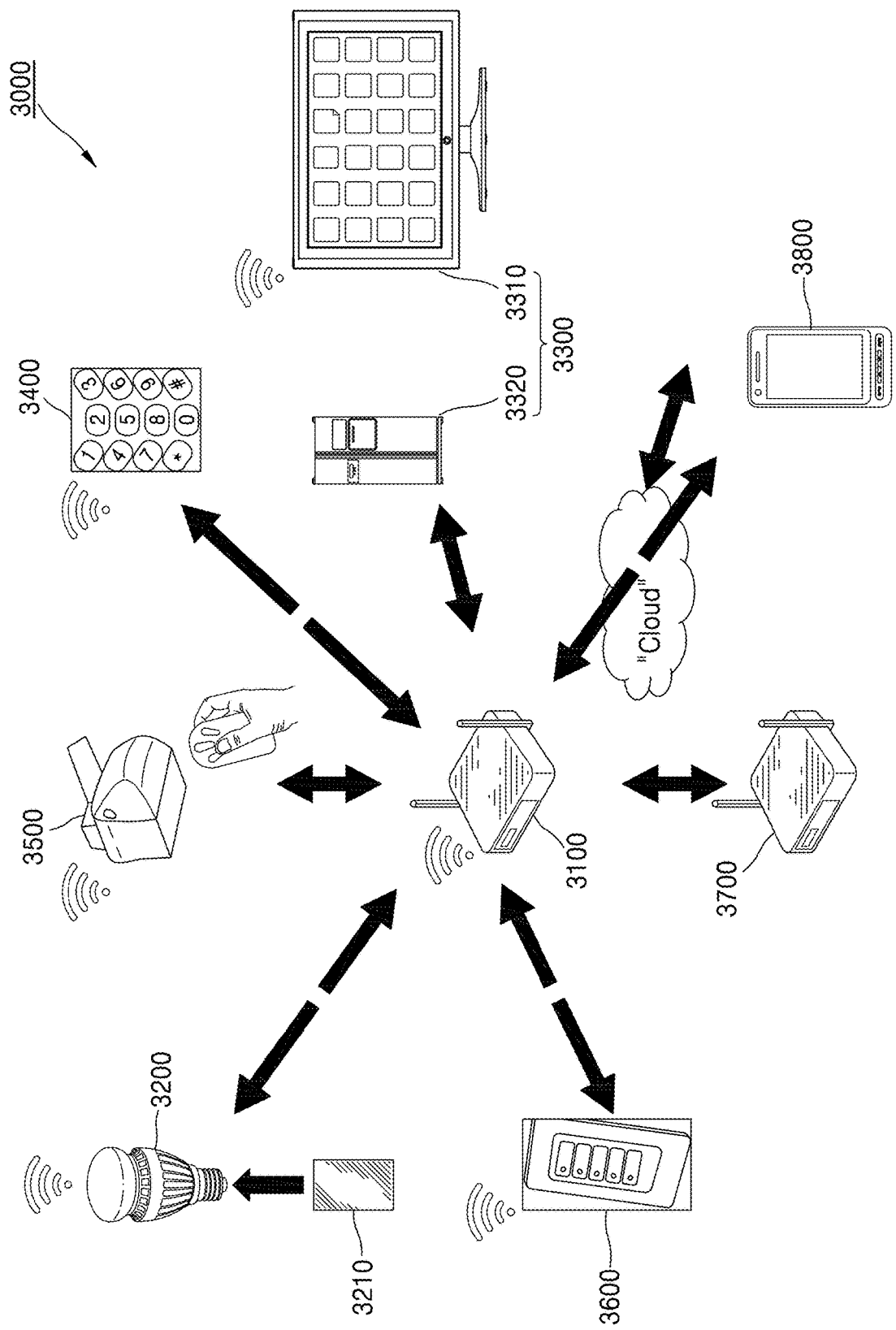
FIG. 35 is a diagram illustrating an indoor lighting control network system including a semiconductor light-emitting device according to exemplary embodiments of the present inventive concept.

FIG. 35 is a diagram illustrating an indoor lighting control network system 3000 including a semiconductor light-emitting device according to exemplary embodiments of the present inventive concept.

Referring to FIG. 35, the indoor lighting control network system 3000 may be a composite smart lighting-network system in which an illumination technology using a light-emitting device such as a light-emitting diode (LED), an Internet of Things (IoT) technology, and a wireless communication technology all converge. The network system 3000 may be implemented using various lighting apparatuses and wired/wireless communication devices. The network system 3000 may be implemented based on an IoT environment so as to collect, process, and provide a variety of information to users.

An LED lamp 3200 included in the network system 3000 may receive information about an ambient environment from a gateway 3100 and control illumination of the LED lamp 3200 itself. Furthermore, the LED lamp 3200 may check and control the operation states of other devices 3300 to 3800 included in the IoT environment based on a visible light communication function of the LED lamp 3200. The LED lamp 3200 may include at least one of the semiconductor light-emitting devices 100, 100A, 100B, 100C, 100D, 100E, 100F, 100G, 100H, and 100I described above. The LED lamp 3200 may be communicably connected to the gateway 3100 by the wireless communication protocol such as WiFi, ZigBee, or LiFi. To this end, the LED lamp 3200 may include at least one lamp communication module 3210.

In a case where the network system 3000 is applied to the home, the plurality of devices 3300 to 3800 may include electronic appliances 3300, a digital doorlock 3400, a garage doorlock 3500, a lighting switch 3600 installed on a wall, a router 3700 for relaying a wireless communication network, and mobile devices 3800 such as smartphones, tablets, or laptop computers.

In the network system 3000, the LED lamp 3200 may check the operation states of the various devices 3300 to 3800 or automatically control the illumination of the LED lamp 3200 itself according to the ambient environment and conditions by using the wireless communication network (e.g., ZigBee, WiFi, LiFi, etc.) installed at home. In addition, the LED lamp 3200 may control the devices 3300 to 3800 included in the network system 3000 through an LiFi communication using the visible light emitted by the LED lamp 3200.

The LED lamp 3200 may automatically control the illumination of the LED lamp 3200 based on the information about the ambient environment, which is transmitted from the gateway 3100 through the lamp communication module 3210, or the information about the ambient environment, which is collected from a sensor mounted on the LED lamp 3200. For example, the brightness of the LED lamp 3200 may be automatically adjusted according to a kind of a TV program aired on the TV 3310 or a screen brightness of the TV 3310. To this end, the LED lamp 3200 may receive operation information of the TV 3310 from the lamp communication module 3210 connected to the gateway 3100. The lamp communication module 3210 may be integrally modularized with a sensor and/or a controller included in the LED lamp 3200.

For example, after a predetermined time has elapsed since the digital door lock 3400 has been locked in such a state that there is no person at home, it is possible to prevent waste of electricity by turning off the turned-on LED lamp 3200. Alternatively, in a case where a security mode is set through the mobile device 3800 or the like, when the digital doorlock 3400 is locked in such a state that there is no person at home, the LED lamp 3200 may maintain the turned-on state.

The operation of the LED lamp 3200 may be controlled according to information about the ambient environment, which is collected through various sensors connected to the network system 3000. For example, in a case where the network system 3000 is implemented in a building, it is possible to turn on or off the illumination by combining a lighting apparatus, a position sensor, and a communication module within the building, or provide collected information in real time, thus enabling efficient facility management or efficient utilization of unused space.

Figure 36:
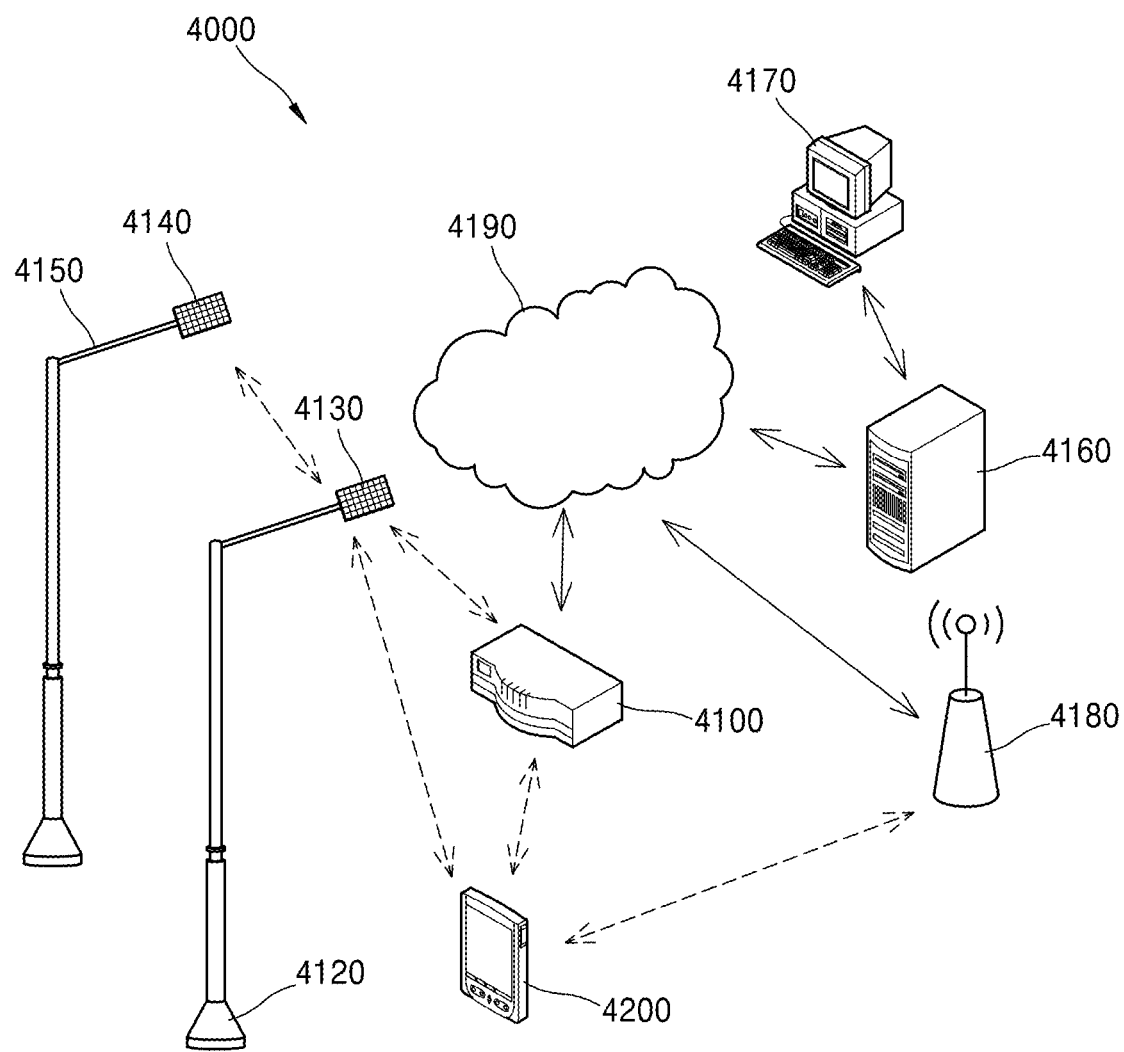
FIG. 36 is a diagram illustrating a network system including a semiconductor light-emitting device according to exemplary embodiments of the present inventive concept.

FIG. 36 is a diagram illustrating a network system 4000 including a semiconductor light-emitting device according to exemplary embodiments of the present inventive concept.

For example, FIG. 36 illustrates the network system 4000 applied to an open space. The network system 4000 may include a communication connecting device 4100, a plurality of lighting apparatuses 4120 and 4150 installed at predetermined intervals and communicably connected to the communication connecting device 4100, a server 4160, a computer 4170 configured to manage the server 4160, a communication base station 4180, a communication network 4190 configured to connect communicable devices, and a mobile device 4200.

The plurality of lighting apparatuses 4120 and 4150 installed in open external spaces such as streets or parts may include smart engines 4130 and 4140, respectively. Each of the smart engines 4130 and 4140 may include a light-emitting device configured to emit light, a driver configured to drive the light-emitting device, a sensor configured to collect information about an ambient environment, and a communication module. The light-emitting device included in the smart engine 4130 and 4140 may include at least one of the semiconductor light-emitting devices 100, 100A, 100B, 100C 100D, 100E, 100F, 100G, 100H, and 100I described above.

The communication module may enable the smart engines 4130 and 4140 to communicate with other peripheral devices in accordance with a communication protocol such as WiFi, ZigBee, or LiFi. One smart engine 4130 may be communicably connected to the other smart engine 4140. In this case, a Wi-Fi mesh network may be applied to the communication between the smart engines 4130 and 4140. At least one smart engine 4130 may be connected to the communication connecting device 4100 connected to the communication network 4190 by a wired/wireless communication.

The communication connecting device 4100 may be an access point (AP) capable of performing wired/wireless communications and may relay a communication between the communication network 4190 and other devices. The communication connecting device 4100 may be connected to the communication network 4190 by at least one of the wired/wireless communication schemes. For example, the communication connecting device 4100 may be mechanically accommodated in one of the lighting apparatuses 4120 and 4150.

The communication connecting device 4100 may be connected to the mobile device 4200 through a communication protocol such as WiFi. A user of the mobile device 4200 may receive information about the ambient environment, which is collected by the plurality of smart engines 4130 and 4140, through a communication connecting device connected to the smart engine 4130 of an adjacent lighting apparatus 4120. The information about the ambient environment may include neighboring traffic information, road information, weather information, and the like. The mobile device 4200 may be connected to the communication network 4190 through the communication base station 4180 by a wireless cellular communication scheme such as a 3G or 4G communication scheme.

The server 4160 connected to the communication network 4190 may receive information collected by the smart engines 4130 and 4140 respectively mounted on the lighting apparatuses 4120 and 4150 and may monitor the operation states of the lighting apparatuses 4120 and 4150. The server 4160 may be connected to the computer 4170 that provides a management system, and the computer 4170 may execute software capable of monitoring and managing the operation states of the smart engines 4130 and 4140.

While the inventive concept has been particularly shown and described with reference to embodiments thereof, it will be understood that various changes in form and details may be made therein without departing from the spirit and scope of the present disclosure.

What is claimed is:

1. A method of manufacturing a semiconductor light-emitting device, the method comprising:
   providing a substrate;
   forming a plurality of light-emitting device structures on a first surface of the substrate;
   forming a partition structure defining a plurality of pixel spaces between each of the plurality of light-emitting device structures, the partition structure including a first partition layer and a second partition layer, the first partition layer being disposed between each of the plurality of light-emitting device structures, the second partition layer being disposed at outer peripheral portion of the partition structure, wherein the first partition layer and the second partition layer are each formed by etching the substrate using a mask pattern, after the plurality of light-emitting device structures have been formed thereon; and
   forming a fluorescent layer filling each of the plurality of pixel spaces,
   wherein the first partition layer has a first width in a first direction parallel with the first surface of the substrate, the second partition layer has a second width in the first direction, and the second width is greater than the first width.

2. The method of claim 1, wherein each of the plurality of pixel spaces extends from the first surface of the substrate to a second surface of the substrate opposite to the first surface, and
   the fluorescent layer is in contact with each of the plurality of light-emitting device structures.

3. The method of claim 1, wherein forming of the partition structure comprises:
   forming the first partition layer between each of the plurality of light-emitting device structure by removing a first portion of the substrate; and
   forming the second partition layer surrounding the first partition layer in a plan view, by removing a second portion of the substrate which surrounds the first portion at an outer periphery of the first portion.

4. The method of claim 3, wherein the forming of the fluorescent layer is performed after the forming of the first partition layer and before the forming of the second partition layer.

5. The method of claim 1, wherein the partition structure is disposed on a first surface of the plurality of light-emitting device structures, and
   the fluorescent layer is in contact with the first surface of the plurality of light-emitting device structures.

6. The method of claim 1, further comprising forming a pad on a pad region, the pad region being disposed outside of the partition structure.

7. The method of claim 6, wherein the partition structure is disposed on a first surface of the plurality of light-emitting device structures, and
   an upper surface of the pad is disposed coplanar with the first surface of the plurality of light-emitting device structures.

8. The method of claim 7, wherein the forming of the plurality of light-emitting device structures comprises:

forming a light-emitting stack on the first surface of the substrate, the light-emitting stack including a first conductive semiconductor layer, an active layer, and a second conductive semiconductor layer; and forming the plurality of light-emitting device structures by removing a portion of the light-emitting stack such that each of the plurality of light-emitting device structures are separated from each other by device isolation openings.

9. The method of claim 8, further comprising forming a wiring pattern on a second surface of the plurality of light-emitting device structures, the second surface being disposed opposite to the first surface of the plurality of light-emitting device structures, wherein the wiring pattern extends on an inner wall of the device isolation openings and the wiring pattern is connected to the pad.

10. The method of claim 1, before forming of the fluorescent layer, further comprising forming a reflective layer on a sidewall of the first partition layer.

11. The method of claim 1, before forming of the reflective layer, further comprising forming a passivation layer on the sidewall of the first partition layer.

12. The method of claim 1, wherein the first partition layer and the second partition layer include a plurality of convex portions on a sidewall thereof, the plurality of convex portions being disposed at regular intervals.

13. The method of claim 1, wherein a concavo-convex structure is formed at a first surface of each of the plurality of light-emitting device structures exposed at a bottom portion of the plurality of pixel spaces.

14. A method of manufacturing a semiconductor light-emitting device, the method comprising:

providing a substrate;

forming a light-emitting stack on a first surface of the substrate;

forming a plurality of light-emitting device structures by removing a portion of the light-emitting stack such that the plurality of light-emitting device structures are separated from each other by device isolation openings;

forming a first partition layer defining a plurality of pixel spaces between each of the plurality of light-emitting device structures;

forming a fluorescent layer filling each of the plurality of pixel spaces; and forming a second partition layer surrounding the first partition layer in a plan view by removing a second portion of the substrate, the second portion surrounding the first portion, wherein the first partition layer has a first width in a first direction parallel with the first surface of the substrate, the second partition layer has a second width in the first direction, and the second width is greater than the first width, and wherein the first partition layer and the second partition layer are each formed by etching the substrate using a mask pattern, after the plurality of light-emitting device structures have been formed thereon.

15. The method of claim 14, wherein each of the plurality of pixel spaces extends from the first surface of the substrate to a second surface of the substrate opposite to the first surface, and the plurality of light-emitting device structures include a first surface exposed at a bottom portion of the plurality of pixel spaces, and a second surface disposed opposite to the first surface, the fluorescent layer is in contact with the first surface of the plurality of light-emitting device structures.

16. The method of claim 15, further comprising forming a pad on the first surface of the plurality of light-emitting device structures, the pad being disposed outside of the second partition layer.

17. The method of claim 16, wherein the forming of the pad comprises:

forming the pad in the device isolation openings outside of the plurality of light-emitting device structures, the pad including an upper surface coplanar with the first surface of the plurality of light-emitting device structures.

18. The method of claim 17, further comprising forming a wiring pattern on the second surface of the plurality of light-emitting device structures, the wiring pattern extending on an inner wall of the device isolation openings and connected to the pad.

19. The method of claim 18, wherein in the forming of the pad, the upper surface of the pad is contacted with the second portion of the substrate, and in the forming of the second partition layer, the second portion of the substrate is removed such that the upper surface of the pad is exposed and not covered by the second partition layer.

20. The method of claim 14, before forming of the fluorescent layer, further comprising forming a reflective layer on a sidewall of the first partition layer.

* * * * *